(12) United States Patent
Ma et al.

(10) Patent No.: US 12,250,849 B2
(45) Date of Patent: Mar. 11, 2025

(54) DISPLAY PANEL AND DISPLAY APPARATUS

(71) Applicant: WUHAN TIANMA MICROELECTRONICS CO., LTD.

(72) Inventors: Yangzhao Ma, Wuhan (CN); Meihong Wang, Wuhan (CN); Hao Dai, Wuhan (CN); Pengcheng Mu, Wuhan (CN); Lida Li, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 623 days.

(21) Appl. No.: 17/529,509

(22) Filed: Nov. 18, 2021

(65) Prior Publication Data

US 2022/0077265 A1    Mar. 10, 2022

(30) Foreign Application Priority Data

Apr. 23, 2021    (CN) .......................... 202110442354.1

(51) Int. Cl.
*H10K 59/121* (2023.01)
*H10K 59/131* (2023.01)
*H10K 59/65* (2023.01)

(52) U.S. Cl.
CPC ..... *H10K 59/1213* (2023.02); *H10K 59/1216* (2023.02); *H10K 59/131* (2023.02); *H10K 59/65* (2023.02)

(58) Field of Classification Search
CPC ........... H10K 59/1213; H10K 59/1216; H10K 59/131; H10K 59/65; H10K 59/121; G09G 2310/061; G09G 3/3233; G09G 2300/0426; G09G 2300/0861; G09G 2310/0262

See application file for complete search history.

(56) References Cited

U.S. PATENT DOCUMENTS

| | | | |
|---|---|---|---|
| 2019/0140025 A1* | 5/2019 | Wang | ...................... H05K 1/028 |
| 2023/0054978 A1* | 2/2023 | Cao | ........................... G09G 3/32 |
| 2023/0065254 A1* | 3/2023 | Li | ........................ G09G 3/3266 |

* cited by examiner

*Primary Examiner* — Kyoung Lee
*Assistant Examiner* — Christina A Sylvia
(74) *Attorney, Agent, or Firm* — Christensen O'Connor Johnson Kindness PLLC

(57) ABSTRACT

A display panel and a display apparatus are provided. The display panel includes has a display region including an optical component setting region. The optical component setting region includes pixel regions, and a light transmission region is formed between adjacent pixel regions. The display panel includes pixels located in the display region, each pixel includes a pixel circuit and an organic light-emitting element, and the pixel circuit includes transistors. The transistors include first and second reset transistors and a drive transistor. The pixel circuits include first pixel circuit located in the optical component setting region, and a gate of the first reset transistor of the first pixel circuit is electrically connected to a gate of the second reset transistor of the first pixel circuit.

36 Claims, 44 Drawing Sheets

# DISPLAY PANEL AND DISPLAY APPARATUS

CROSS-REFERENCE TO RELATED APPLICATIONS

The present application claims priority to Chinese Patent Application No. 202110442354.1, filed on, Apr. 23, 2021, the content of which is incorporated herein by reference in its entirety.

TECHNICAL FIELD

The present disclosure relates to the field of display technologies, and in particular, to a display panel and a display apparatus.

BACKGROUND

Full-screen display apparatuses have become one of the hot technologies in the field of display technologies. In order to enable a display apparatus to have a front camera function, an under-screen camera technology has emerged. A display region of a display panel using the under-screen camera technology includes an optical component setting region having a certain light transmission area. External ambient light is incident to an under-screen camera assembly through the optical component setting region. The camera assembly collects the external ambient light for imaging. However, for conventional display apparatuses, light transmittance of the optical component setting region is relatively small, resulting in a low imaging quality.

SUMMARY

In one aspect, an embodiment of the present disclosure provides a display panel. The display panel has a display region including an optical component setting region, the optical component setting region includes pixel regions, and light transmission regions are provided between adjacent pixel regions of the pixel regions. The display panel includes pixels located in the display region. Each of the pixels includes a pixel circuit and an organic light-emitting element, the pixel circuit includes transistors, and the transistors include a first reset transistor, a second reset transistor, and a drive transistor. The first reset transistor is configured to reset a gate of the drive transistor in response to a scanning signal corresponding to the first reset transistor, and the second reset transistor is configured to reset a first electrode of the organic light-emitting element in response to a scanning signal corresponding to the second reset transistor. The pixel circuits of the pixels include first pixel circuits located in the optical component setting region, and a gate of the first reset transistor of each of the first pixel circuits is electrically connected to a gate of the second reset transistor of the first pixel circuit.

In another aspect, an embodiment of the present disclosure provides a display apparatus, including the foregoing display panel.

BRIEF DESCRIPTION OF THE DRAWINGS

To describe the technical solutions in the embodiments of the present disclosure more clearly, the following briefly describes the accompanying drawings illustrating embodiments of the present disclosure. The accompanying drawings in the following description show merely some embodiments of the present disclosure, and a person of ordinary skill in the art can still derive other drawings from these accompanying drawings.

DETAILED DESCRIPTION

For a better understanding of the technical solutions of the present disclosure, the following describes in detail the embodiments of the present disclosure with reference to the accompanying drawings.

It should be noted that, the described embodiments are merely some but not all of the embodiments of the present disclosure. All other embodiments obtained by a person of ordinary skill in the art based on the embodiments of the present disclosure shall fall within the protection scope of the present disclosure.

Terms used in describing the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

It should be understood that, the term "and/or" used in this specification describes only an association relationship of associated objects and represents that three relationships can exist. For example, A and/or B can represent the following three cases: A alone, A and B, and B alone. In addition, the character "/" in this specification generally indicates an "or" relationship between the associated objects.

Although the terms first, second, third, and the like can be used to describe metal layers in the embodiments of the present disclosure, these metal layers should not be limited to these terms. These terms are used only to distinguish metal layers from each other. For example, without departing from the scope of the embodiments of the present disclosure, a first metal layer can also be referred to as a second metal layer, and similarly, a second metal layer can also be referred to as a first metal layer.

Figure 1:
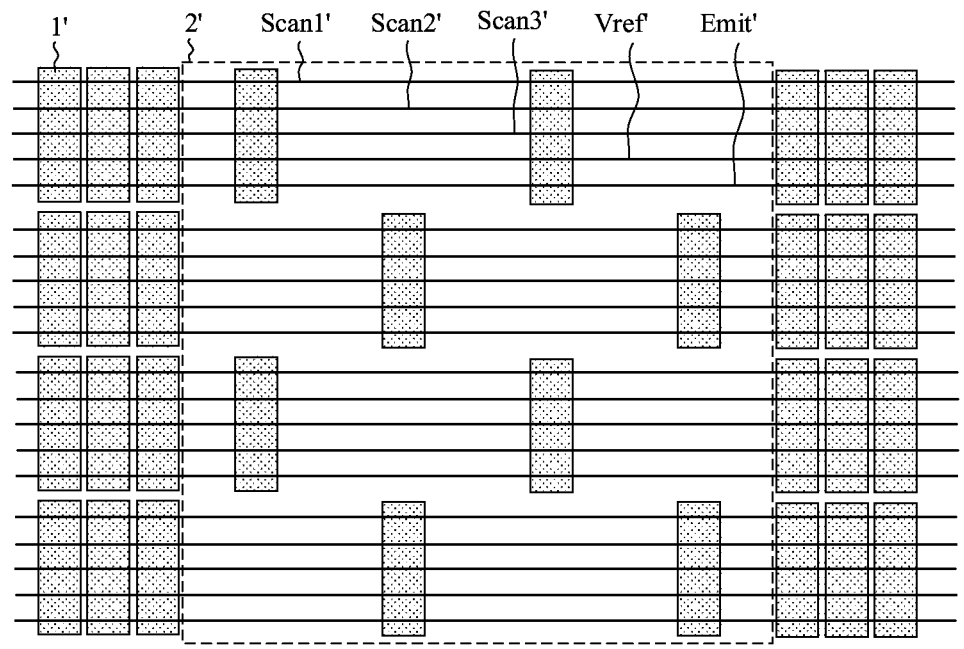
FIG. 1 is a schematic diagram of a display panel in the related art.

With reference to the analysis in the background, for a display panel using the under-screen camera technology, FIG. 1 is a schematic diagram of the display panel in the prior art. As shown in FIG. 1, a plurality of pixel circuits 1' is arranged in the display region of the panel. To drive the pixel circuit 1' to operate normally, transistors in the pixel circuit 1' are electrically connected to a plurality of signal lines.

However, based on a circuit design of the pixel circuit 1' in the related art, there are a large quantity of signal lines electrically connected to the pixel circuit 1'. For example, the signal lines only electrically connected to the pixel circuit 1' at least include a first scanning signal line Scan1', a second scanning signal line Scan2', and a third scanning signal line Scan3'. In addition, the signal lines only electrically connected to the pixel circuit 1' further include a light-emitting control signal line Emit', a reference signal line Vref, and a connection signal line located between other pixel circuits 1'. As a result, a relatively large quantity of signal lines pass through an optical component setting region 2', and thus shield a relatively large area of the optical component setting region 2', affecting light transmittance of the optical component setting region 2'.

Figure 2:
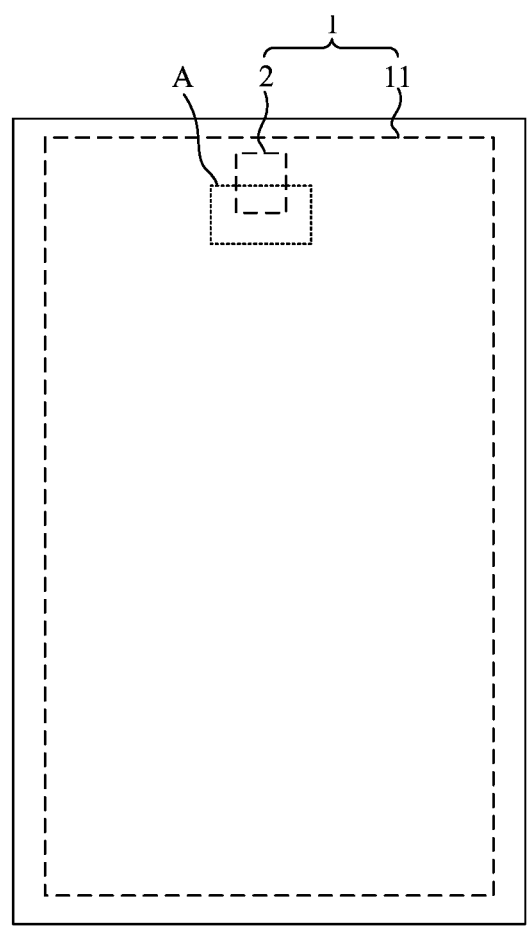
FIG. 2 is a schematic diagram illustrating a display panel according to some embodiments of the present disclosure.
Figure 3:
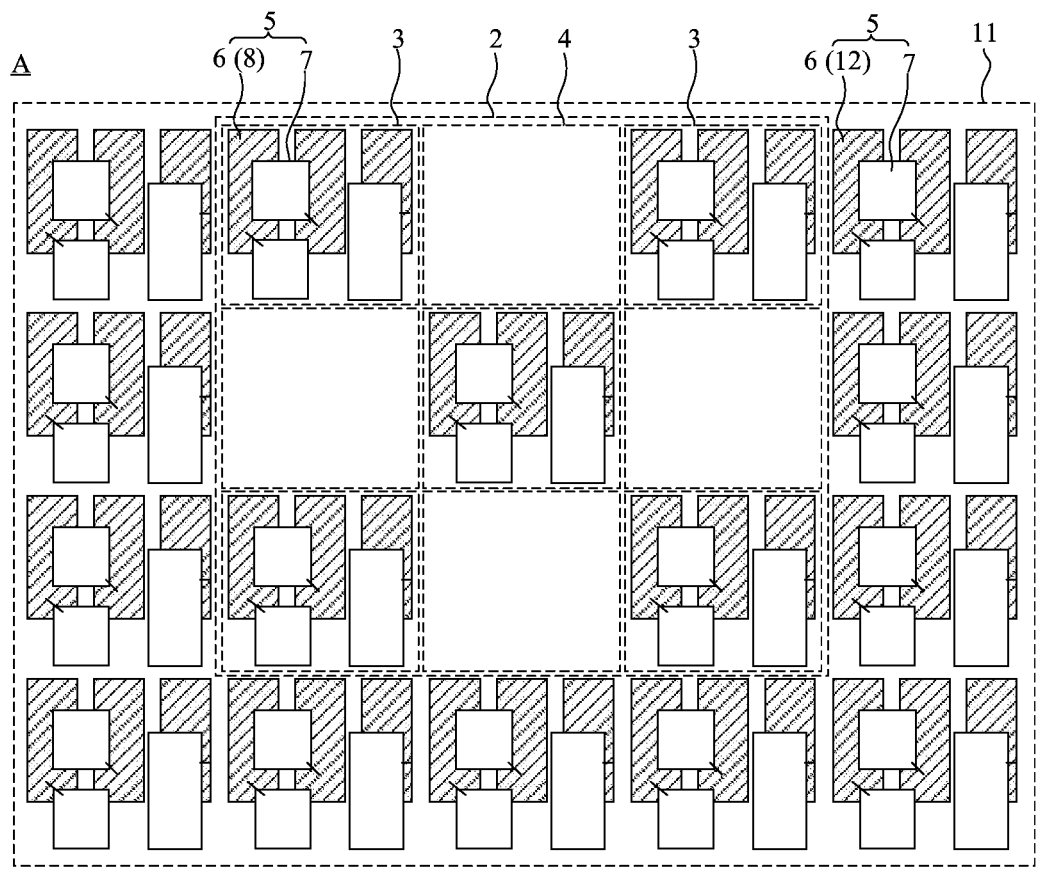
FIG. 3 is a partial enlarged schematic view of a region A in FIG. 2.

Some embodiments of the present disclosure provide a display panel. FIG. 2 is a schematic diagram of the display panel according to the embodiments of the present disclosure. FIG. 3 is a partial enlarged schematic diagram of a region A in FIG. 2. The display panel has a display region 1. The display region 1 includes an optical component setting region 2. In a direction perpendicular to a plane of the display panel, the optical component setting region 2 at least partially overlaps an optical component (such as a camera or an infrared light sensor). The optical component setting region 2 includes a plurality of pixel regions 3. A light transmission region 4 is formed between adjacent pixel regions 3. If a light ray passes through the optical component setting region 2, light transmittance of the optical component setting region 2 can be greater than light transmittance of a region in the display region 1 other than the optical component setting region 2. An outer edge of the optical component setting region 2 can be round, square, or of another shape, which can be designed according to an actual requirement and is not limited in this disclosure.

Figure 4:
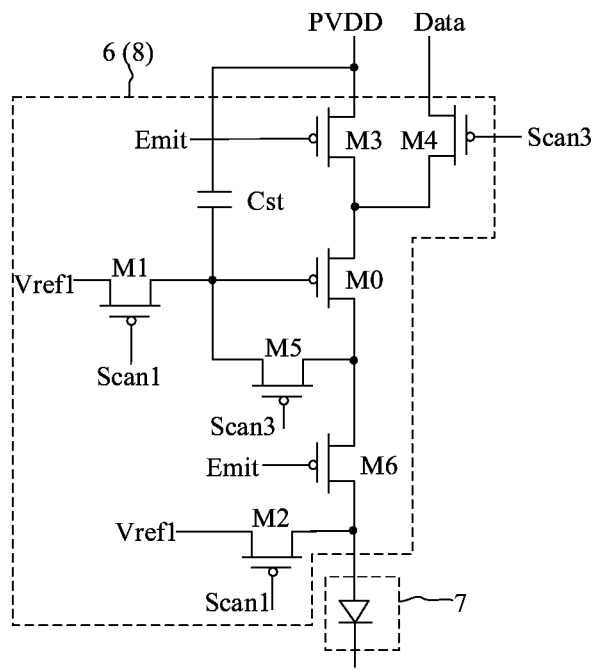
FIG. 4 is a schematic circuit diagram of a pixel circuit according to some embodiments of the present disclosure.

The display panel includes a plurality of pixels 5 located in the display region 1. The pixel 5 includes a pixel circuit 6 and an organic light-emitting element 7. The organic light-emitting element 7 includes a first electrode and a second electrode. The first electrode and the second electrode are each one of an anode and a cathode. For example, the first electrode is an anode and the second electrode is a cathode; or the first electrode is a cathode and the second electrode is an anode. FIG. 4 is a schematic circuit diagram of the pixel circuit 6 according to the embodiments of the present disclosure. As shown in FIG. 4, the pixel circuit 6 includes a plurality of transistors. The plurality of transistors includes a first reset transistor M1, a second reset transistor M2, and a drive transistor M0. The first reset transistor M1 transmits a voltage of a first electrode of the first reset transistor M1 to a gate of the drive transistor M0 in response to a scanning signal corresponding to the first reset transistor M1, to reset the gate of the drive transistor M0. The second reset transistor M2 transmits a voltage of a first electrode of the second reset transistor M2 to a first electrode of the organic light-emitting element 7 in response to a scanning signal corresponding to the second reset transistor M2, to reset the first electrode of the organic light-emitting element 7.

The connection manner of a gate and the first electrode of the first reset transistor M1 and a signal line in the pixel circuit shown in FIG. 4, and a connection manner of a gate and the first electrode the second reset transistor M2 and the signal line are exemplarily described. In some embodiments of the present disclosure, a connection relationship of the first reset transistor M1 and the second reset transistor M2 with the signal line is described in detail subsequently.

Figure 5:
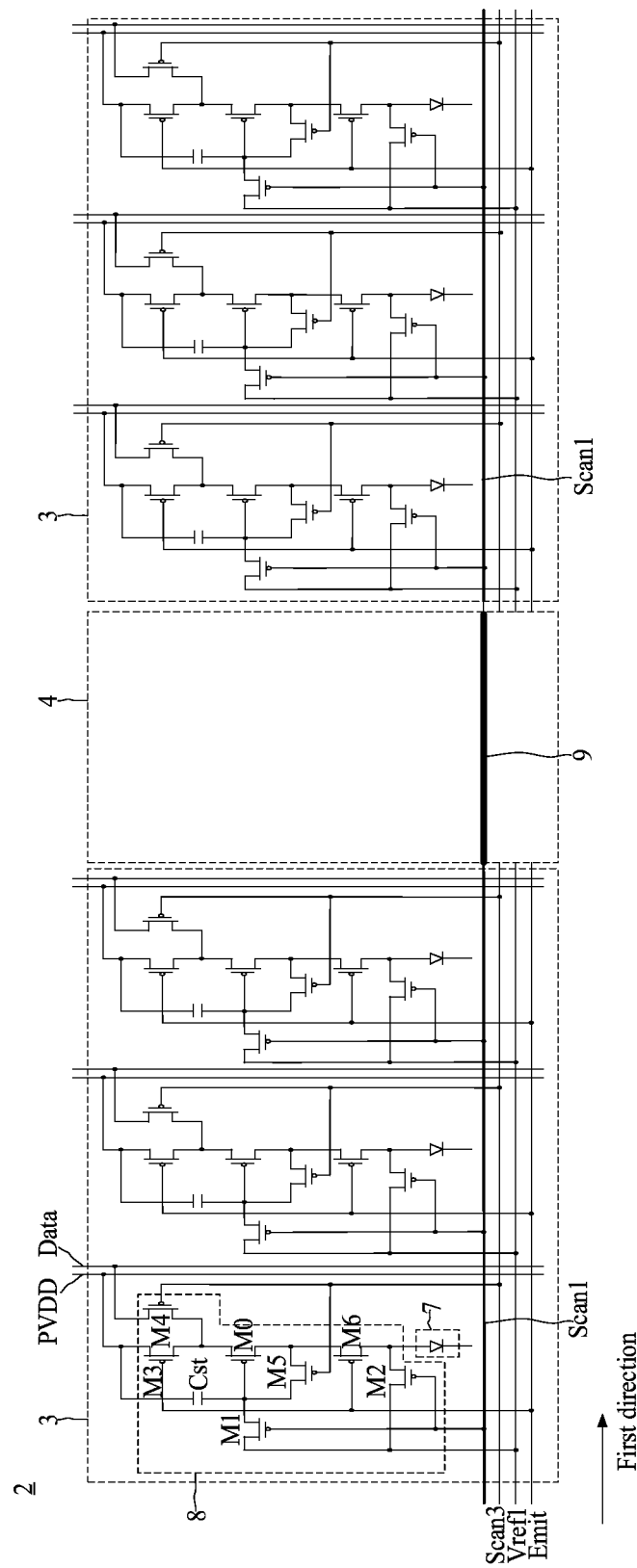
FIG. 5 is a schematic diagram illustrating connections of a first reset transistor and a second reset transistor in a first pixel circuit according to some embodiments of the present disclosure.

FIG. 5 is a schematic diagram of connections of a first reset transistor M1 and a second reset transistor M2 in a first pixel circuit 8 according to the embodiments of the present disclosure. The pixel circuits 6 include the first pixel circuits 8 located in the optical component setting region 2. In the first pixel circuit 8, a gate of the first reset transistor M1 is electrically connected to a gate of the second reset transistor M2. In other words, the first reset transistor M1 and the second reset transistor M2 in the first pixel circuit 8 respond to a same scanning signal, and the first reset transistor M1 and the second reset transistor M2 simultaneously reset the gate of the drive transistor M0 and the first electrode of the organic light-emitting element 7, respectively.

In some embodiments of the present disclosure, the gate of the first reset transistor M1 and the gate of the second reset transistor M2 in the first pixel circuit 8 are electrically connected to each other and receive the same scanning signal. Therefore, a scanning line is provided in the optical component setting region 2 to provide the scanning signal to the first reset transistor M1 and the second reset transistor M2 simultaneously, and there is no need to dispose two independent scanning lines to provide scanning signals to the first reset transistor M1 and the second reset transistor M2, respectively. Correspondingly, a quantity of scanning lines passing through the optical component setting region 2 is reduced, thereby reducing an area of the optical component setting region 2 shielded by the scanning lines and increasing an area of a light transmission region in the optical component setting region 2.

In an embodiment, referring to FIG. 5 again, at least one first pixel circuit 8 is provided in the pixel region 3, and the gate of the first reset transistor M1 and the gate of the second reset transistor M2 in the pixel region 3 are both electrically connected to a first scanning signal line Scan1. For two adjacent pixel regions 3 in a first direction, first scanning signal lines Scan1 respectively electrically connected to first pixel circuits 8 respectively located in two pixel regions 3 are electrically connected to each other through a first scanning signal transmission line 9. In this way, a plurality of first scanning signal lines Scan1 arranged along the first direction are connected in series through the first scanning signal transmission line 9 to form a complete scanning line, which can provide a continuous transmission path for the scanning signal and ensure that the scanning signal is normally written into a plurality of first pixel circuits 8 arranged along the first direction.

Figure 6:
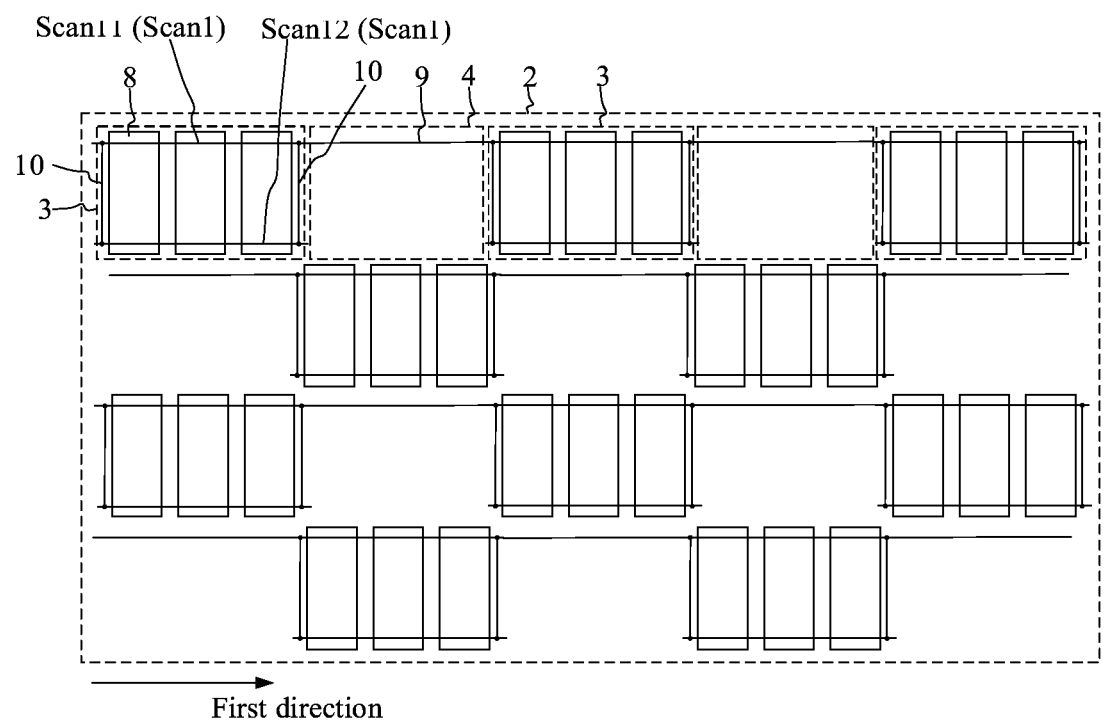
FIG. 6 is a schematic diagram illustrating an optical component setting region according to some embodiments of the present disclosure.
Figure 7:
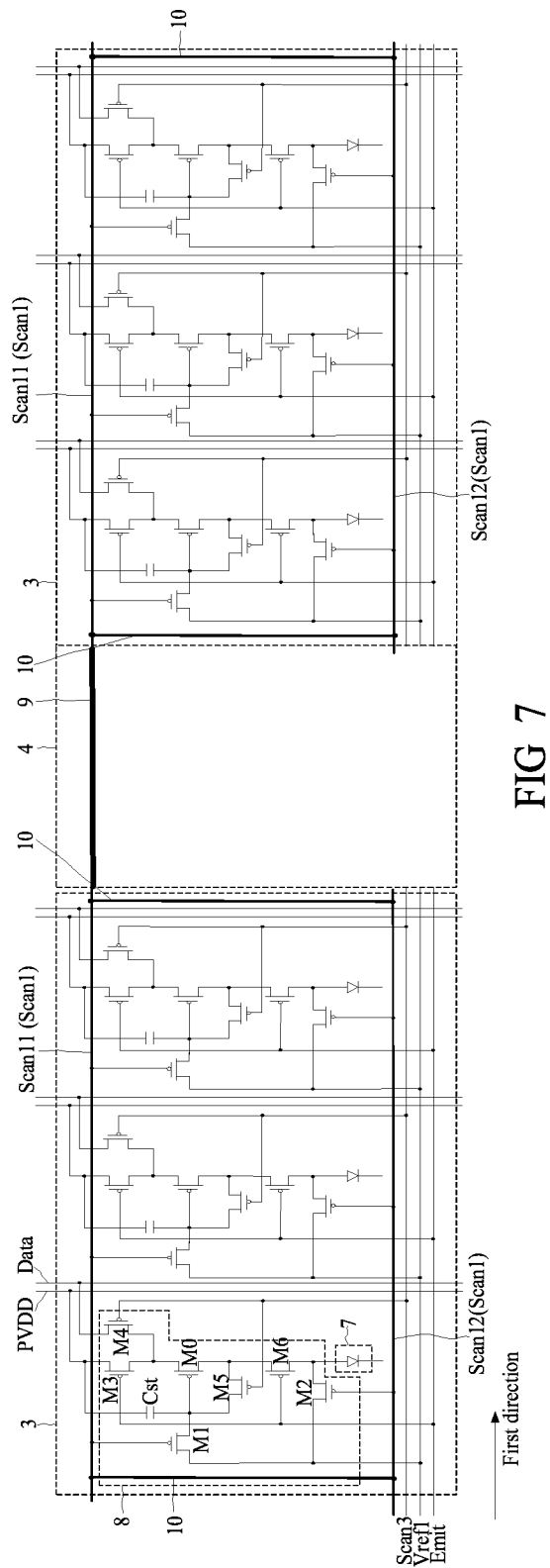
FIG. 7 is another schematic diagram of connections of the first reset transistor and the second reset transistor in the first pixel circuit according to some embodiments of the present disclosure.
Figure 8:
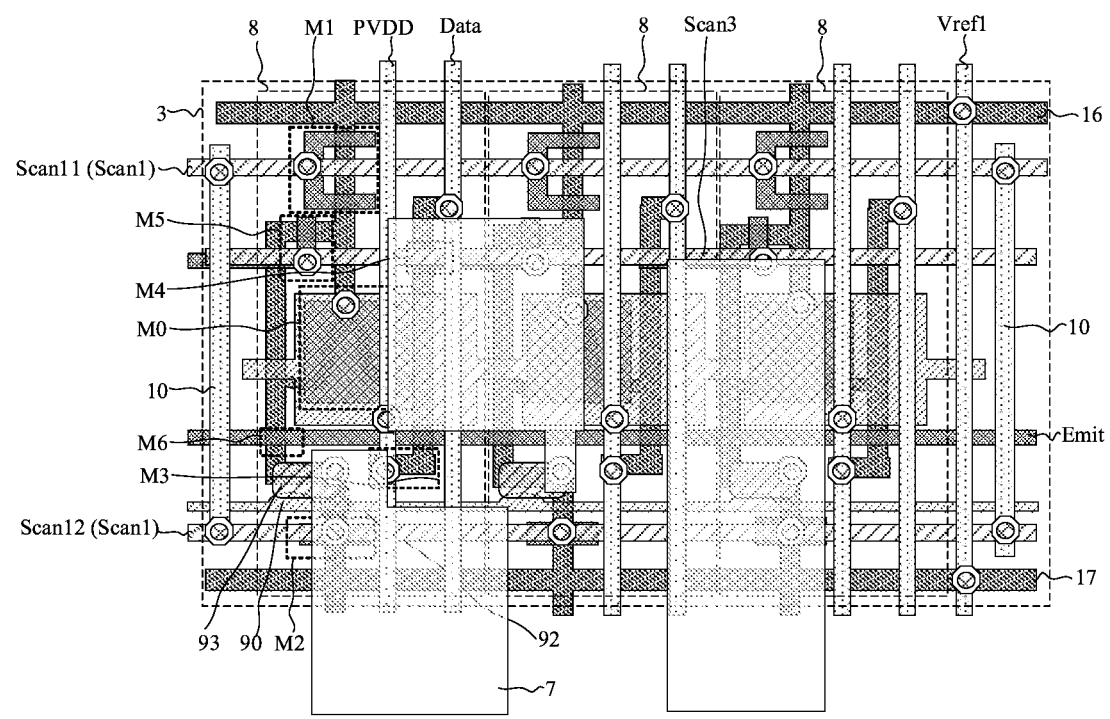
FIG. 8 is a schematic layout diagram of a single pixel region according to some embodiments of the present disclosure.
Figure 9:
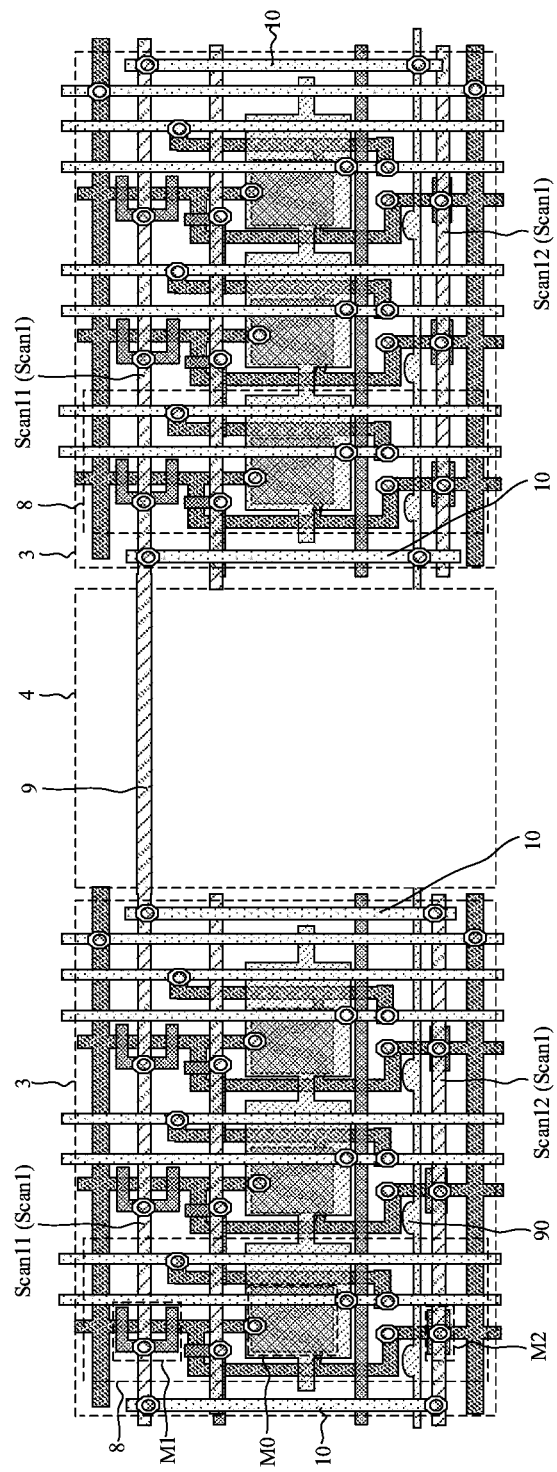
FIG. 9 is a schematic layout diagram corresponding to FIG. 7, according to some embodiments of the present disclosure.

FIG. 6 is a schematic diagram of the optical component setting region 2 according to some embodiments of the present disclosure. FIG. 7 is another schematic diagram of connections of the first reset transistor M1 and the second reset transistor M2 in the first pixel circuit 8 according to some embodiments of the present disclosure. FIG. 8 is a schematic layout diagram of a single pixel region 3 according to some embodiments of the present disclosure. FIG. 9 is a schematic layout diagram corresponding to FIG. 7. As shown in FIG. 6 to FIG. 9, the first scanning signal line Scan1 can include a first scanning line segment Scan11 and a second scanning line segment Scan12 that are located in the pixel region 3. The first scanning line segment Scan11 is electrically connected to the gate of the first reset transistor M1. The second scanning line segment Scan12 is electrically connected to the gate of the second reset transistor M2. The first scanning line segment Scan11 is electrically connected to the second scanning line segment Scan12 through a first connection line 10. In an embodiment, the first scanning signal line scan1 can be electrically connected to the gate of the first reset transistor M1 and the gate of the second reset transistor M2 through via holes, respectively.

For clear illustration, FIG. 7 and FIG. 9 illustrate only the first scanning signal transmission line 9 between the first scanning signal lines Scan1, and a transmission line between other signal lines, such as light-emitting control signal lines Emit, power signal lines PVDD, or data lines Data is to be described in detail in subsequent embodiments.

With reference to the layout of the first pixel circuit 8 shown in FIG. 8, positions of the first reset transistor M1 and the second reset transistor M2 in the first pixel circuit 8 are far away from each other. With the configuration where the first scanning signal line Scan1 includes two line segments, in a layout design, the first scanning line segment Scan11 can extend at a position close to the first reset transistor M1 and therefore can be more easily electrically connected to the gate of the first reset transistor M1, the second scanning line segment Scan12 can extend at a position close to the second reset transistor M2 and therefore can be more easily electrically connected to the gate of the second reset transistor M2. On the one hand, the layout design is simple and compact, and space utilization is high. On the other hand, with such configuration, the positions of the first reset transistor M1 and the second reset transistor M2 in the first pixel circuit 8 can be retained, by adjusting a line design, making a design method more flexible.

In an embodiment, referring to FIG. 8 again, the display panel further includes a dummy anode 90, and the dummy anode 90 is adjacent to a connection line 92 between the second reset transistor M2 and the first electrode of the light-emitting element 7, and is configured to form a coupling capacitance with the connection line 92, so as to stabilize a potential of the first electrode of the light-emitting element 7 by using the coupling capacitance, thereby improving accuracy of light-emitting brightness of the light-emitting element 7.

In an embodiment, still referring to FIG. 8, a plurality of layer structures are arranged between the first electrode of the light-emitting element 7 and a source/drain of the second reset transistor M2, and a distance therebetween is relatively large along a direction perpendicular to the display panel. Therefore, when the first electrode is electrically connected to the second reset transistor M2, a contact hole is relatively deep and an aperture thereof is relatively large, increasing an opaque area and increasing a difficulty of an etching process when the contact hole is relatively deep than when the contact hole is shallow. Therefore, a transfer structure 93 can be disposed in a third metal layer or a fourth metal layer. The light-emitting element 7 is electrically connected to the transfer structure 93 through the contact hole, and the transfer structure 93 is further electrically connected to a second electrode or the drain of the second reset transistor M2 through another contact hole. In a direction perpendicular to a plane of the display panel, the dummy anode 90 at least partially overlaps the transfer structure 93 electrically connected the corresponding organic light-emitting element 7, which can stabilize the potential of the first electrode of the organic light-emitting element 7. In an embodiment, the dummy anode 90 can be electrically connected to a fixed potential signal terminal.

When the first scanning signal line Scan1 includes the first scanning line segment Scan11 and the second scanning line segment Scan12 that are electrically connected to each other through the first connection line 10, the first scanning signal transmission line 9 can be directly connected to the first scanning line segment Scan11, or can be directly connected to the second scanning line segment Scan12, or can be directly connected to the first connection line 10, so that the first scanning signal transmission line 9 is electrically connected to the first scanning signal line Scan1.

In an embodiment, the first scanning signal transmission line 9 can be further arranged in a same layer as the first scanning line segment Scan11 directly connected to the first scanning signal transmission line 9, the second scanning line segment Scan12 directly connected to the first scanning signal transmission line 9, or the first connection line 10 directly connected to the first scanning signal transmission line 9. In other words, the first scanning signal transmission line 9 is formed by using a same patterning process as the first scanning line segment Scan11 directly connected to the first scanning signal transmission line 9, the second scanning line segment Scan12 directly connected to the first scanning signal transmission line 9, or the first connection line 10 directly connected to the first scanning signal transmission line 9.

Figure 10:
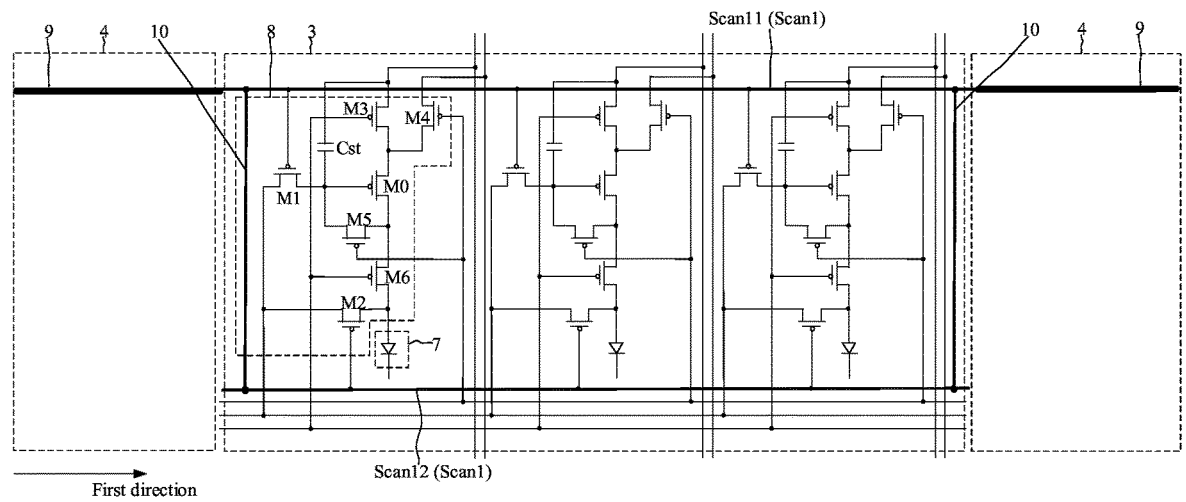
FIG. 10 is a schematic diagram of connections of a first scanning signal transmission line and a first scanning signal line according to some embodiments of the present disclosure.
Figure 11:
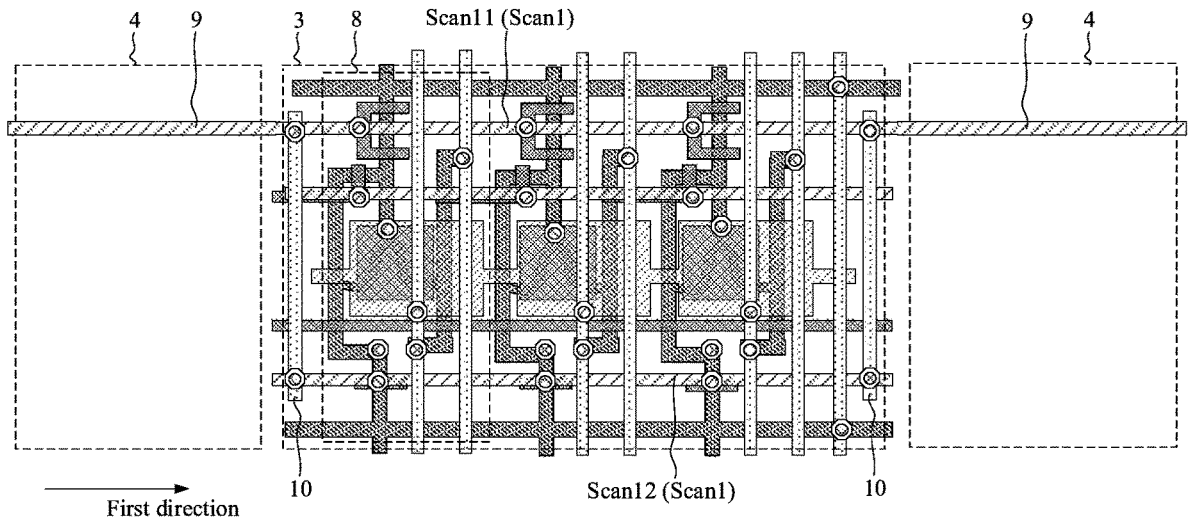
FIG. 11 is a schematic layout diagram corresponding to FIG. 10, according to some embodiments of the present disclosure.

FIG. 10 is a schematic connection diagram of the first scanning signal transmission line 9 and the first scanning signal line Scan1 according to some embodiments of the present disclosure, and FIG. 11 is a schematic layout diagram corresponding to FIG. 10. For example, as shown in FIG. 10 and FIG. 11, first scanning signal transmission lines 9 arranged in the first direction and located at two sides of the pixel region 3 are both directly connected to the first scanning line segment Scan11 in the pixel region 3, and are arranged in a same layer as the first scanning line segment Scan11, which can not only reduce a process, but also implement the electrical connection between the first scanning signal line Scan1 and the first scanning signal transmission line 9 without any additional contact hole, thereby reducing a light transmission area occupied by the contact hole in the optical device setting region 2.

Figure 12:
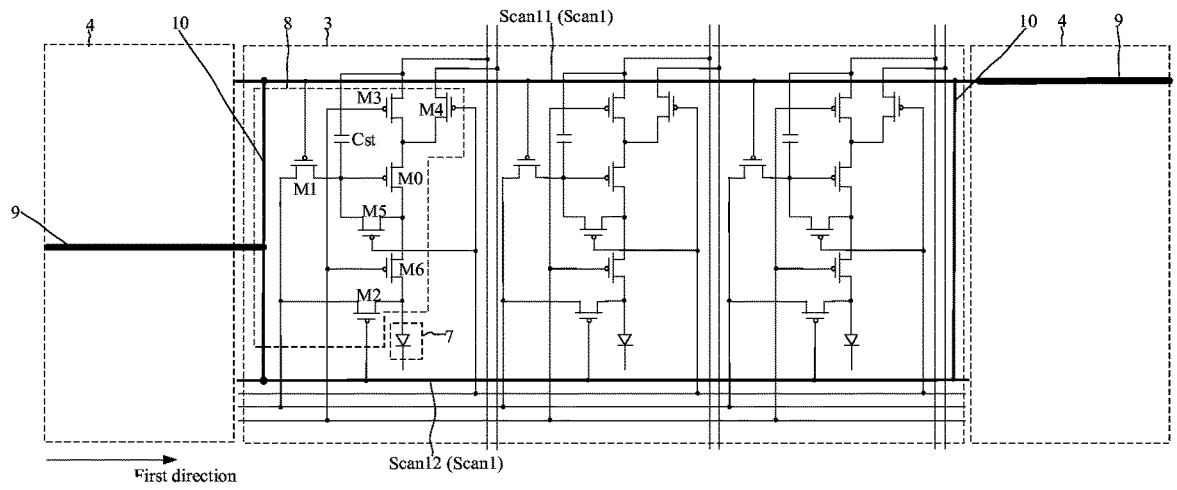
FIG. 12 is another schematic diagram of connections of the first scanning signal transmission line and the first scanning signal line according to some embodiments of the present disclosure.
Figure 13:
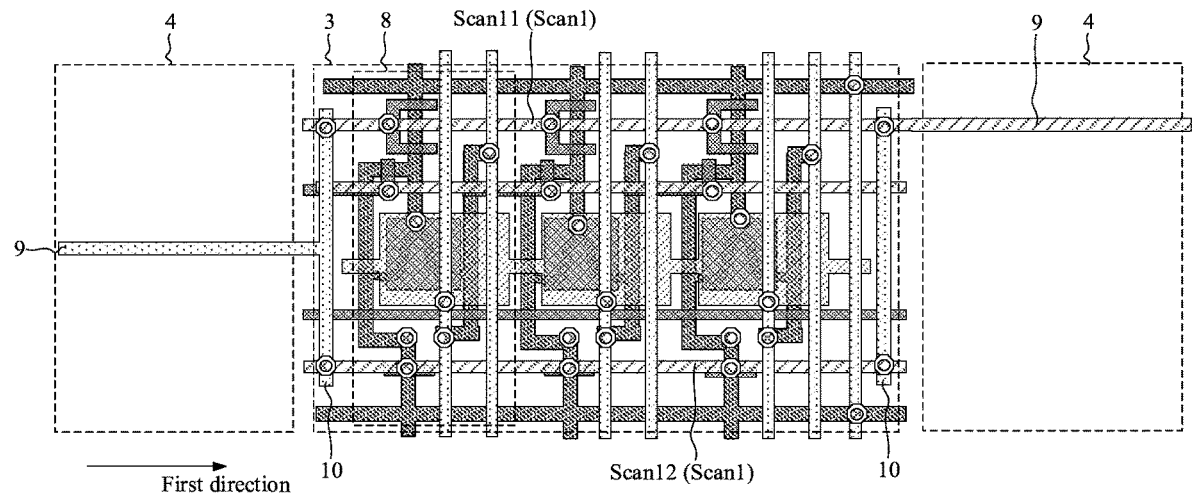
FIG. 13 is a schematic layout diagram corresponding to FIG. 12, according to some embodiments of the present disclosure.

FIG. 12 is another schematic connection diagram of the first scanning signal transmission line 9 and the first scanning signal line Scan1 according to some embodiments of the present disclosure, and FIG. 13 is a schematic layout diagram corresponding to FIG. 12. In an embodiment, as shown in FIG. 12 and FIG. 13, one first scanning signal transmission line 9 locate at one side of the pixel region 3 in the first direction is directly connected to the first connection line 10 in the pixel region 3 and is arranged in a same layer as the first connection line 10, and another first scanning signal transmission line 9 located in another side of the pixel region 3 in the first direction is directly connected to the first scanning line segment Scan11 in the pixel region 3 and is arranged in a same layer as the first scanning line segment Scan11, which not only reduces a process, but also implement the electrical connection between the first scanning signal line Scan1 and the first scanning signal transmission line 9 without any additional contact hole, thereby reducing a light transmission area occupied by the contact hole in the optical device setting region 2.

The first scanning signal transmission line 9 is arranged in a same layer as the first scanning line segment Scan11 directly connected to the first scanning signal transmission line 9, the second scanning line segment Scan12 directly connected to the first scanning signal transmission line 9, or the first connection line 10 directly connected to the first scanning signal transmission line 9 without the via hole, reducing a risk of disconnection caused by discontinuity of a metal material deposited in the via hole. Therefore, the first scanning signal transmission line 9 is arranged in a same layer as and is formed with a same process as the first scanning line segment Scan11 directly connected to the first scanning signal transmission line 9, the second scanning line segment Scan12 directly connected to the first scanning signal transmission line 9, or the first connection line 10 directly connected to the first scanning signal transmission line 9, to achieve mutual connection, thereby making the connection more reliable and signal transmission more stable.

In an embodiment, referring to FIG. 8 again, two ends of the second scanning line segment Scan12 can be respectively electrically connected to two ends of the first scanning line segment Scan11 through one first connection line 10. In other words, along the first direction, the first connection line 10 located at one side of the pixel region 3 electrically connects a first end of the first scanning line segment Scan11 to a first end of the second scanning line segment Scan12, the first connection line 10 located at another side of the pixel region 3 electrically connects a second end of the first scanning line segment Scan11 to a second end of the second scanning line segment Scan12. With such configuration, overall line load of the first scanning signal line Scan1 can be reduced, and if the display panel is bilaterally driven by a shift register, when the scanning signal is transmitted to the two ends of the first scanning line segment Scan11, the scanning signal can be transmitted to the two ends of the second scanning line segment Scan12 simultaneously through two first connection lines 10, and then transmitted from the two ends of the second scanning line segment Scan12 to the middle. In this way, compared with a case in which the scanning signal is transmitted from one end of the second scanning line segment Scan12 to the other end, a writing speed of the scanning signal in the second reset transistor M2 can be improved.

In an embodiment, referring to FIG. 2 and FIG. 3 again, the display region 1 further includes a primary display region 11 adjacent to the optical component setting region 2. For example, the primary display region 11 can surround the optical component setting region 2, and the pixel circuit 6 further includes a second pixel circuit 12 located in the primary display region 11.

The following exemplarily describes the connections of the gate of the first reset transistor M1 and the gate of the second reset transistor M2 in the second pixel circuit 12 by using two configurations as examples.

Figure 14:
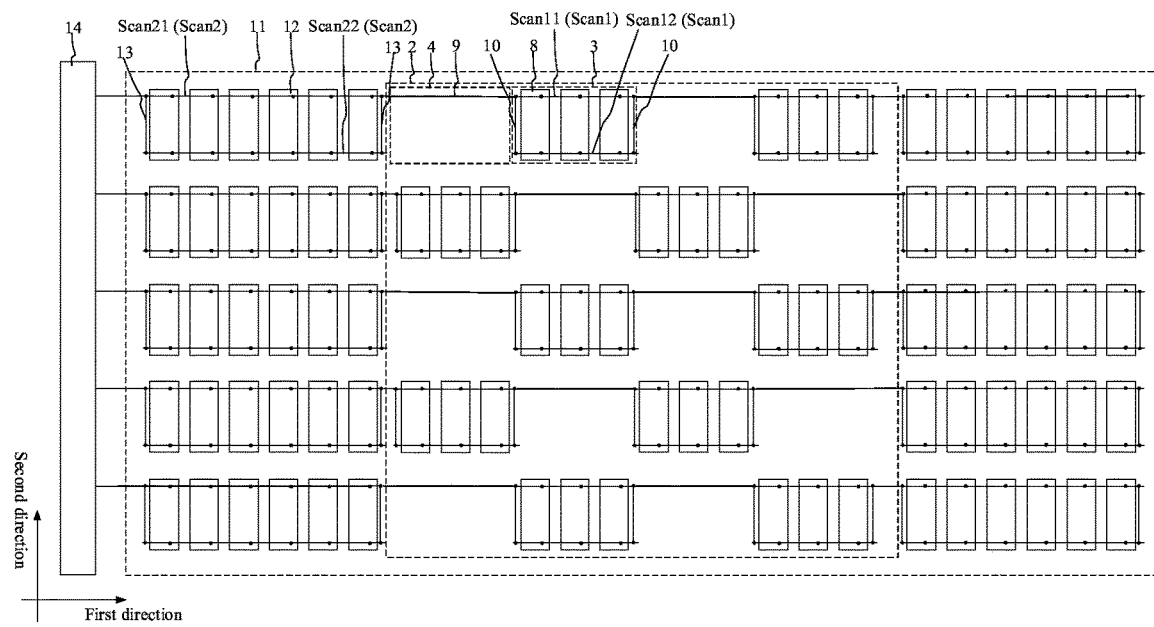
FIG. 14 is a schematic diagram of a primary display region according to some embodiments of the present disclosure.
Figure 15:
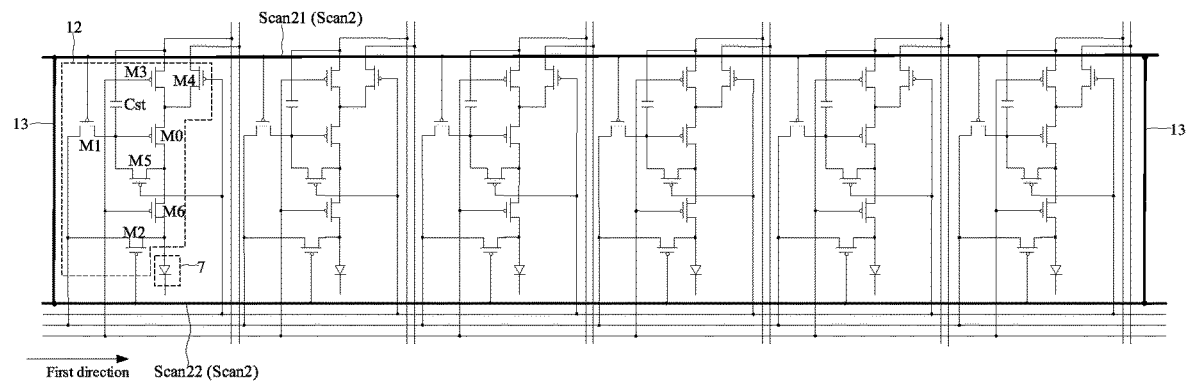
FIG. 15 is a schematic diagram of connections of a first reset transistor and a second reset transistor in a second pixel circuit according to some embodiments of the present disclosure.
Figure 16:
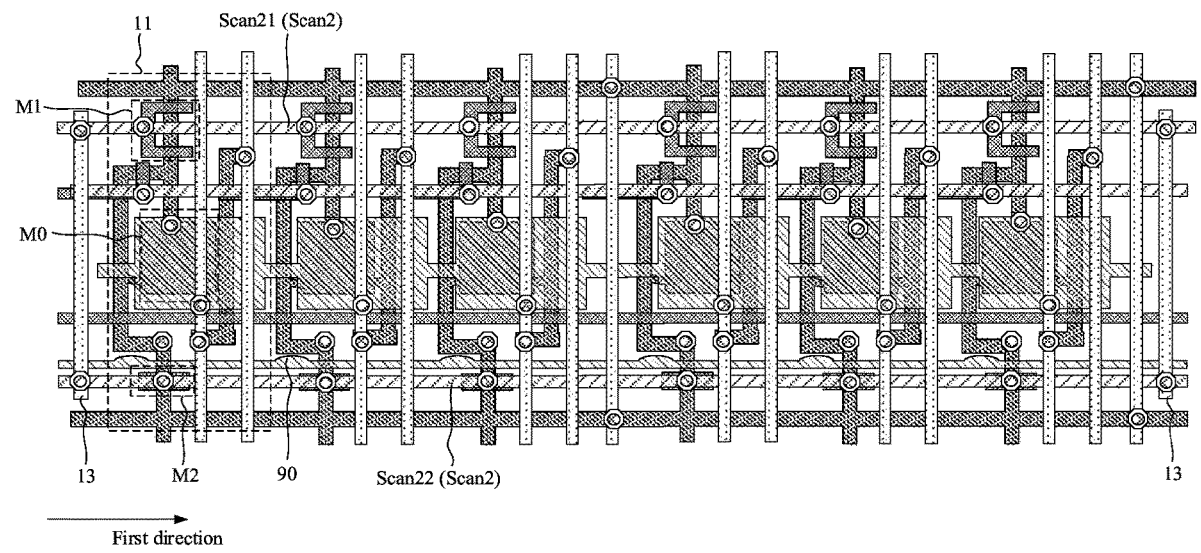
FIG. 16 is a schematic layout diagram corresponding to FIG. 15, according to some embodiments of the present disclosure.

First Configuration:

FIG. 14 is a schematic diagram of a primary display region according to some embodiments of the present disclosure. FIG. 15 is a schematic connection diagram of the first reset transistor M1 and the second reset transistor M2 in the second pixel circuit 12 according to some embodiments of the present disclosure. FIG. 16 is a schematic layout diagram corresponding to FIG. 15. In an embodiment, as shown in FIG. 14 to FIG. 16, in the second pixel circuit 12, the gate of the first reset transistor M1 is electrically connected to the gate of the second reset transistor M2. In other words, the first reset transistor M1 and the second reset transistor M2 in the second pixel circuit 12 are turned on in response to an active level of a same scanning signal. The first reset transistor M1 and the second reset transistor M2 simultaneously reset the gate of the drive transistor M0 and the first electrode of the organic light-emitting element 7, respectively.

Based on the foregoing configuration, in each of the first pixel circuit 8 and the second pixel circuit 12, the gate of the first reset transistor M1 and the gate of the second reset transistor M2 both receive the same scanning signal. Therefore, when setting a shift register for providing a scanning signal, referring to FIG. 14 again, the scanning signal required by the gate of the first reset transistor M1 and the gate of the second reset transistor M2 in the pixel circuit can be provided by using only one set of shift registers 14, which reduces a quantity of shift registers 14 used in the panel, thereby facilitating a narrow bezel of the display panel.

In an embodiment, referring to FIG. 15 and FIG. 16 again, the gates of the first reset transistor M1 and the gates of the second reset transistor M2 in the second pixel circuits 12 that are arranged along the first direction are electrically connected to the second scanning signal line Scan2. The second scanning signal line Scan2 includes a third scanning line segment Scan21 and a fourth scanning line segment Scan22 that are located in the primary display region 11. The third scanning line segment Scan21 is electrically connected to the gate of the first reset transistor M1. The fourth scanning line segment Scan22 is electrically connected to the gate of the second reset transistor M2. The third scanning line segment Scan21 is electrically connected to the first scanning line segment Scan11 through a second connection line 13.

In an embodiment, for the first pixel circuit 8 and the second pixel circuit 12 that are arranged along the first direction, the first scanning signal line Scan1 electrically connected to the first pixel circuit 8 is electrically connected to the second scanning signal line Scan2 electrically connected to the second pixel circuit 12.

In an embodiment, any one of the third scanning line segment Scan21, the fourth scanning line segment Scan22, and the second connection line 13 is directly connected to any one of the first scanning line segment Scan11, the second scanning line segment Scan12, the first connection line 10, and the first scanning signal transmission line 9 in such a manner that the second scanning signal line Scan2 and the first scanning signal line Scan1 are the electrically connected to each other. For example, referring to FIG. 14 again, when the primary display region 11 is adjacent to the pixel region 3, the third scanning line segment Scan21 can be directly connected to the first scanning line segment Scan11 in such a manner that the second scanning signal line Scan2 and the first scanning signal line Scan1 are electrically connected to each other. When the primary display region 11 is adjacent to the light transmission region 4, the third scanning line segment Scan21 can be directly connected to the first scanning signal transmission line 9 in such a manner that the second scanning signal line Scan2 and the first scanning signal line Scan1 are electrically connected to each other.

With reference to the layout of the second pixel circuit 12 shown in FIG. 16, the second scanning signal line Scan2 can include two line segments, i.e., the third scanning line segment Scan21 and the fourth scanning line segment Scan22, so that in a layout design, the third scanning line segment Scan21 can extend at a position close to the first reset transistor M1, which facilitates electrical connection of the third scanning line segment Scan21 to the gate of the first reset transistor M1, and the fourth scanning line segment Scan22 can extend at a position close to the second reset transistor M2 and therefore can be more easily electrically connected to the gate of the second reset transistor M2. On the one hand, the layout design is simple and compact, and space utilization is high. On the other hand, with such configuration, the positions of the first reset transistor M1 and the second reset transistor M2 in the first pixel circuit 8 can be retained by adjusting the design, making a design method more flexible.

In an embodiment, to reduce overall line load of the second scanning signal line Scan2, two ends of the fourth scanning line segment Scan22 can be respectively electrically connected to two ends of the third scanning line segment Scan21 through one second connection line 13.

Figure 17:
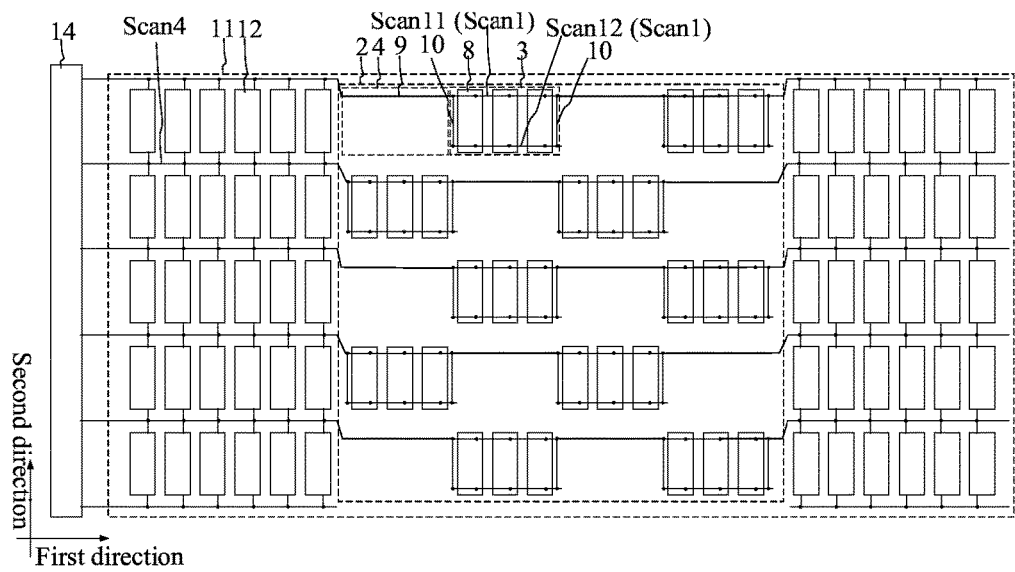
FIG. 17 is another schematic diagram of the primary display region according to some embodiments of the present disclosure.
Figure 18:
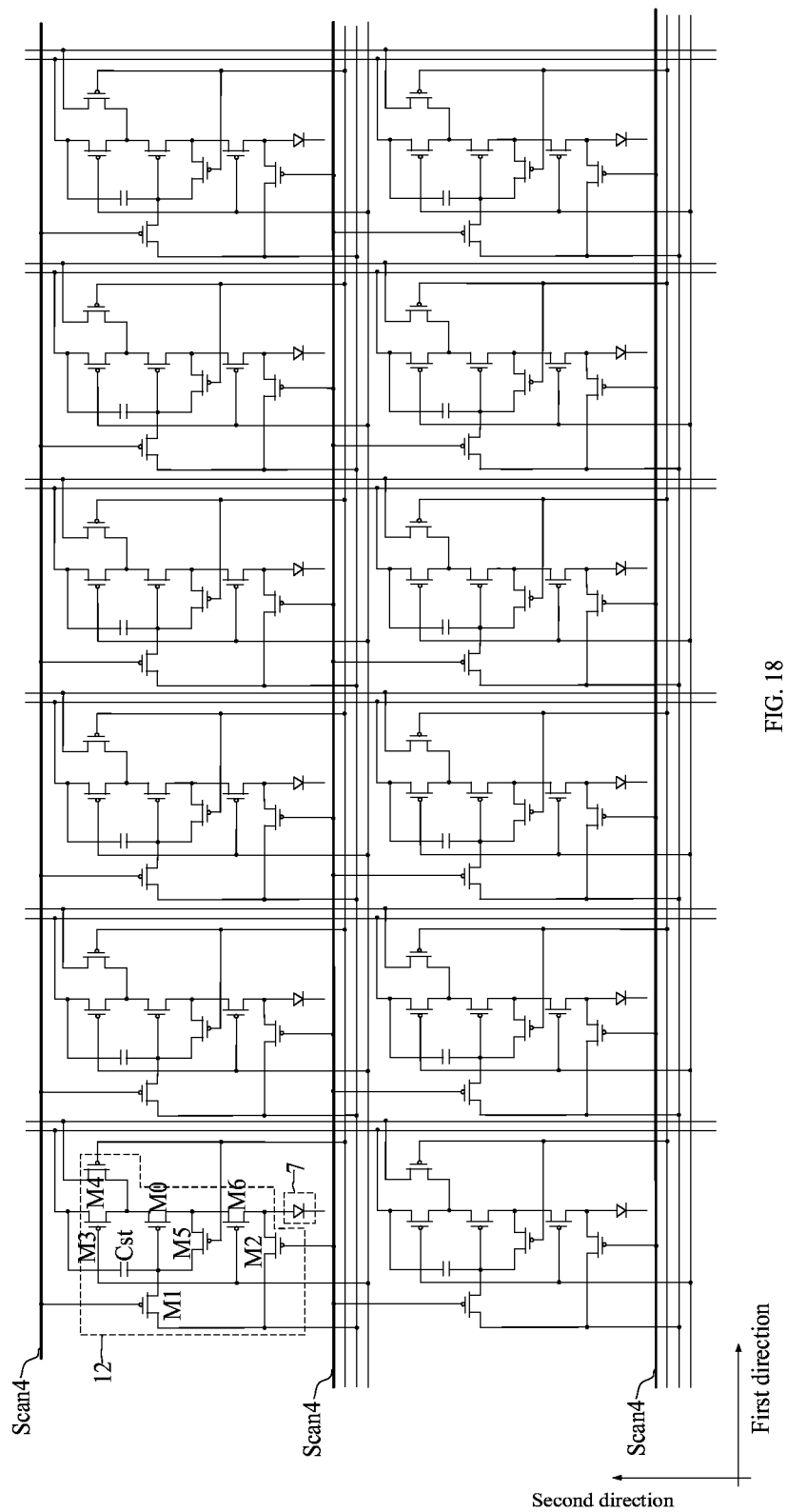
FIG. 18 is another schematic diagram of connections of the first reset transistor and the second reset transistor in the second pixel circuit according to some embodiments of the present disclosure.
Figure 19:
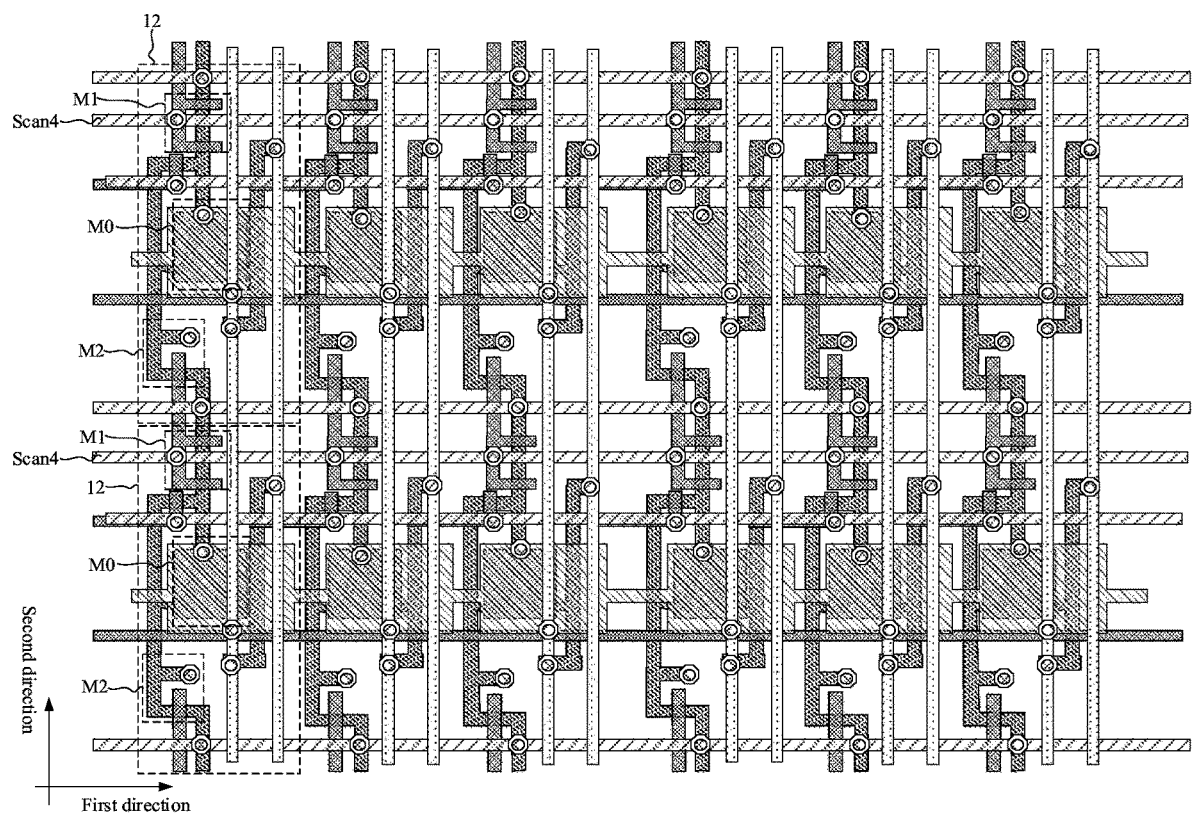
FIG. 19 is a schematic layout diagram corresponding to FIG. 18, according to some embodiments of the present disclosure.

Second Configuration:

In an embodiment, as shown in FIG. 17 to FIG. 19, for two adjacent second pixel circuits 12 arranged in a second direction, the gate of the second reset transistor M2 in an $i^{th}$ second pixel circuit 12 and the gate of the first reset transistor M1 in an $(i+1)^{th}$ second pixel circuit 12 are electrically connected to a same fourth scanning signal line Scan4, where i is a positive integer greater than or equal to 1; and for a plurality of second pixel circuits 12 arranged along the first direction, gates of first reset transistors M1 in the second pixel circuits 12 are electrically connected to a same fourth scanning signal line Scan4, gates of second reset transistors M2 in the second pixel circuits 12 are electrically connected to a same fourth scanning signal line Scan4, and the second direction intersects the first direction. In other words, for two adjacent second pixel circuits arranged along the second direction, a first reset transistor M1 in one second pixel circuit 12 can share a fourth scanning signal line Scan4 with a second reset transistor M2 in the other second pixel circuit 12. In this way, a quantity of the fourth scanning signal lines Scan4 can be reduced, and space utilization of the display panel can be increased, so that the arrangement of the pixel circuits of the display panel is more compact, thereby improving resolution of the display panel.

In an embodiment, for the first pixel circuit 8 and the second pixel circuit 12 that are arranged along the first direction, the first scanning signal line Scan1 electrically connected to the first pixel circuit 8 is electrically connected to the fourth scanning signal line Scan4 electrically connected to the gate of the first reset transistor M1 in the second pixel circuit 12, which can realize the transmission of the scanning signal and normal operation of the pixel circuit.

In an embodiment, the electrical connection between the fourth scanning signal line Scan4 and the first scanning signal line Scan1 can be electrically connected to each other in such a manner that the fourth scanning signal line Scan4 is directly connected to any one of the first scanning line segment Scan11, the second scanning line segment Scan12, the first connection line 10, and the first scanning signal transmission line 9. For example, referring to FIG. 17, when the primary display region 11 is adjacent to the pixel region 3, the fourth scanning signal line Scan4 can be electrically connected to the first scanning signal line Scan1 by being directly connected to the first scanning line segment Scan11; and when the primary display region 11 is adjacent to the light transmission region 4, the fourth scanning signal line Scan4 can be electrically connected to the first scanning signal line Scan1 by being directly connected to the first scanning signal transmission line 9.

With such configuration, a drive period of the second pixel circuit 12 includes a first reset time period and a second reset time period. For two adjacent second pixel circuits 12 arranged in the second direction, in a first reset time period of a previous second pixel circuit 12, the first reset transistor M1 resets the gate of the drive transistor M0 in response to a scanning signal provided by the fourth scanning signal line Scan4 connected to the first reset transistor M1, and in a second reset time period of the previous second pixel circuit 12, the second reset transistor M2 resets the gate of the drive transistor M0 in response to the scanning signal provided by the fourth scanning signal line Scan4 connected to the second reset transistor M2. At the same time, a next second pixel circuit 12 enters a first reset time period, the first reset transistor M1 in the next second pixel circuit 12 resets the gate of the drive transistor M0 in response to the scanning signal, to achieve sequential scanning. With such configuration, when setting a shift register for providing a scanning signal, referring to FIG. 17 again, only a set of shift registers 14 are utilized to provide scanning signals to the fourth scanning signal line Scan4. Therefore, a quantity of shift registers 14 disposed in the display panel is relatively small, and a frame width of the panel is correspondingly relatively narrow.

Figure 20:
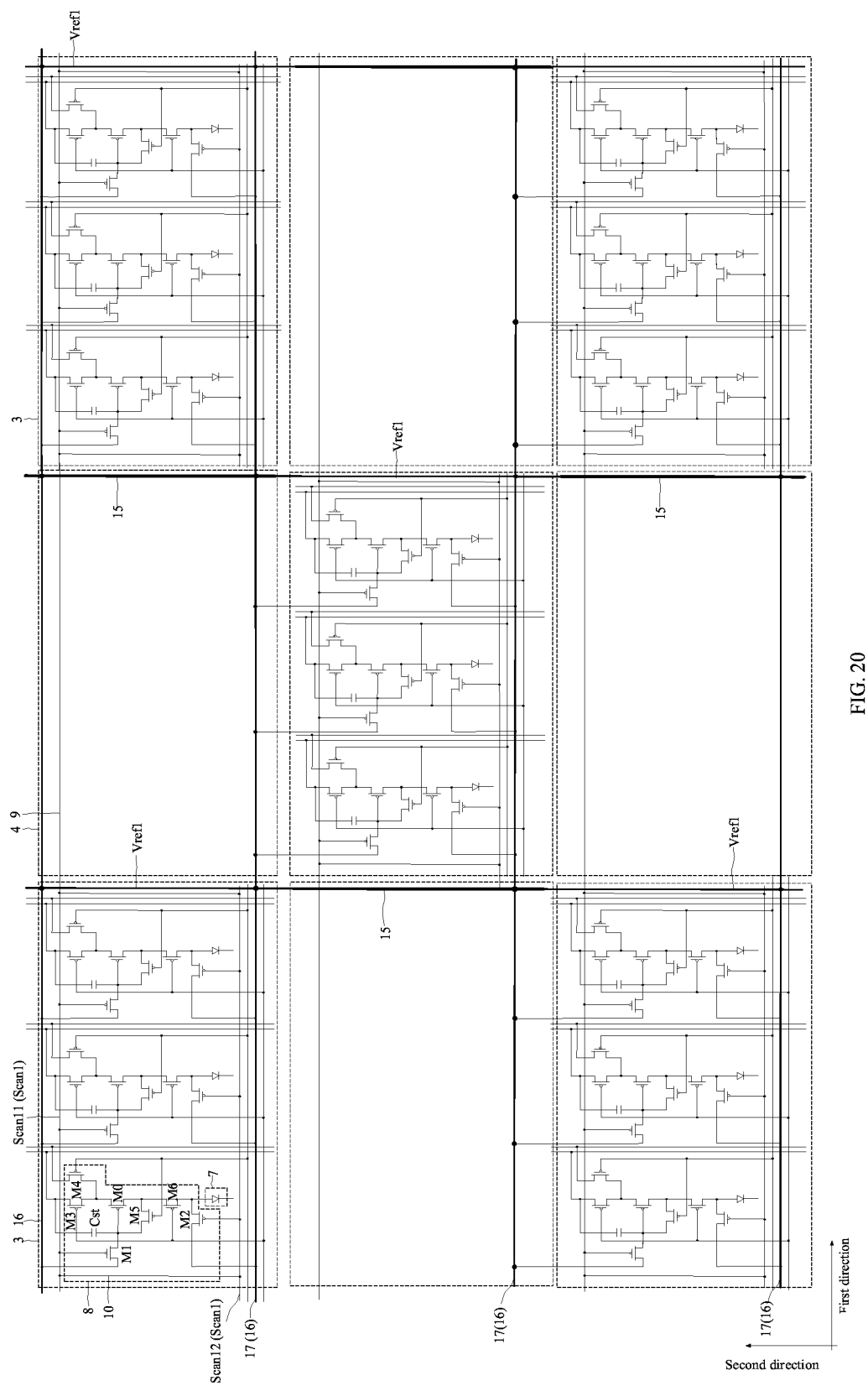
FIG. 20 is another schematic diagram of connections of the first reset transistor and the second reset transistor in the first pixel circuit according to some embodiments of the present disclosure.

As shown in FIG. 20, the first electrode of the first reset transistor M1 in the pixel region 3 is electrically connected to a first reset signal line Vref1, and the first electrode of the second reset transistor M2 in the pixel region 3 is electrically connected to the first reset signal line Vref1. In an embodiment, for two adjacent pixel regions 3, first reset signal lines Vref1 electrically connected first pixel circuits 8 in the pixel regions 3 are electrically connected through a first reset signal transmission line 15. In other words, in the first pixel circuit 8, the first reset transistor M1 and the second reset transistor M2 respond to a same scanning signal, and respectively reset the gate of the drive transistor M0 and the first electrode of the organic light-emitting element 7 by using a same reset signal.

With such configuration, in the first pixel circuit 8, the first electrode of the first reset transistor M1 and the first electrode of the second reset transistor M2 receive the same reset signal. Therefore, only one reset line is disposed in only the optical component setting region 2 to provide the reset signal to the first reset transistor M1 and the second reset transistor M2. In this way, a quantity of signal lines passing through the optical component setting region 2 is further reduced, and an opaque area in the optical component setting region 2 is reduced, thereby greatly improving light transmittance of the optical component setting region 2.

The following describes a structure of the first reset signal line Vref1 by using two configuration as examples.

Figure 21:
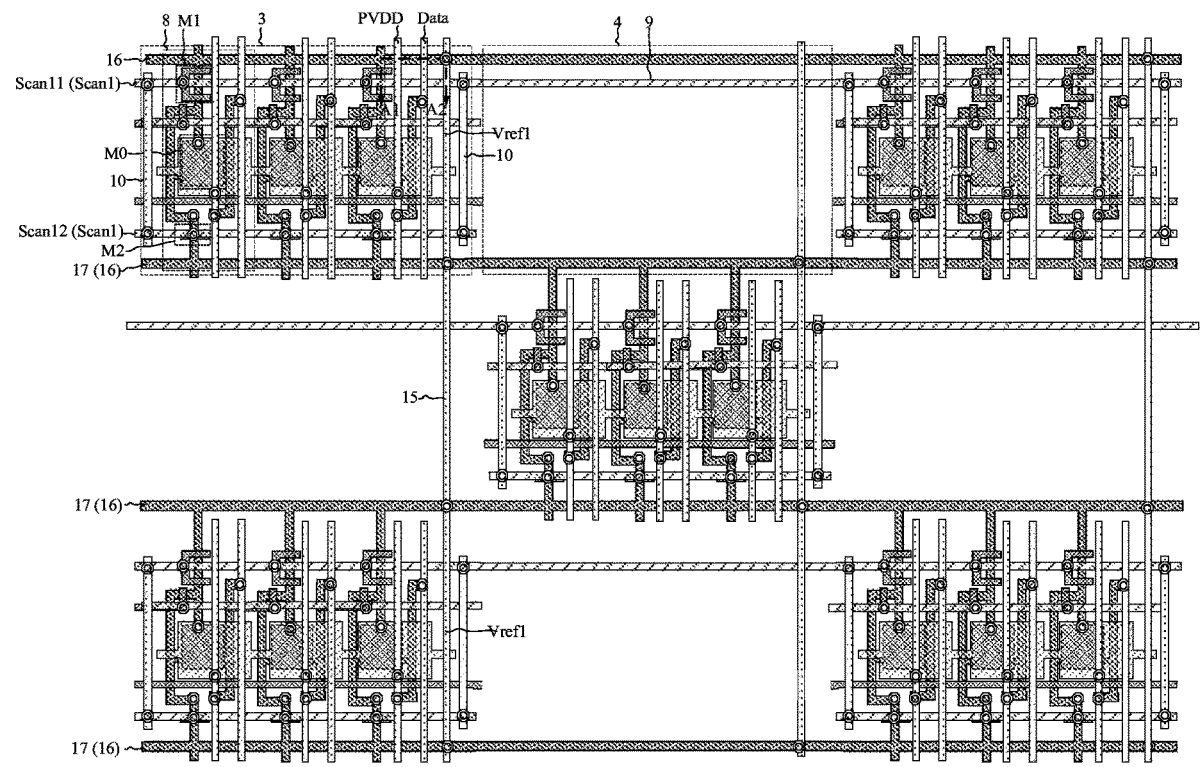
FIG. 21 is a schematic layout diagram corresponding to FIG. 20, according to some embodiments of the present disclosure.

First Configuration:

FIG. 21 is a schematic layout diagram corresponding to FIG. 20. In an embodiment, with reference to the FIG. 20, as shown in FIG. 21, a plurality of first pixel circuits 8 arranged along the first direction are arranged in the pixel region 3, and the first reset signal line Vref1 extends along a second direction. The second direction intersects the first direction. A third connection line 16 and a fourth connection line 17 that extend along the first direction can be provided in the optical component setting region 2. The first electrode of the first reset transistor M1 in the pixel region 3 is electrically connected to the third connection line 16. The third connection line 16 is electrically connected to the first reset signal line Vref1. The first electrode of the second reset transistor M2 in the pixel region 3 is electrically connected to the fourth connection line 17. The fourth connection line 17 is further electrically connected to the first reset signal line Vref1.

For clear illustration, FIG. 20 and FIG. 21 illustrate only the first scanning signal transmission line 9 between the first scanning signal lines Scan1 and the first reset signal transmission line 15 between the first reset signal lines Vref1, and other transmission line between other signal lines, such as power signal lines PVDD or data lines Data will be described in detail in subsequent embodiments.

With such structure, the third connection line 16 can extend at a position close to the first reset transistor M1 so that the third connection line 16 is more easily electrically connected to the first electrode of the first reset transistor M1, and the fourth connection line 17 can extend at a position close to the second reset transistor M2 so that the fourth connection line 17 is more easily electrically connected to the first electrode of the second reset transistor M2. A layout design of this structure is simple and compact, and space utilization is high. Setting positions of the first reset transistor M1 and the second reset transistor M2 in the first pixel circuit 8 can be retained by adjusting a line design, making a design method more flexible.

In an embodiment, to reduce a quantity of connection lines and optimize the layout design, referring to FIG. 20 and FIG. 21 again, a fourth connection line 17 electrically connected to a first pixel circuit 8 in an $i^{th}$ row and a third connection line 16 electrically connected to a first pixel circuit 8 in an $(i+1)^{th}$ row can be reused as one connection line. In this case, the third connection line 16 and the fourth connection line 17 can pass through the light transmission region 4, and extend along the first direction in the entire optical component setting region 2. With such configuration, the first reset signal line Vref1 and the first reset signal transmission line 15 are sequentially connected in the second direction to form one reset line, and the third connection line 16 and the fourth connection line 17 that extend along the first direction and a reset line that extends along the second direction form a grid structure. Such a grid structure reduces overall line load of the reset traces, thereby reducing a voltage drop during transmission of the reset signal on the first reset signal line Vref1. In this way, voltage values obtained when the reset signal is transmitted to the gate of the drive transistor M0 and the first electrode of the organic light-emitting element in the first pixel circuits 8 at different positions tend to be the same, and reset degrees of the drive transistor M0 and the organic light-emitting element 7 in the different first pixel circuits 8 are uniformly reset, and a difference in charging effects of the pixel circuits due to the voltage drop of the reset signal line is avoided, thereby improving a display effect of the display panel.

Figure 22:
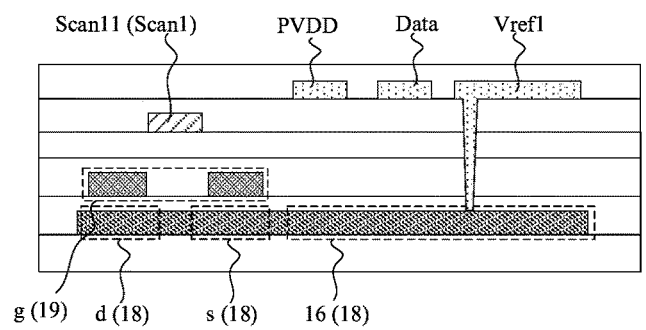
FIG. 22 is a cross-sectional view of FIG. 21 along a direction A1-A2, according to some embodiments of the present disclosure.

In an embodiment, as shown in FIG. 22, the display panel includes a semiconductor layer 18 and a first metal layer 19 that are laminated along a light emitting direction of the display panel, a gate g of the transistors is located in the first metal layer 19, a first electrode of the transistor and a second electrode d of the transistor are located in the semiconductor layer 18, and the third connection line 16 and the fourth connection line 17 are located in the semiconductor layer 18.

Compared with metal materials, semiconductor materials have higher light transmittance. Therefore, forming the third connection line 16 and the fourth connection line 17 by using semiconductor materials can improve light transmittance of the third connection line 16 and the fourth connection line 17, so that some ambient light can be incident to the camera assembly through the third connection line 16 and the fourth connection line 17, thereby improving light transmittance of the optical component setting region, and increasing an amount of light that can be collected by the camera assembly. The third connection line 16 and the fourth connection line 17 are located in the semiconductor layer 18, which can prevent signal lines in the pixel circuit from being concentrated in the metal layer, optimize the layout of the pixel circuit, and reduce space occupied by the pixel circuit, thereby improving space utilization of the display panel.

Figure 23:
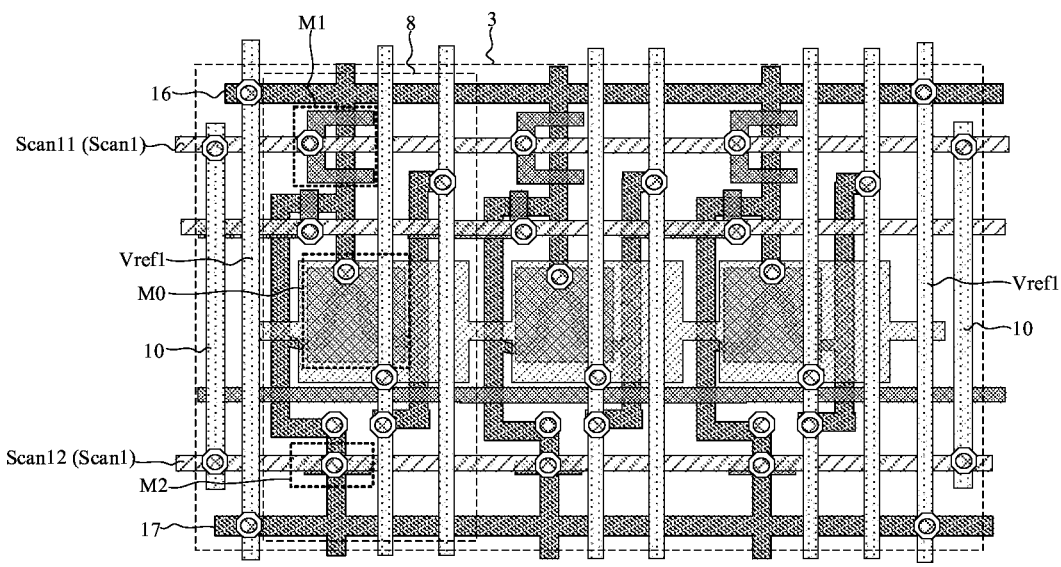
FIG. 23 is another schematic diagram of connections of the first reset transistor and the second reset transistor in the first pixel circuit according to some embodiments of the present disclosure.

In an embodiment, as shown in FIG. 23, in each pixel region 3, the first pixel circuit 8 can be electrically connected to two first reset signal lines Vref1, so that the first reset signal lines Vref1 form a parallel structure, thereby reducing load of the reset line. In an embodiment, the first reset signal line Vref1 can be formed by using a metal material with higher conductivity.

Figure 24:
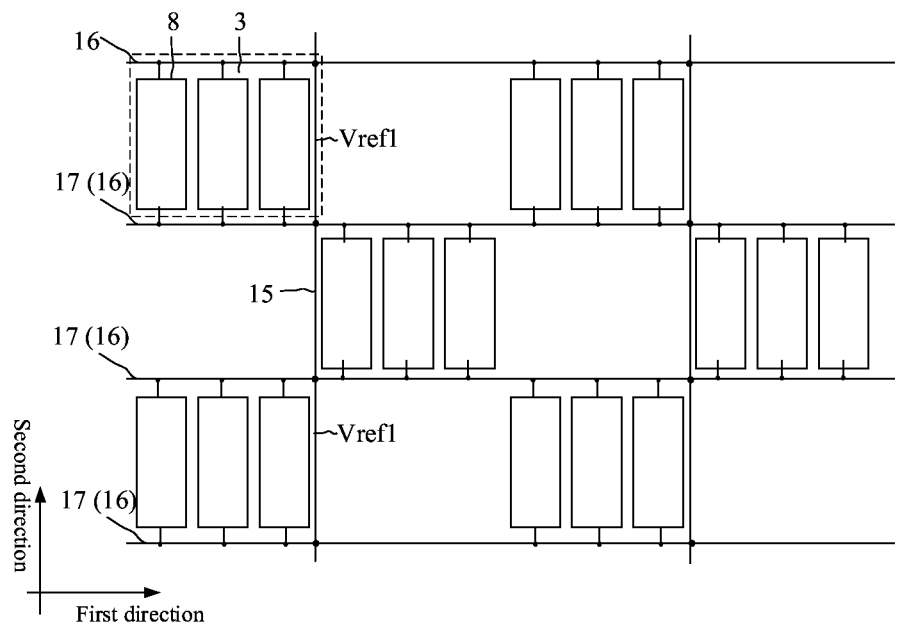
FIG. 24 is another schematic diagram of connections of the first reset transistor and the second reset transistor in the first pixel circuit according to some embodiments of the present disclosure.

In an embodiment, as shown in FIG. 24, the first reset signal line Vref1 and the first reset signal transmission line 15 that are sequentially connected in the second direction form one reset trace, a first pixel circuit 8 in an $i^{th}$ column and a first pixel circuit 8 in an $(i+1)^{th}$ column can be connected to a same reset line, where i is an odd number. In this case, compared with a case in which a first pixel circuit 8 in each column is electrically connected to one reset line, a quantity of reset lines in the optical component setting region 2 is reduced, and a layout design is simpler and more compact.

Figure 25:
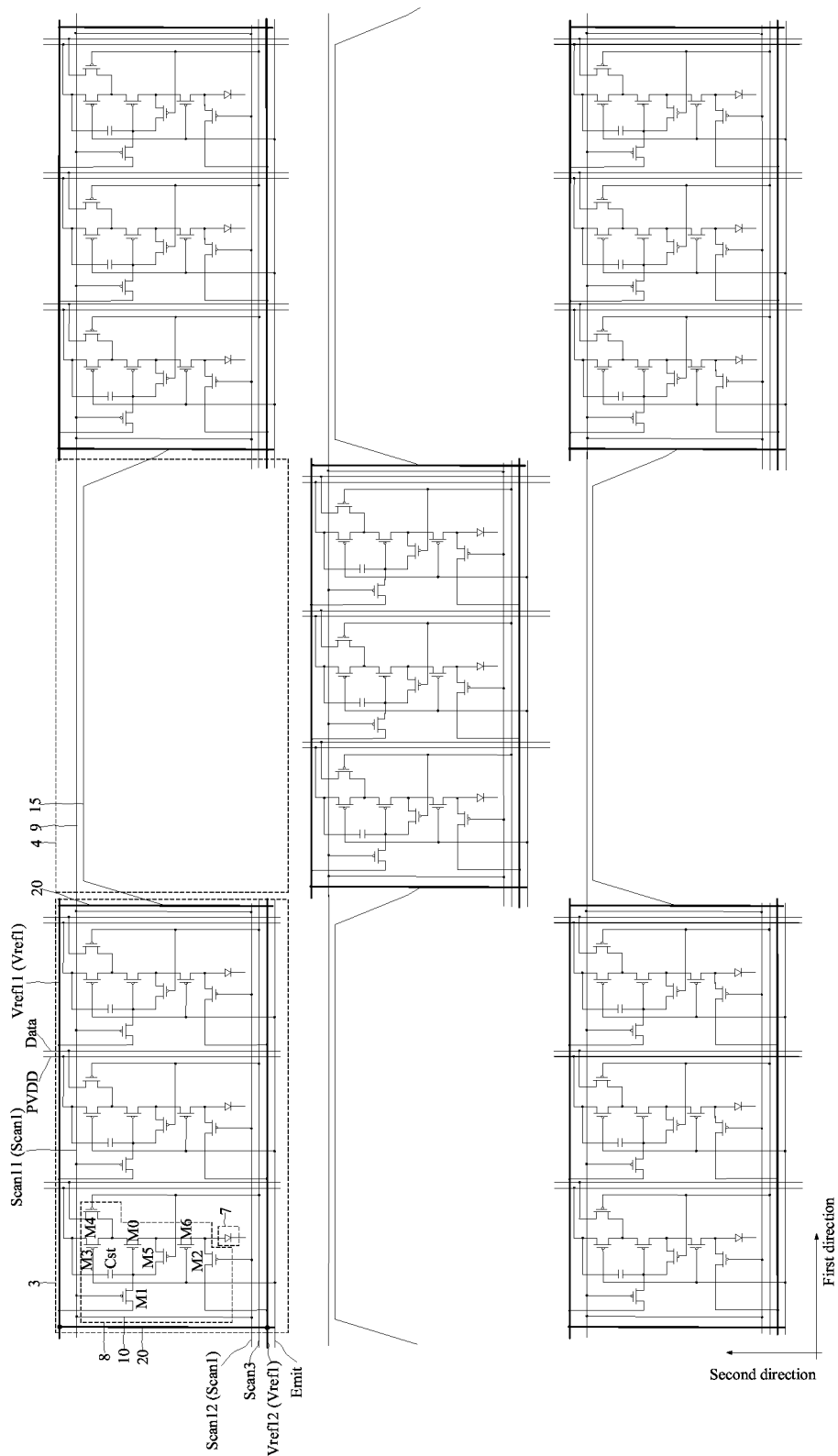
FIG. 25 is another schematic connection diagram of the first reset transistor and the second reset transistor in the first pixel circuit according to some embodiments of the present disclosure.
Figure 26:
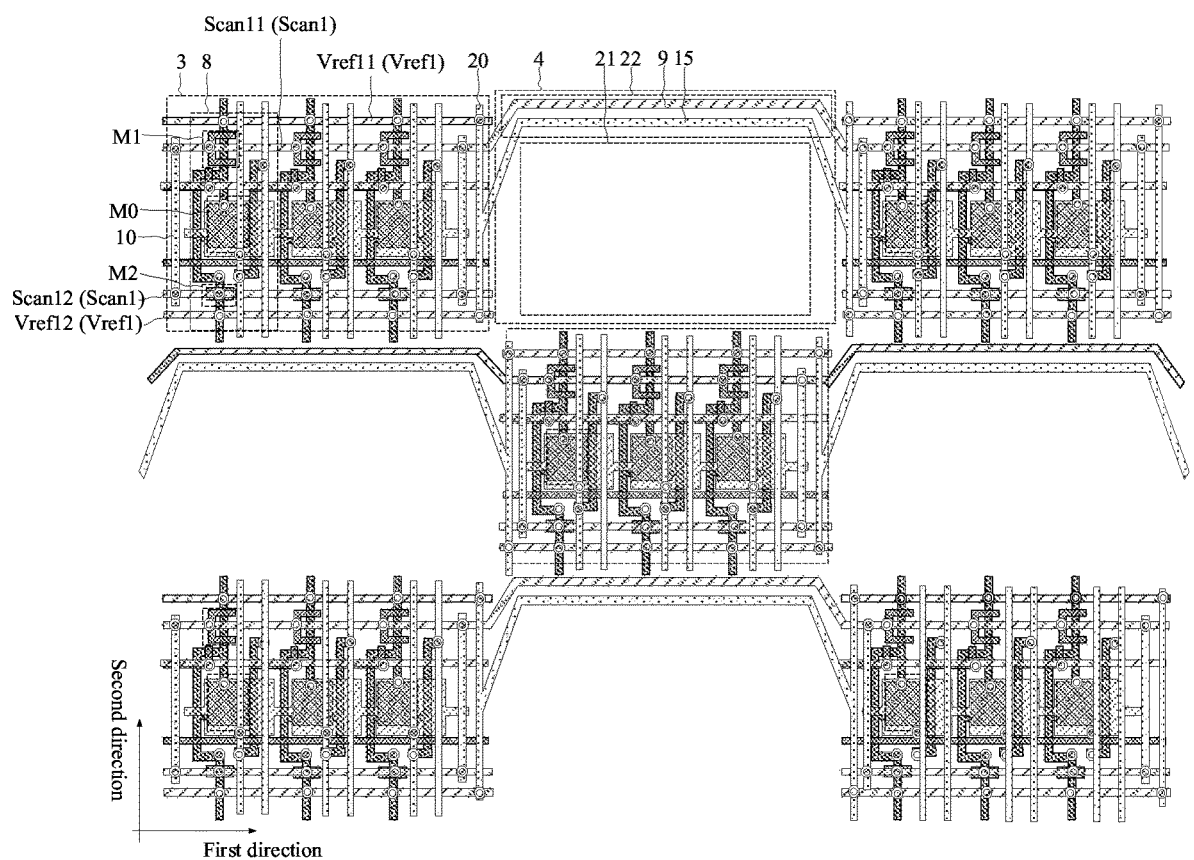
FIG. 26 is a schematic layout diagram corresponding to FIG. 25, according to some embodiments of the present disclosure.

Second Configuration:

In an embodiment, as shown in FIG. 25 and FIG. 26, the first reset signal line Vref1 includes a first reset line segment Vref11 and a second reset line segment Vref12 that are located in the pixel region 3; and the first reset line segment Vref11 is electrically connected to the first electrode of the first reset transistor M1, the second reset line segment Vref12 is electrically connected to the first electrode of the second reset transistor M2, and the second reset line segment Vref12 is electrically connected to the first reset line segment Vref11 through a fifth connection line 20. The first reset line segment Vref11, the second reset line segment Vref12, the first scanning line segment Scan11, and the second scanning line segment Scan12, each of which extends along a same direction, can be arranged in a same layer.

For clear illustration, FIG. 25 and FIG. 26 illustrate only the first scanning signal transmission line 9 between the first scanning signal lines Scan1 and the first reset signal transmission line 15 between the first reset signal lines Vref1, and a transmission line between other signal lines, such as power signal lines PVDD or data lines Data is to be described in detail in subsequent embodiments.

With such configuration, the first reset line segment Vref11 extends at a position close to the first reset transistor M1, and the second reset line segment Vref12 extends at a position close to the second reset transistor M2, so that the first reset line segment Vref11 is more easily electrically connected to the first electrode of the first reset transistor M1, and the second reset line segment Vref12 is more easily electrically connected to the first electrode of the second reset transistor M2, thereby reducing difficulty of connecting the first reset signal line Vref1 to the first reset transistor M1 and the second reset transistor M2.

In an embodiment, when the first reset signal line Vref1 includes the first reset line segment Vref11 and the second reset line segment Vref12, and the second reset line segment Vref12 and the first reset line segment Vref11 are electrically connected to each other through the fifth connection line 20, the first reset signal transmission line 15 can be directly connected to the first reset line segment Vref11, or can be directly connected to the second reset line segment Vref12, or can be directly connected to the fifth connection line 20, so that the first reset signal transmission line 15 is electrically connected to the first reset signal line Vref1.

The first reset signal transmission line 15 is arranged in a same layer as the first reset line segment Vref11 directly connected to the first reset signal transmission line 15, the second reset line segment Vref12 directly connected to the first reset signal transmission line 15, or the fifth connection line 20 directly connected to the first reset signal transmission line 15. For example, referring to FIG. 25 and FIG. 26 again, first reset signal transmission lines 15 on two sides of the pixel region 3 in the first direction are both directly connected to the fifth connection line 20 in the pixel region 3, and the first reset signal transmission line 15 and the fifth connection line 20 are arranged in a same layer.

The first reset signal transmission line 15 is arranged in the same layer as the first reset line segment Vref11 directly connected thereto, the second reset line segment Vref12 directly connected thereto, or the fifth connection line 20 directly connected to the first reset signal transmission line 15, and the first reset signal transmission line 15 is formed by using a same patterning process as the first reset line segment Vref11 directly connected to the first reset signal transmission line 15, the second reset line segment Vref12 directly connected to the first reset signal transmission line 15, or the fifth connection line 20 directly connected to the first reset signal transmission line 15, to achieve mutual communication, thereby making the connection more reliable, and avoiding a case of disconnection caused by discontinuity in a metal material in a connection via hole. In addition, an opaque area in the optical component setting region can be reduced by omitting an additional via hole, improving light transmittance.

In an embodiment, referring to FIG. 26 again, the light transmission region 4 includes a first primary light transmission region 21 and a first secondary light transmission region 22 that are arranged along a second direction, and the first reset signal transmission line 15 and the first scanning signal transmission line 9 at least partially extend within the first secondary light transmission region 22.

If the light transmission region 4 is split into several scattered light transmission regions by the first reset signal transmission line 15 and the first scanning signal transmission line 9 that penetrate through the light transmission region 4, external ambient light is likely to be diffracted between traces or at an edge of a trace when the external ambient light is incident to the light transmission region 4. With such configuration, the first reset signal transmission line 15 and the first scanning signal transmission line 9 are centrally provided and extended in a partial region of the light transmission region 4, thereby centralizing regions blocked and not blocked by the traces in the light transmission region 4, and effectively alleviating a diffraction phenomenon.

In an embodiment, when the first reset signal transmission line 15 and the first scanning signal transmission line 9 are centrally extended in the first secondary light transmission region 22, a shading portion can be further provided in the first secondary light transmission region 22. The shading portion is used to fully cover the first secondary light transmission region 22, or to cover a gap between the first reset signal transmission line 15 and the first scanning signal transmission line 9 in the first secondary light transmission region 22, to eliminate diffraction.

Figure 27:
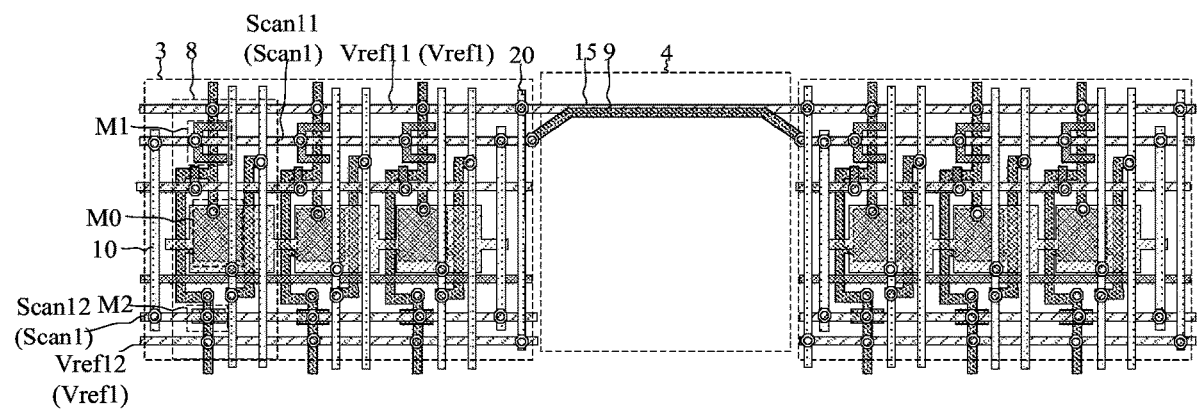
FIG. 27 is another schematic diagram of the first scanning signal transmission line and a first reset signal transmission line according to some embodiments of the present disclosure.

In an embodiment, as shown in FIG. 27, the first reset signal transmission line 15 and the first scanning signal transmission line 9 are arranged in different layers; in a direction perpendicular to a plane of the display panel, a projection of the first reset signal transmission line 15 at least partially overlaps a projection of the first scanning signal transmission line 9, thereby reducing an overall shielding degree of the first reset signal transmission line 15 and the first scanning signal transmission line 9 to the light transmission region 4, increasing an area of a region not shielded by the lines in the light transmission region 4, and improving light transmittance of the optical component setting region 2. In an embodiment, in the direction perpendicular to the plane of the display panel, a gap between projections of at least two of a plurality of signal lines in the light transmission region 4 can be set to be at least partially covered by a projection of a third signal line, that is, the signal lines cover and shield each other, to eliminate or alleviate a light diffraction problem caused by a line gap, and improve an imaging effect of an optical component. It can be understood that, any line that can transmit a signal can be define as a signal line.

Figure 28:
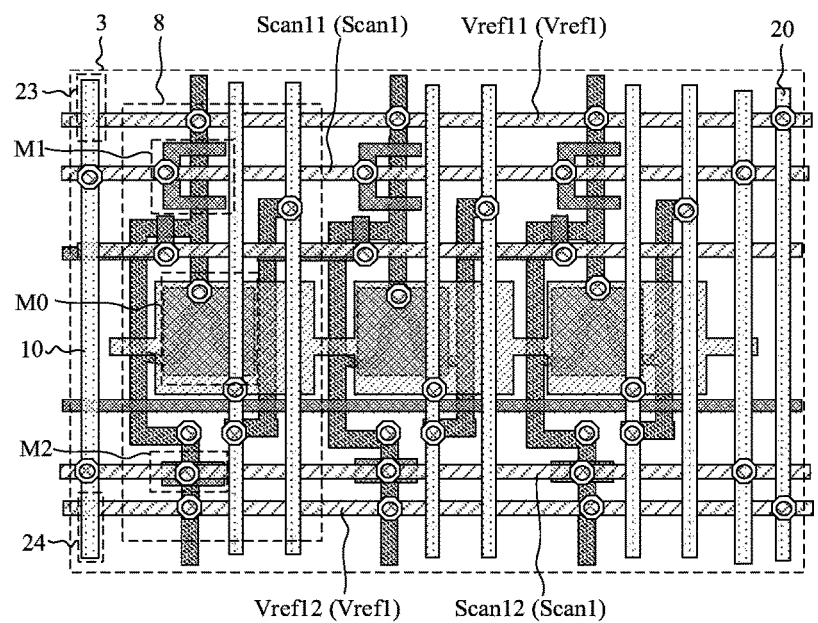
FIG. 28 is a schematic diagram of a first connection line according to some embodiments of the present disclosure.

In an embodiment, as shown in FIG. 28, the first connection line 10 includes a first end portion 23 and a second end portion 24. In a direction perpendicular to the plane of the display panel, a projection of the first end portion 23 is located at a side of a projection of the first scanning line segment Scan11 away from a projection of the second scanning line segment Scan12. A projection of the second end portion 24 is located at a side of the projection of the second scanning line segment Scan12 away from the projection of the first scanning line segment Scan11. In the direction perpendicular to the plane of the display panel, the projection of the first end portion 23 overlaps a projection of the first reset line segment Vref11, and/or the projection of the second end portion 24 overlaps a projection of the second reset line segment Vref12.

With reference to the FIG. 17, with the configuration of the first scanning signal line Scan1, the first scanning line segment Scan11 and the second scanning line segment Scan12 can be connected in parallel through the first connection line 10, so that overall line load of the first scanning signal line Scan1 is reduced, and there is a difference between the load of the first scanning signal line Scan1 and load of the fourth scanning signal line Scan4 in the primary display region 11. Therefore, by increasing an extending length of the first connection line 10, the first end portion 23 of the first connection line 10 overlaps the first reset line segment Vref11 and/or the second end portion 24 of the first connection line 10 overlap the second reset line segment Vref12, so that a coupling capacitance is formed between the first end portion 23 and the first reset line segment Vref11 and/or between the second end portion 24 and the second reset line segment Vref12. The coupling capacitance can compensate a load difference between the first scanning signal line Scan1 and the fourth scanning signal line Scan4, thereby making voltage drops of scanning signals transmitted in the primary display region 11 and the optical component setting region 2 tend to be the same.

Figure 29:
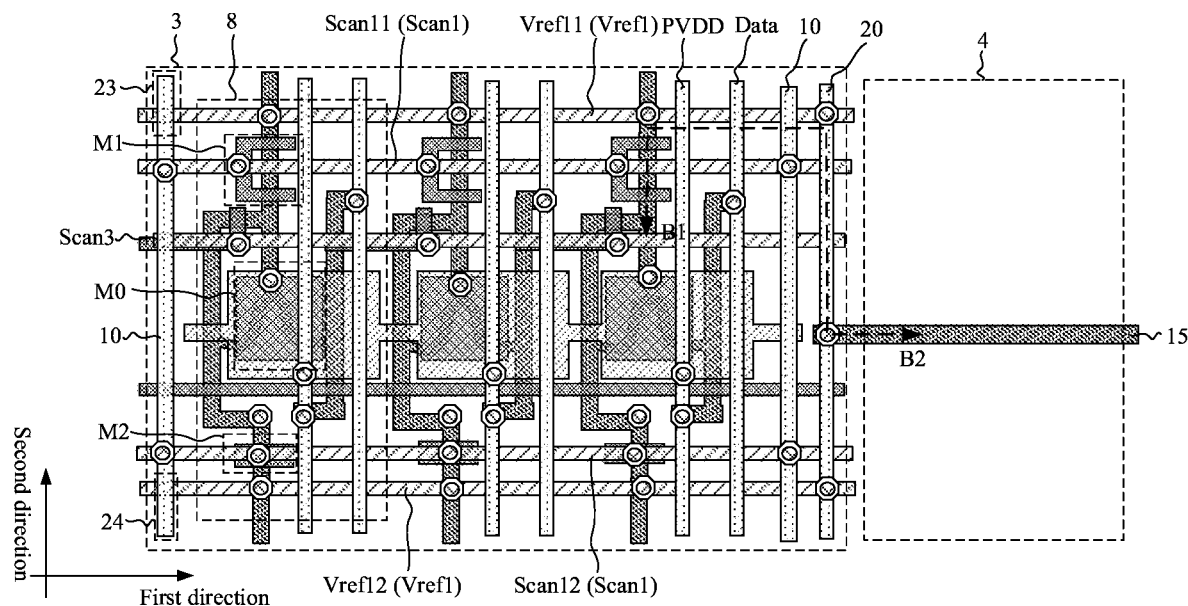
FIG. 29 is a schematic diagram of a layer position of the first reset signal transmission line according to some embodiments of the present disclosure.
Figure 30:
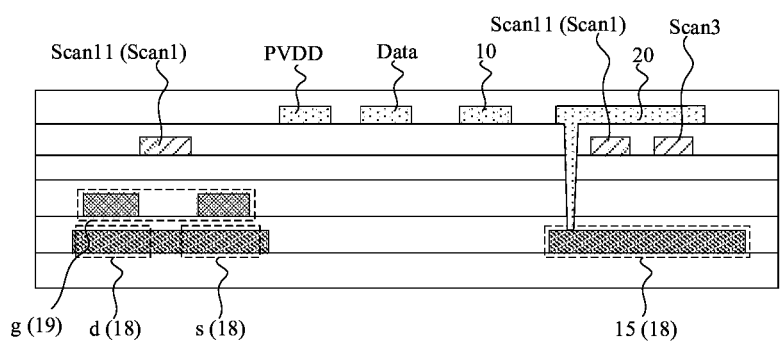
FIG. 30 is a cross-sectional view of FIG. 29 along a direction B1-B2, according to some embodiments of the present disclosure.

In an embodiment, as shown in FIG. 29 and FIG. 30, the display panel includes a semiconductor layer 18 and a first metal layer 19, a gate g of the transistor is located in the first metal layer 19, a first electrode s of the transistor and a second electrode d of the transistor are located in the semiconductor layer 18, and the first reset signal transmission line 15 is located in the semiconductor layer 18.

Compared with the first reset signal transmission line 15 being formed by using a metal material, the first reset signal transmission line 15 is located in the semiconductor layer 18, which increases light transmittance of the first reset signal transmission line 15, and reduces a shielding degree of the first reset signal transmission line 15 to the light transmission region 4, thereby enabling a larger amount of external ambient light to be incident to the camera assembly through the optical component setting region 2.

Figure 31:
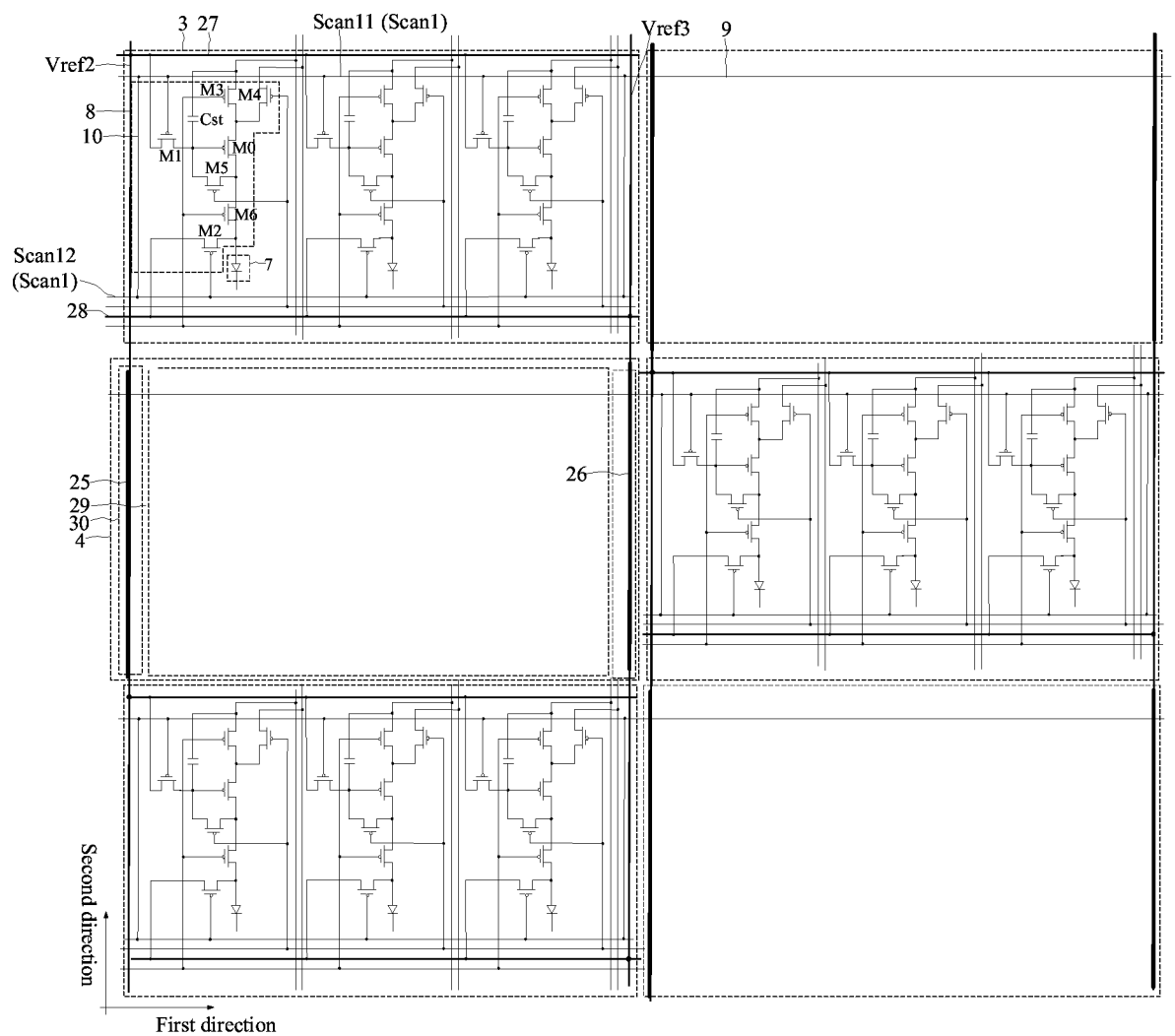
FIG. 31 is another schematic diagram of connections of the first reset transistor and the second reset transistor in the first pixel circuit according to some embodiments of the present disclosure.

In an embodiment, as shown in FIG. 31, a first electrode of the first reset transistor M1 in the pixel region 3 is electrically connected to a second reset signal line Vref2. Second reset signal lines Vref2 connected to first pixel circuits 8 in two adjacent pixel regions 3 are electrically connected through a second reset signal transmission line 25. The second reset signal line Vref2 is connected to a first voltage end (not shown in the figure). A first electrode of the second reset transistor M2 in the pixel region 3 is electrically connected to a third reset signal line Vref3. Third reset signal lines Vref3 connected to the first pixel circuits 8 in the two adjacent pixel regions 3 are electrically connected through a third reset signal transmission line 26. The third reset signal line Vref3 is connected to a second voltage end (not shown in the figure).

The first voltage end and the second voltage end are configured to provide different reset signals. In an embodiment of the present disclosure, a voltage of a reset signal provided by the second voltage end is smaller than a voltage of a reset signal provided by the first voltage end.

With the foregoing configuration, the first electrode of the first reset transistor M1 and the first electrode of the second reset transistor M2 are electrically connected to different reset signal lines respectively. The first reset transistor M1 and the second reset transistor M2 respectively transmit different reset signals, to reset the gate of the drive transistor M0 and the first electrode of the organic light-emitting element 7, respectively. Because the voltage of the reset signal received by the second reset transistor M2 is relatively low, a relatively low reset potential can be provided to the first electrode (for example, an anode) of the organic light-emitting element 7, to avoid raising a voltage of the first electrode of the organic light-emitting element 7 due to impact of a leakage current during a non-light-emitting time period, so that a potential difference between the first electrode and the second electrode of the organic light-emitting element 7 reaches a condition for driving the organic light-emitting element 7 to emit light. A relatively low reset signal voltage can ensure that the organic light-emitting element 7 does not emit light during the non-light-emitting time period, thereby effectively alleviating unexpected illumination of pixels. Because the voltage of the reset signal received by the second reset transistor M2 is slightly higher, an excessively low reset signal can be prevented from being written into the gate of the drive transistor M0. In this way, after the gate of the drive transistor M0 is reset, a data signal can be written into the gate of the drive transistor M0 on the basis of a slightly higher low level potential, so that a voltage difference between an initial potential of the gate of the drive transistor M0 and the data signal to be written is reduced, thereby allowing the data signal to be written more fully during a charging period.

The following describes structures of the second reset signal line Vref2 and the third reset signal line Vref3 with two configuration as examples.

Figure 32:
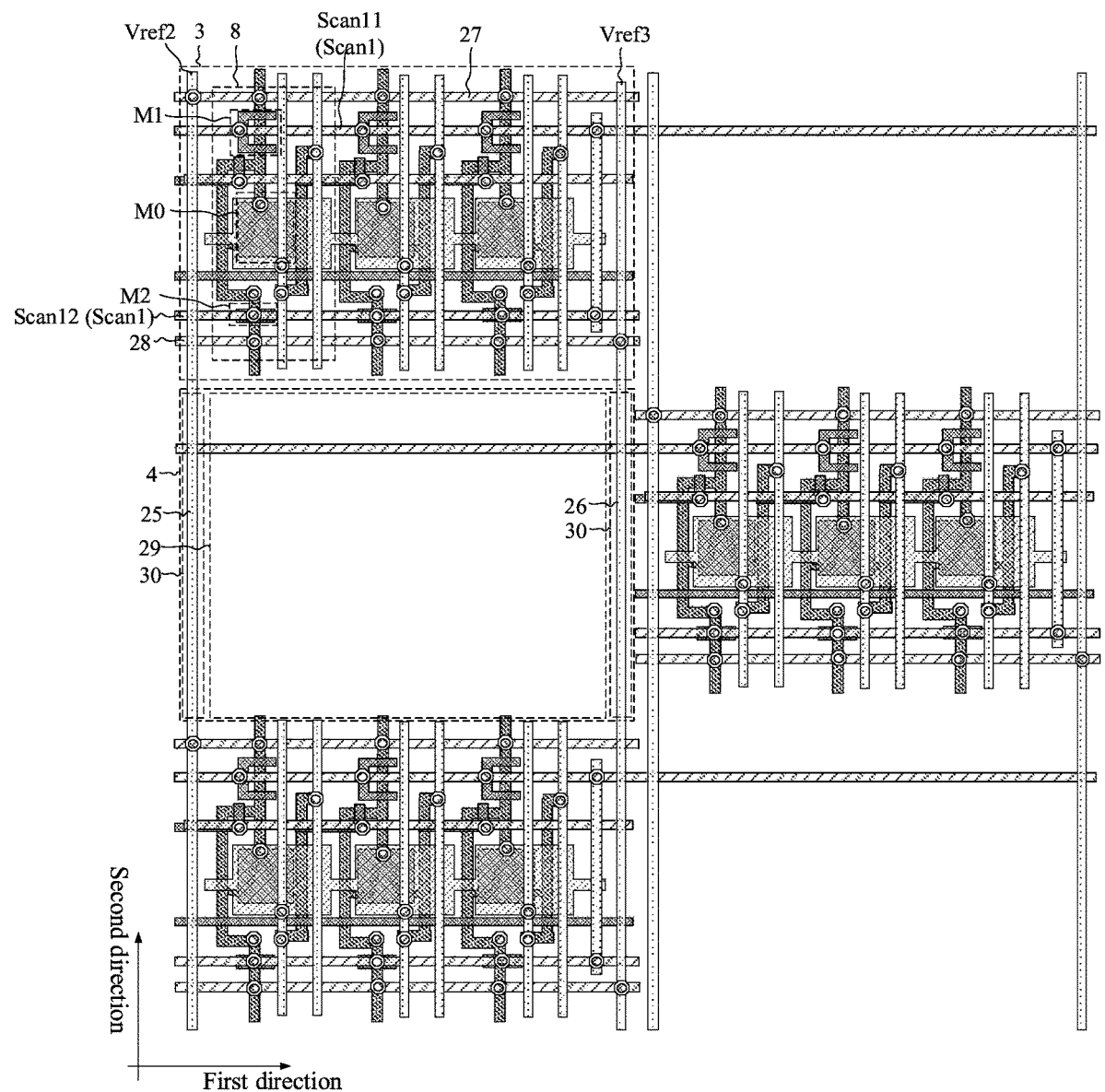
FIG. 32 is a schematic layout diagram corresponding to FIG. 31, according to some embodiments of the present disclosure.

First Configuration:

With reference to the FIG. 31 and FIG. 32, the pixel region 3 includes a plurality of first pixel circuits 8 arranged along the first direction. The second reset signal line Vref2 and the third reset signal line Vref3 extend along a second direction. The second direction intersects the first direction. The optical component setting region 2 further includes a sixth connection line 27 and a seventh connection line 28 that extend along the first direction. The first electrode of the first reset transistor M1 in the pixel region 3 is electrically connected to the sixth connection line 27. The sixth connection line 27 is also electrically connected to the second reset signal line Vref2. The first electrode of the second reset transistor M2 in the pixel region 3 is electrically connected to the seventh connection line 28. The seventh connection line 28 is also electrically connected to the third reset signal line Vref3.

For clear illustration, FIG. 31 and FIG. 32 illustrate only the first scanning signal transmission line 9 between the first scanning signal lines Scan1, the second reset signal transmission line 25 between the second reset signal lines Vref2, and the third reset signal transmission line 26 between the third reset signal lines Vref3, and a transmission line between other signal lines, such as power signal lines PVDD or data lines Data will be described in detail in subsequent embodiments.

With such structure, the sixth connection line 27 can extend at a position close to the first reset transistor M1 so that the sixth connection line 27 is more easily electrically connected to the first electrode of the first reset transistor M1, and the seventh connection line 28 can extend at a position close to the second reset transistor M2 so that the seventh connection line 27 is more easily electrically connected to the first electrode of the second reset transistor M2. A layout design of this structure is simple and compact, and space utilization is high. In addition, setting positions of the first reset transistor M1 and the second reset transistor M2 in the first pixel circuit 8 can be retained by adjusting the line design, making a design method more flexible.

Figure 33:
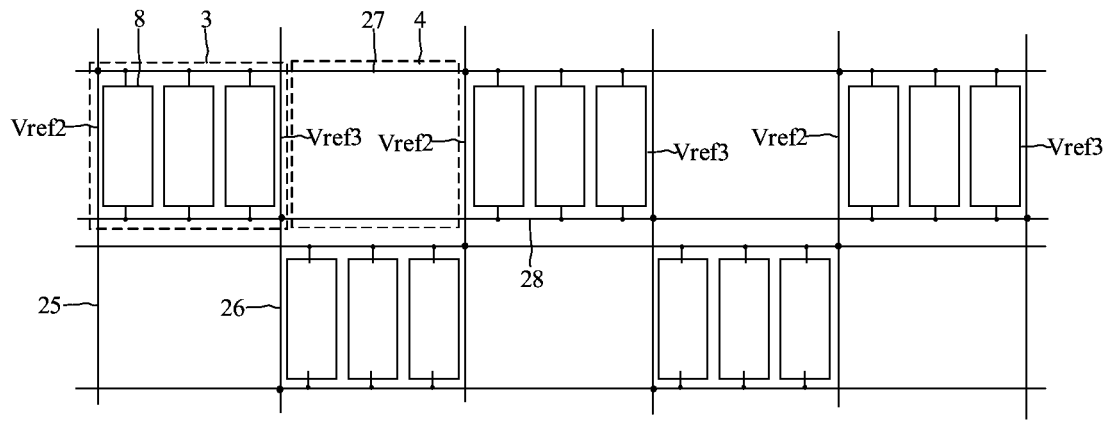
FIG. 33 is another schematic connection diagram of the first reset transistor and the second reset transistor in the first pixel circuit according to some embodiments of the present disclosure.

In an embodiment, the second reset signal line Vref2 and the second reset signal transmission line 25 that are sequentially connected in the second direction form a first reset trace, and the third reset signal line Vref3 and the third reset signal transmission line 26 that are sequentially connected in the second direction form one second reset trace. FIG. 33 is yet another schematic connection diagram of the first reset transistor M1 and the second reset transistor M2 in the first pixel circuit 8 according to some embodiments of the present disclosure. The sixth connection line 27 and the seventh connection line 28 can pass through the light transmission region 4, and extend along the first direction in the entire optical component setting region 2. In this case, the sixth connection line 27 extending along the first direction and the first reset trace extending along the second direction form a grid structure, and the seventh connection line 28 extending along the first direction and the second reset trace extending along the second direction form a grid structure. Such a grid structure reduces line load of the reset traces, thereby reducing a voltage drop during transmission of the reset signal.

Referring to FIG. 33 again, to further reduce a quantity of reset signal lines, a first pixel circuit 8 in an $i^{th}$ column and a first pixel circuit 8 in an $(i+1)^{th}$ column are connected to a same first reset trace. The first pixel circuit 8 in the $i^{th}$ column and a first pixel circuit 8 in an $(i-1)^{th}$ column are connected to a same second reset trace, and i is an even number.

Figure 34:
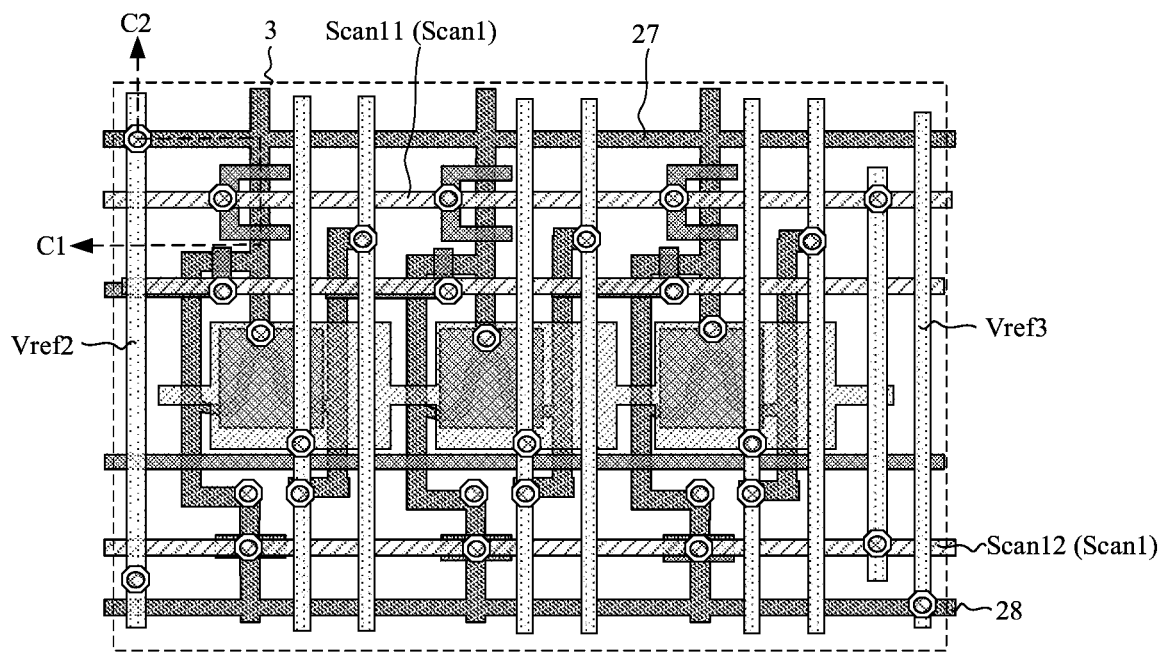
FIG. 34 is a schematic diagram of layer positions of a sixth connection line and a seventh connection line according to some embodiments of the present disclosure.
Figure 35:
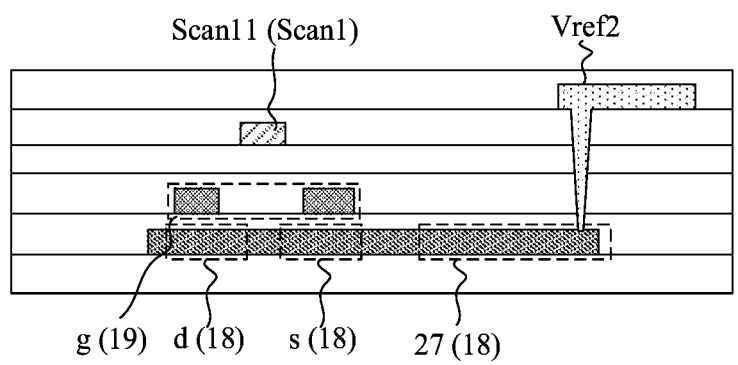
FIG. 35 is a cross-sectional view of FIG. 34 along a direction C1-C2, according to some embodiments of the present disclosure.

In an embodiment, as shown in FIG. 34 and FIG. 35, the display panel includes a semiconductor layer 18, a first electrode of the transistor and a second electrode of the transistor are located in the semiconductor layer 18. The sixth connection line 27 and the seventh connection line 28 are located in the semiconductor layer 18, so that light transmittance of the sixth connection line 27 and the seventh connection line 28 is improved, and some ambient light can be incident to the camera assembly through the sixth connection line 27 and the seventh connection line 28, thereby increasing an amount of light that can be collected by the camera assembly.

In an embodiment, referring to FIG. 31 and FIG. 32 again, the pixel region 3 includes x first pixel circuits 8 arranged along the first direction. The second reset signal line Vref2 is located at a side of a $1^{st}$ first pixel circuit 8 away from a $2^{nd}$ first pixel circuit 8. The third reset signal line Vref3 is located at a side of an $x^{th}$ first pixel circuit 8 away from an $(x-1)^{th}$ first pixel circuit 8.

The light transmission region 4 can include a second primary light transmission region 29 and two second secondary light transmission regions 30. One second secondary light transmission region 30, the second primary light transmission region 29, and the other second secondary light transmission region 30 are arranged along the first direction. The second reset signal transmission line 25 at least partially extends within the second secondary light transmission region 30. The third reset signal transmission line 26 at least partially extends within the second secondary light transmission region 30. In this case, the second reset signal transmission line 25 and the third reset signal transmission line 26 respectively extend on two sides of the light transmission region 4, so that regions not blocked by traces in the light transmission region 4 are centralized, thereby alleviating a diffraction phenomenon caused by external ambient light incident to the light transmission region 4, and improving a light transmission effect.

Figure 36:
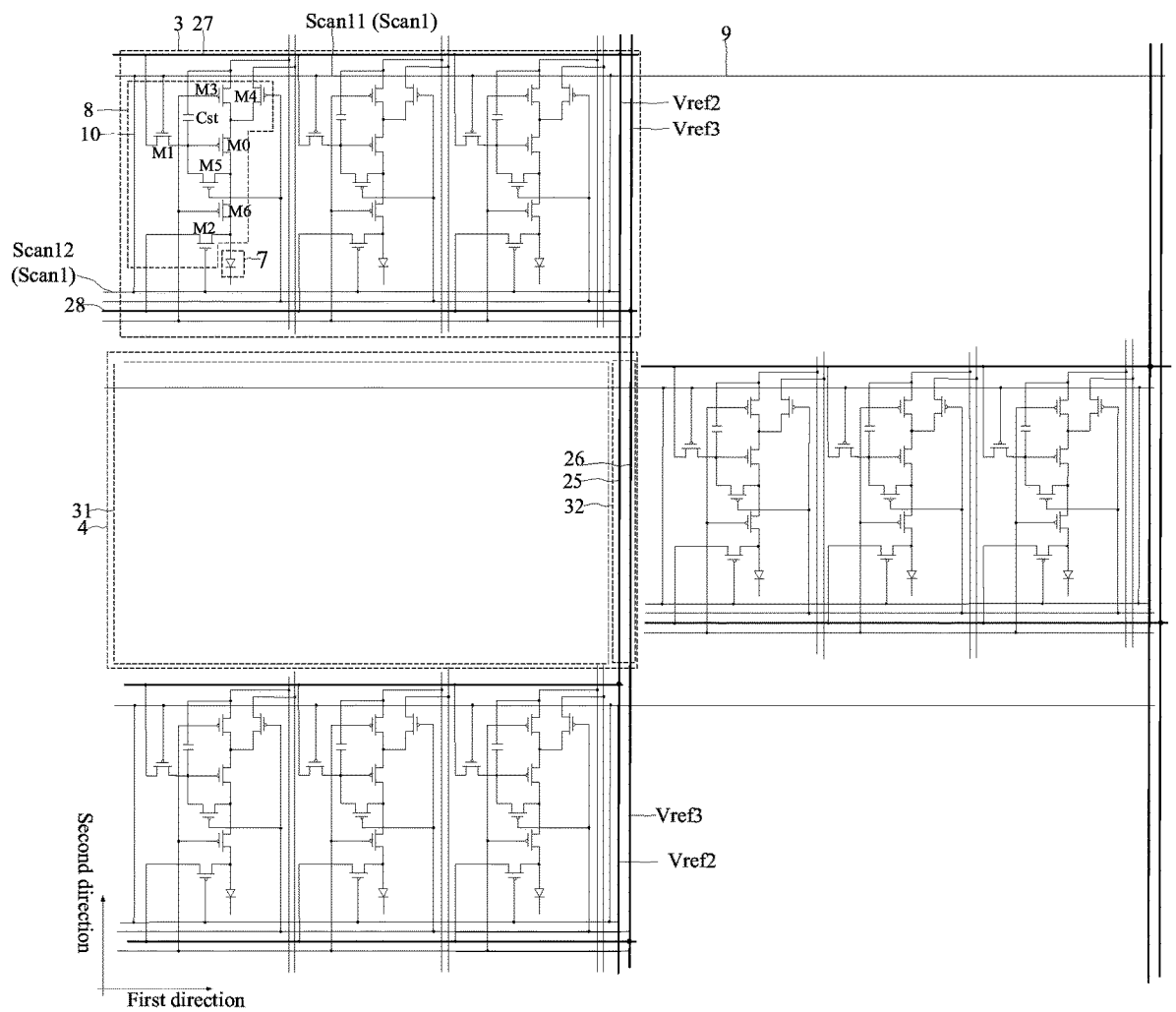
FIG. 36 is another schematic diagram of connections of the first reset transistor and the second reset transistor in the first pixel circuit according to some embodiments of the present disclosure.
Figure 37:
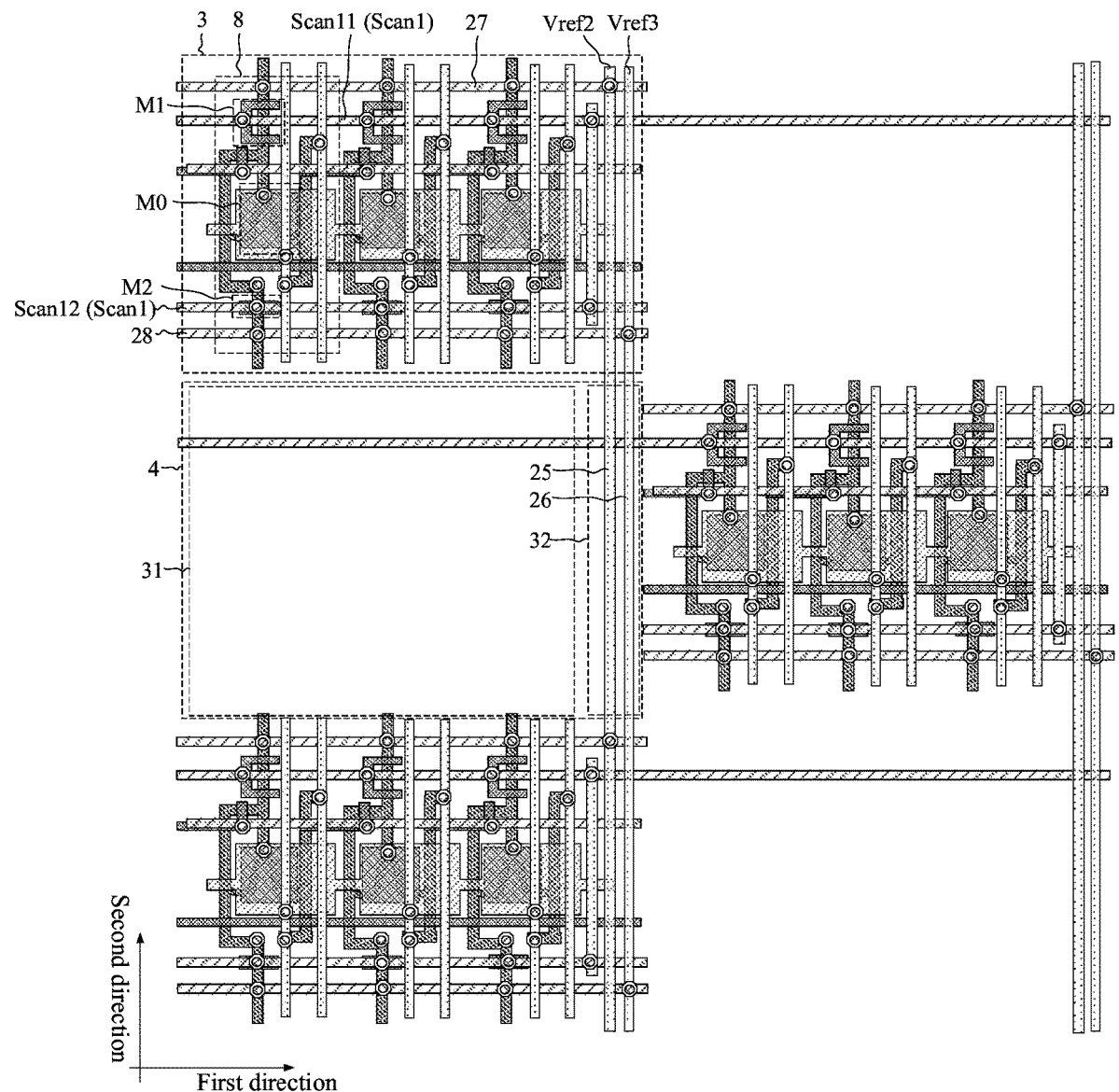
FIG. 37 is a schematic layout diagram corresponding to FIG. 36, according to some embodiments of the present disclosure.

In an embodiment, as shown in FIG. 36 and FIG. 37, the pixel region 3 includes x first pixel circuits 8 arranged along the first direction. The light transmission region 4 includes a third primary light transmission region 31 and a third secondary light transmission region 32. The third primary light transmission region 31 and the third secondary light transmission region 32 are arranged along the first direction. The second reset signal transmission line 25 and the third reset signal transmission line 26 at least partially extend within the third secondary light transmission region 32.

The second reset signal line Vref2 and the third reset signal line Vref3 are located at a side of a $1^{st}$ first pixel circuit 8 away from a $2^{nd}$ first pixel circuit 8. A direction from the third secondary light transmission region 32 to the third primary light transmission region 31 is the same as a direction from the $1^{st}$ first pixel circuit 8 to the $2^{nd}$ first pixel circuit 8. In an embodiment, the second reset signal line Vref2 and the third reset signal line Vref3 are located at a side of an $x^{th}$ first pixel circuit 8 away from an $(x-1)^{th}$ first pixel circuit 8, where x is a positive integer greater than or equal to 2. A direction from the third secondary light transmission region 32 to the third primary light transmission region 31 is opposite to a direction from a $1^{st}$ first pixel circuit 8 to a $2^{nd}$ first pixel circuit 8.

With such configuration, the second reset signal transmission line 25 and the third reset signal transmission line 26 both extend on the same side of the light transmission region 4, thereby centralizing regions blocked and not blocked by the traces in the light transmission region 4, and effectively alleviating a diffraction phenomenon when external ambient light is incident to the light transmission region 4. A shading portion can be further provided in the third secondary light transmission region 32. The shading portion is used to cover the third secondary light transmission region 32, or to cover a gap between the second reset signal transmission line 25 and the third reset signal transmission line 26, to eliminate diffraction. In an embodiment, the second reset signal line Vref2 and the third reset signal line Vref3 extend at the same side as the second reset signal transmission line 25 and the third reset signal transmission line 26, and a length of a reset line formed by a reset signal line and a reset signal transmission line can be reduced, thereby reducing a voltage drop of a reset signal during transmission.

Figure 38:
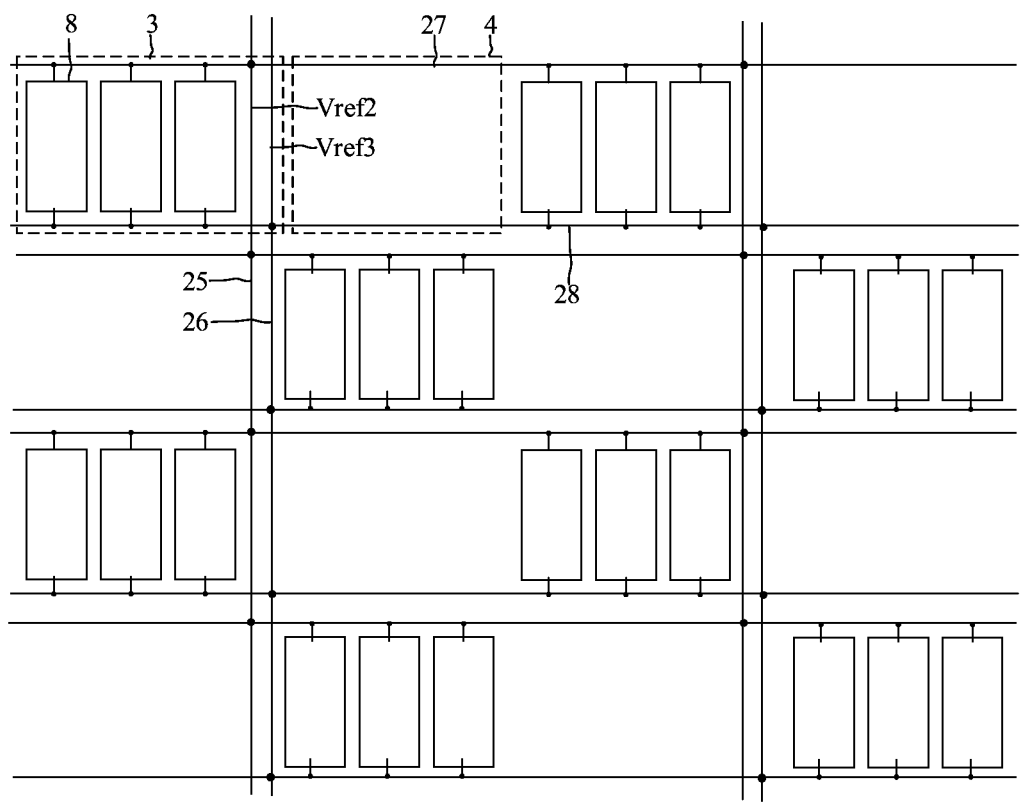
FIG. 38 is another schematic diagram of connections of the first reset transistor and the second reset transistor in the first pixel circuit according to some embodiments of the present disclosure.

The second reset signal line Vref2 and the second reset signal transmission line 25 that are sequentially connected in the second direction form one first reset line, and the third reset signal line Vref3 and the third reset signal transmission line 26 that are sequentially connected in the second direction form one second reset trace. FIG. 38 is yet another schematic connection diagram of the first reset transistor M1 and the second reset transistor M2 in the first pixel circuit 8 according to some embodiments of the present disclosure. The sixth connection line 27 and the seventh connection line 28 can pass through the light transmission region 4. In this case, the sixth connection line 27 extending along the first direction and the first reset trace extending along the second direction form a grid structure, and the seventh connection line 28 extending along the first direction and the second reset trace extending along the second direction form a grid structure. Such a grid structure reduces line load of the reset traces, thereby reducing a voltage drop during transmission of the reset signal.

In an embodiment, referring to FIG. 38 again, to reduce a quantity of reset lines, a first pixel circuit 8 in an $i^{th}$ column and a first pixel circuit 8 in an $(i+1)^{th}$ column are connected to a same first reset trace, and the first pixel circuit 8 in the $i^{th}$ column and the first pixel circuit 8 in the $(i+1)^{th}$ column are connected to a same second reset trace, where i is an odd number.

Figure 39:
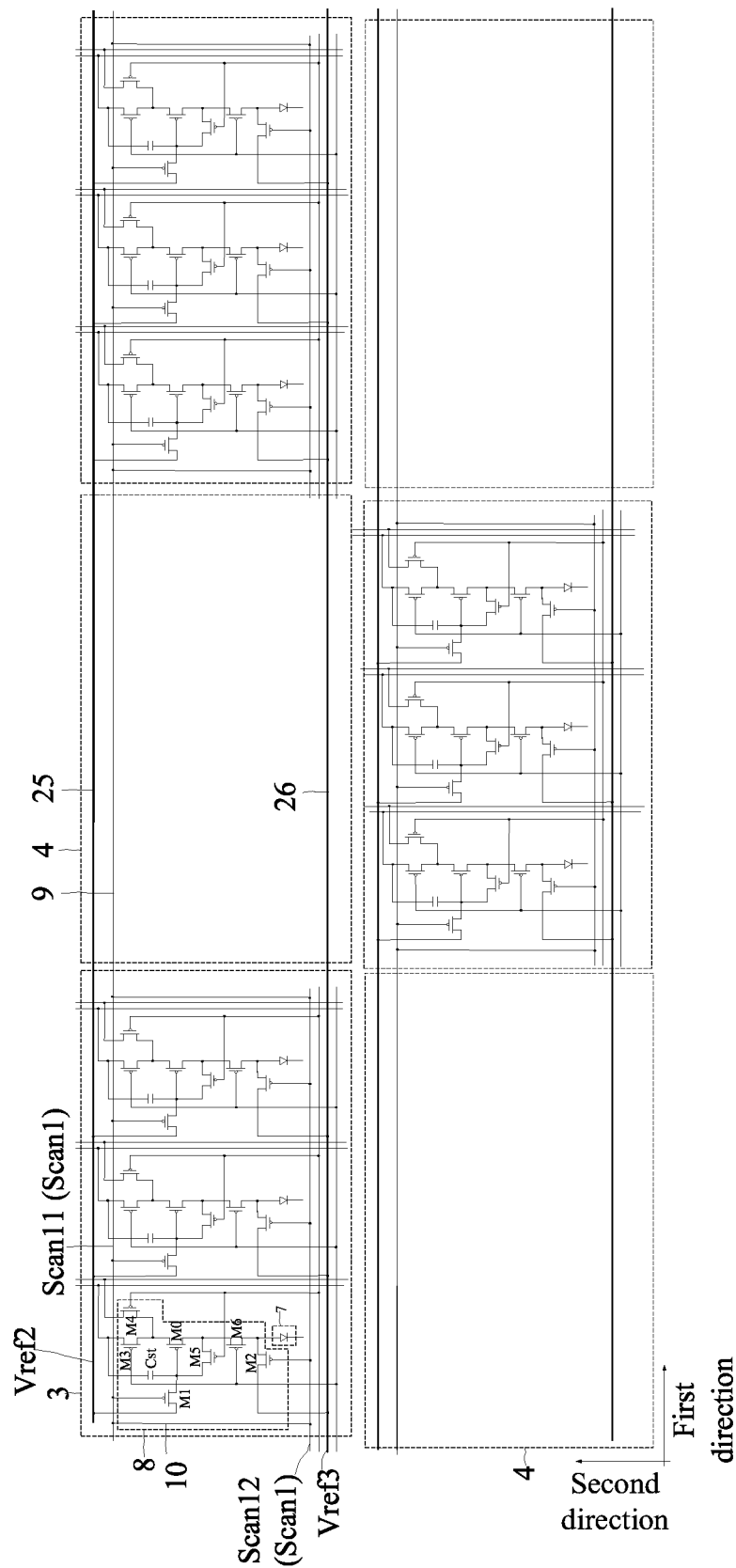
FIG. 39 is another schematic diagram of connections of the first reset transistor and the second reset transistor in the first pixel circuit according to some embodiments of the present disclosure.
Figure 40:
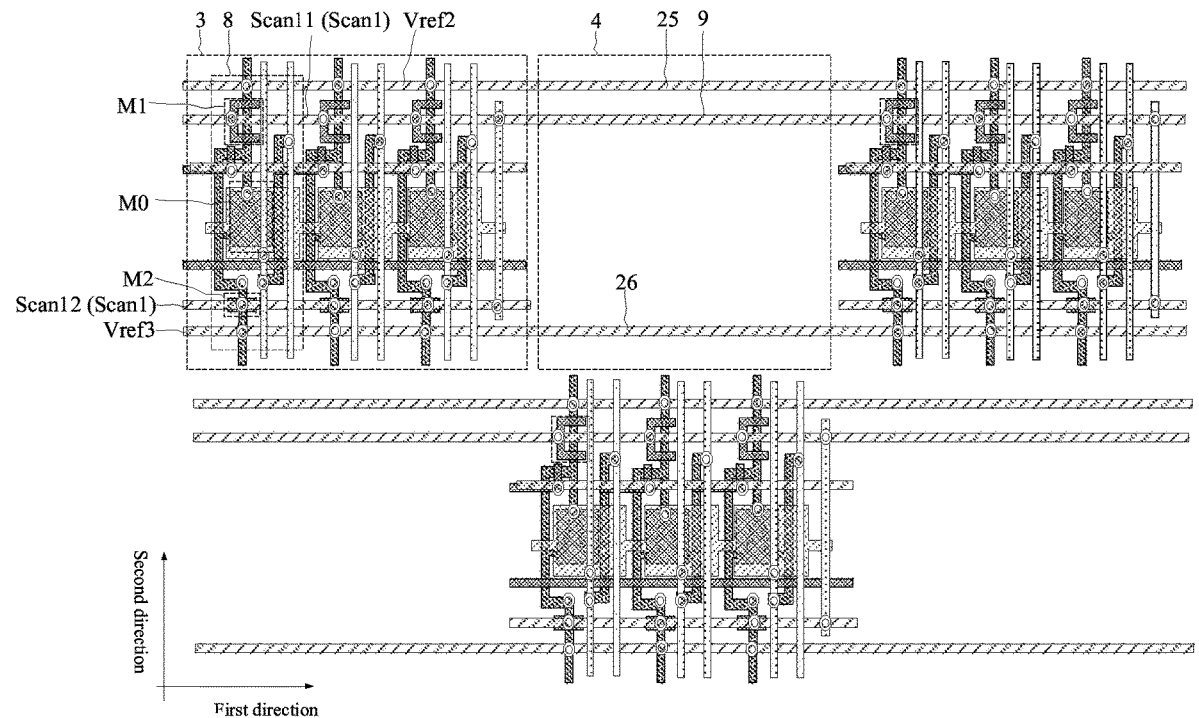
FIG. 40 is a schematic layout diagram corresponding to FIG. 39, according to some embodiments of the present disclosure.

Second Configuration:

As shown in FIG. 39 and FIG. 40, the second reset signal line Vref2 and the third reset signal line Vref3 separately extend along the first direction within the pixel region 3. In an embodiment, as shown in FIG. 39 and FIG. 40, the second reset signal line Vref2 extends at a position close to the first reset transistor M1 and therefore can be more easily electrically connected to the gate of the first reset transistor M1, and the third reset signal line Vref3 extends at a position close to the second reset transistor M2 and therefore can be more easily electrically connected to the gate of the second reset transistor M2. The second reset signal line Vref2, the third reset signal line Vref3, the first scanning line segment Scan11, and the second scanning line segment Scan12 that extend along the same direction can be arranged in a same layer.

For clear illustration, FIG. 39 and FIG. 40 illustrate only the first scanning signal transmission line 9 between the first scanning signal lines Scan1, the second reset signal transmission line 25 between the second reset signal lines Vref2, and the third reset signal transmission line 26 between the third reset signal lines Vref3, and a transmission line between other signal lines, such as power signal lines PVDD or data lines Data is to be described in detail in subsequent embodiments.

With such configuration, the extending directions of the second reset signal line Vref2 and the third reset signal line Vref3 are the same as a direction along which a plurality of first pixel circuits 8 in the pixel region 3 is arranged. The second reset signal line Vref2 can be directly connected to first electrodes of first reset transistors M1 in the plurality of first pixel circuits 8 in the pixel region 3 through a plurality of via holes. When the pixel region 3 includes a plurality of first pixel circuits 8, the third reset signal line Vref3 can be directly connected to first electrodes of second reset transistors M2 in the plurality of first pixel circuits 8 through a plurality of via holes. A connection line electrically connected between the second reset signal line Vref2 and the first electrode of the first reset transistor M1 can be omitted, as can a connection line electrically connected between the third reset signal line Vref3 and the first electrode of the second reset transistor M2, thereby simplifying the wiring design.

Figure 41:
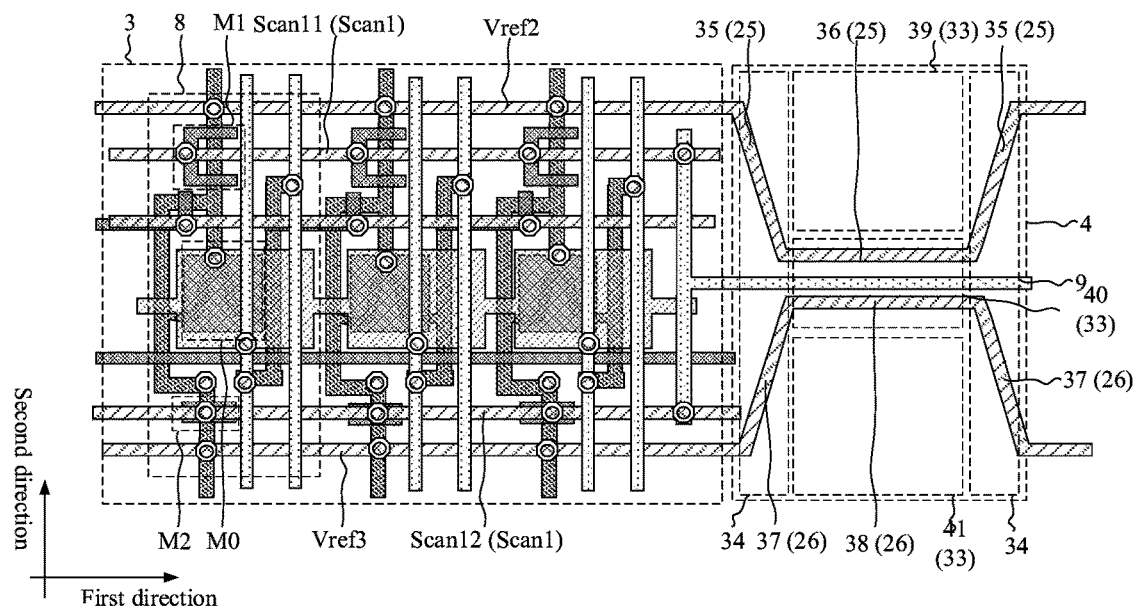
FIG. 41 is a schematic diagram of a second reset signal transmission line and a third reset signal transmission line according to some embodiments of the present disclosure.

In an embodiment, as shown in FIG. 41, the light transmission region 4 includes a fourth primary light transmission region 33 and a fourth secondary light transmission region 34. The fourth secondary light transmission region 34 and the fourth primary light transmission region 33 are arranged along the first direction. The fourth primary light transmission region 33 includes a first subregion 39, a second subregion 40, and a third subregion 41 that are arranged along a second direction. The second direction intersects the first direction. The second reset signal transmission line 25 includes a first reset transmission line segment 35 located in the fourth secondary light transmission region 34 and a second reset transmission line segment 36 located in the second subregion 40. The third reset signal transmission line 26 includes a third reset transmission line segment 37 located in the fourth secondary light transmission region 34 and a fourth reset transmission line segment 38 located in the second subregion 40. Along a direction from the fourth secondary light transmission region 34 to the fourth primary light transmission region 33, a distance between the first reset transmission line segment 35 and the third reset transmission line segment 37 gradually decreases. In other words, the shortest distance between the first reset transmission line segment 35 and the third reset transmission line segment 37 gradually decreases, and the two tend to be centrally arranged in the light transmission region 4.

With such configuration, while regions not shielded by traces in the light transmission region 4 are centralized to reduce diffraction, the first reset transmission line segment 35 and the third reset transmission line segment 37 both extend toward the second subregion 40 at a middle position of the fourth primary light transmission region 33, and extension lengths of the first reset transmission line segment 35 and the third reset transmission line segment 37 tend to be the same, so that the line load of the first reset signal transmission line 15 and that of the second reset signal transmission line 25 tend to be the same.

Figure 42:
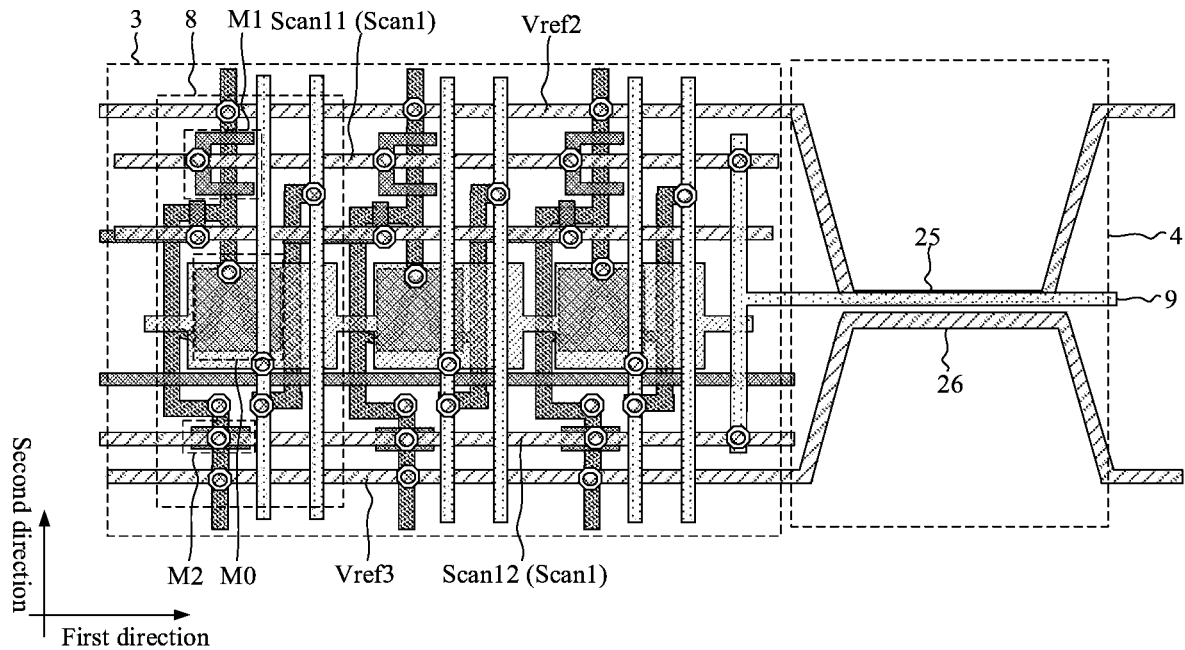
FIG. 42 is another schematic diagram of the second reset signal transmission line and the third reset signal transmission line according to some embodiments of the present disclosure.

In an embodiment, as shown in FIG. 42, the second reset signal transmission line 25 and the third reset signal transmission line 26 are each arranged in a different layer from the first scanning signal transmission line 9. In a direction perpendicular to a plane of the display panel, a projection of the second reset signal transmission line 25 and/or the third reset signal transmission line 26 overlaps a projection of the first scanning signal transmission line 9, thereby reducing an overall shielding degree of the three lines, namely, the second reset signal transmission line 25, the third reset signal transmission line 26, and the first scanning signal transmission line 9 to the light transmission region 4, increasing an area of a region not shielded by the traces in the light transmission region 4, and further improving light transmittance of the optical component setting region 2.

Figure 43:
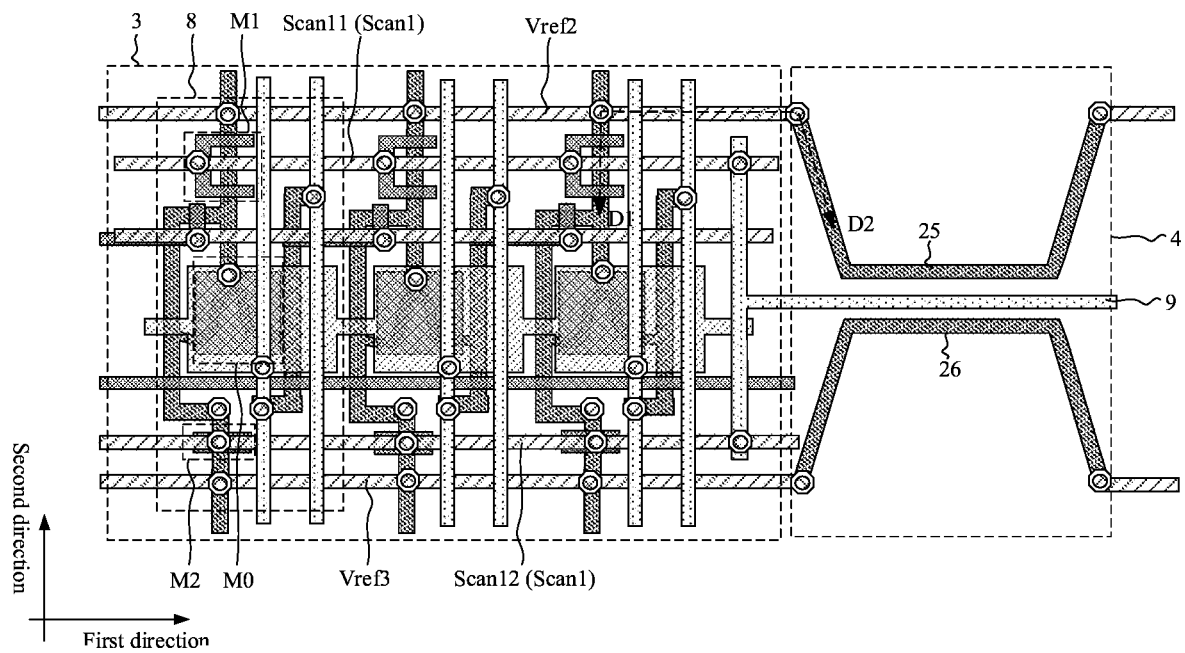
FIG. 43 is another schematic diagram of the second reset signal transmission line and the third reset signal transmission line according to some embodiments of the present disclosure.
Figure 44:
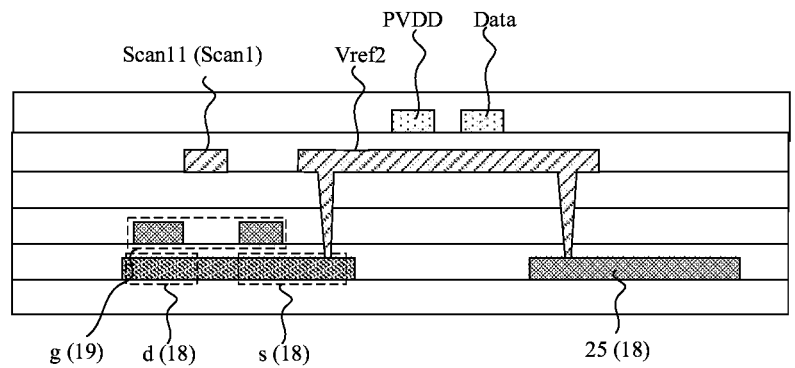
FIG. 44 is a cross-sectional view of FIG. 43 along a direction D1-D2, according to some embodiments of the present disclosure.

In an embodiment, as shown in FIG. 43 and FIG. 44, the display panel includes a semiconductor layer 18 and a first metal layer 19 that are laminated along a light emitting direction of the display panel. A gate g of the transistor is located in the first metal layer 19. A first electrode s of the transistor and a second electrode d of the transistor are located in the semiconductor layer 18. The second reset signal transmission line 25 and the third reset signal transmission line 26 are located in the semiconductor layer 18. In this way, light transmittance of the second reset signal transmission line 25 and that of the third reset signal transmission line 26 are increased, and a shielding degree of the second reset signal transmission line 25 and the third reset signal transmission line 26 to the light transmission region 4 is reduced, thereby enabling a larger amount of external ambient light to be incident to the camera assembly through the optical component setting region 2, and increasing an amount of external ambient light that can be collected by the camera assembly.

Figure 45:
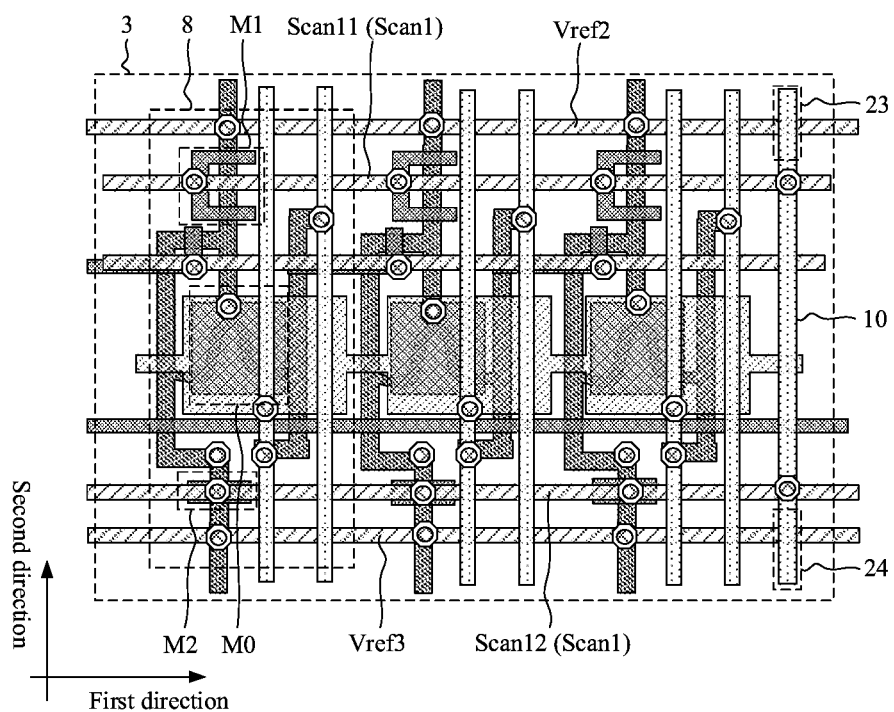
FIG. 45 is another schematic diagram of the first connection line according to some embodiments of the present disclosure.

In an embodiment, as shown in FIG. 45, the first connection line 10 includes a first end portion 23 and a second end portion 24. In a direction perpendicular to a plane of the display panel, a projection of the first end portion 23 is located at a side of a projection of the first scanning line segment Scan11 away from a projection of the second scanning line segment Scan12, and a projection of the second end portion 24 is located at a side of the projection of the second scanning line segment Scan12 away from the projection of the first scanning line segment Scan11. In an embodiment, in the direction perpendicular to the plane of the display panel, the projection of the first end portion 23 overlaps a projection of the second reset signal line Vref2, and/or the projection of the second end portion 24 overlaps a projection of the third reset signal line Vref3.

With reference to the FIG. 17, with the configuration of the first scanning signal line Scan1, the first scanning line segment Scan11 and the second scanning line segment Scan12 are connected in parallel through the first connection line 10, so that overall line load of the first scanning signal line Scan1 is reduced, and there is a difference between the load of the first scanning signal line Scan1 and load of the fourth scanning signal line Scan4 in the primary display region 11. Therefore, through an increase in an extending length of the first connection line 10, the first end portion 23 of the first connection line 10 overlaps the second reset signal line Vref2 and/or the second end portion 24 of the first connection line 10 overlaps the third reset signal line Vref3, so that a coupling capacitance is formed between the first end portion 23 and the second reset signal line Vref2 and/or between the second end portion 24 and the third reset signal line Vref3. The coupling capacitance can compensate for a load difference between the first scanning signal line Scan1 and the fourth scanning signal line Scan4, thereby making voltage drops of scanning signals transmitted in the primary display region 11 and the optical component setting region 2 tend to be the same. In an embodiment, a line width of the first end portion 23 and/or the second end portion 24 can be increased. In the direction perpendicular to the plane of the display panel, an overlapping area between the first end portion 23 or the second end portion 24 and the first scanning signal line scan1 can be increased.

Figure 46:
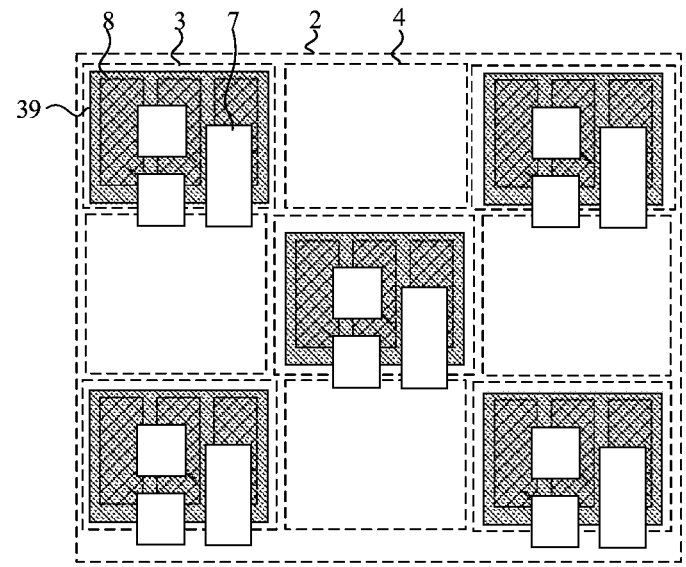
FIG. 46 is a schematic diagram of a shading portion according to some embodiments of the present disclosure.
Figure 47:
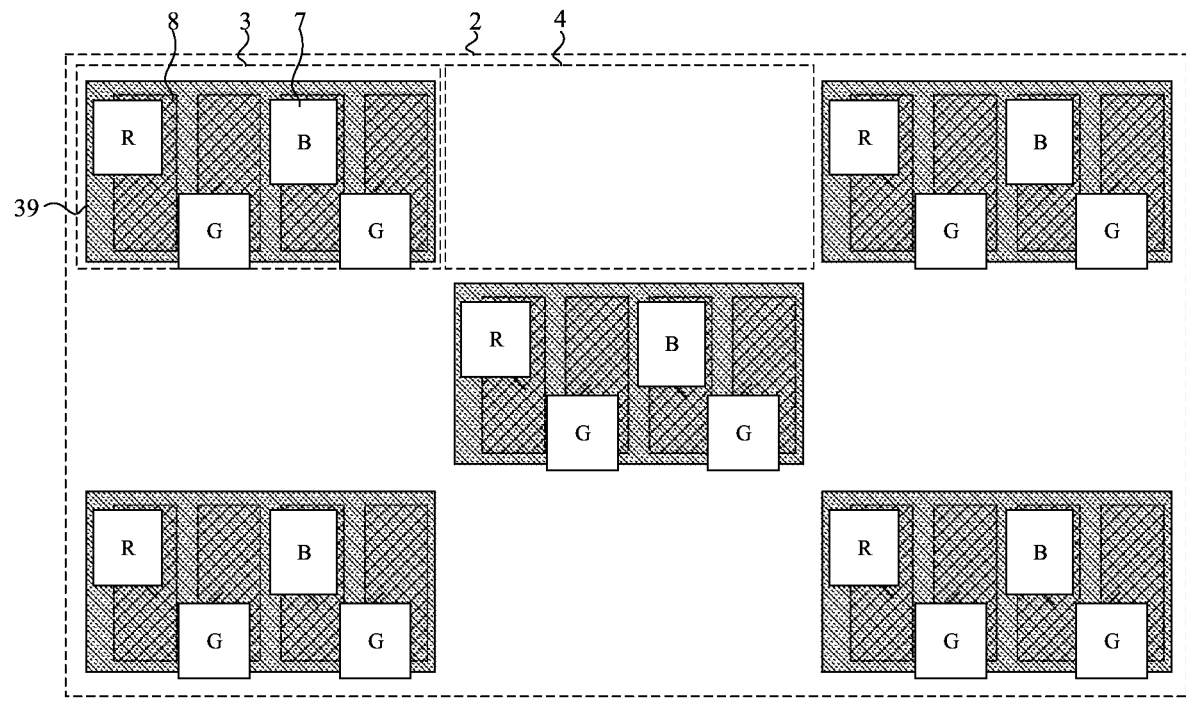
FIG. 47 is another schematic diagram of the shading portion according to some embodiments of the present disclosure.
Figure 48:
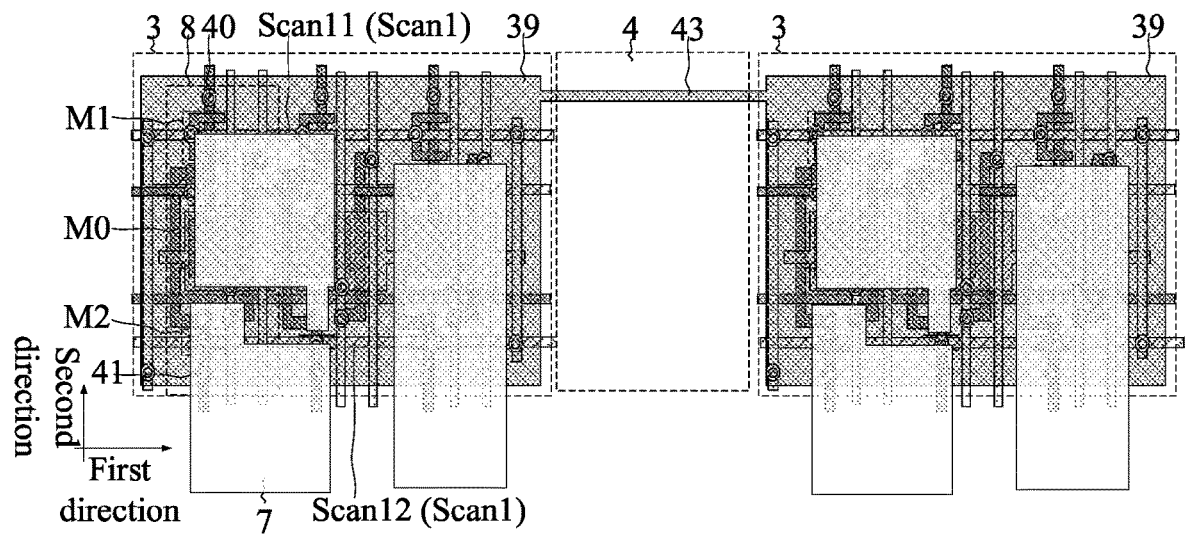
FIG. 48 is another schematic diagram of the shading portion according to some embodiments of the present disclosure.

As shown in FIG. 46 and FIG. 47, the display panel further includes the shading portion 39 located in the optical component setting region 2. In a direction perpendicular to the plane of the display panel, the shading portion 39 covers at least some first pixel circuits 8, so that the shading portion 39 is configured to shield a gap between metal layers, thereby alleviating a diffraction phenomenon. In an embodiment, still referring to FIG. 46 and FIG. 47, the pixel region can include pixels of a plurality of colors. For example, the pixel region can at least include one red pixel (R), one green pixel (G), and one blue pixel (B), or other color pixels that can be combined to emit white light.

In an embodiment, the shading portion 39 is electrically connected to a reset signal terminal. The shading portion 39 is further electrically connected to a first electrode of the first reset transistor M1 through a first via hole 40, and is electrically connected to a first electrode of the second reset transistor M2 through a second via hole 41. In addition, two adjacent shading portions 39 are electrically connected through an eighth connection line 43.

With such configuration, the shading portion 39 can directly transmit a reset signal to the first electrode of the first reset transistor M1 and the first electrode of the second reset transistor M2, so that additional reset signal lines in the optical component setting region 2 can be omitted, thereby simplifying a structure design of the panel. In addition, compared with a trace structure, the shading portion 39 of a planar design has relatively small load, and therefore, a voltage drop during transmission of the reset signal in the shading portion 39 can be reduced.

Figure 49:
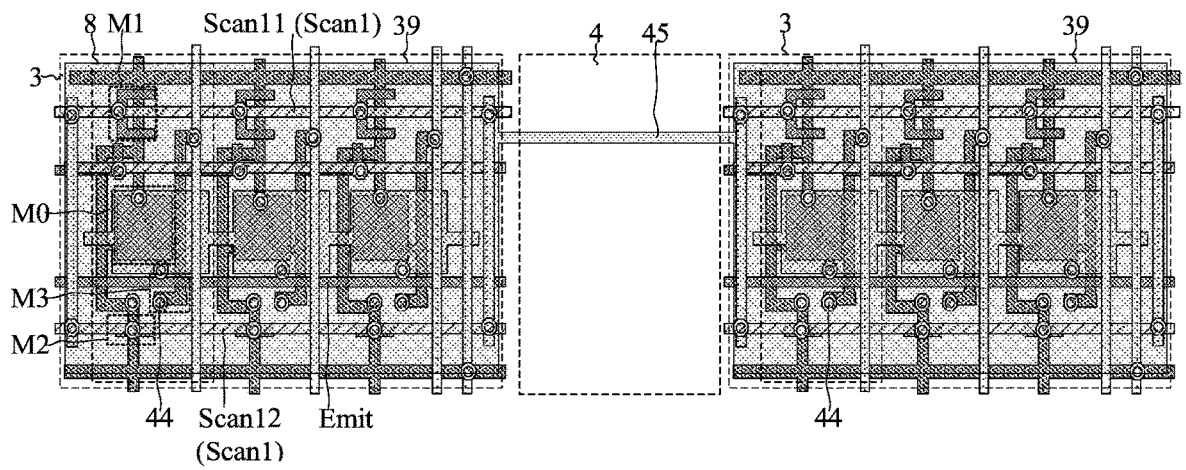
FIG. 49 is another schematic diagram of the shading portion according to some embodiments of the present disclosure.

In another embodiment, referring to FIG. 49, the plurality of transistors includes a supply voltage writing transistor M3. A gate of the supply voltage writing transistor M3 is electrically connected to a light-emitting control signal line Emit. A second electrode of the supply voltage writing transistor M3 is electrically connected to a first electrode of the drive transistor M0. The shading portion 39 is electrically connected to a power signal terminal. The shading portion 39 is further electrically connected to a first electrode of the supply voltage writing transistor M3 through a third via hole 44, and two adjacent shading portions 39 are electrically connected through a ninth connection line 45 arranged in a same layer as the shading portions 39.

With such a configuration, the shading portion 39 can directly transmit a power signal to the first electrode of the supply voltage writing transistor M3, so that additional power signal line in the optical component setting region 2 can be omitted, thereby simplifying a structure design of the panel. In addition, compared with a trace structure, the shading portion 39 of a planar design has relatively small load, and therefore, a voltage drop during transmission of the power signal in the shading portion 39 can be further reduced.

Figure 50:
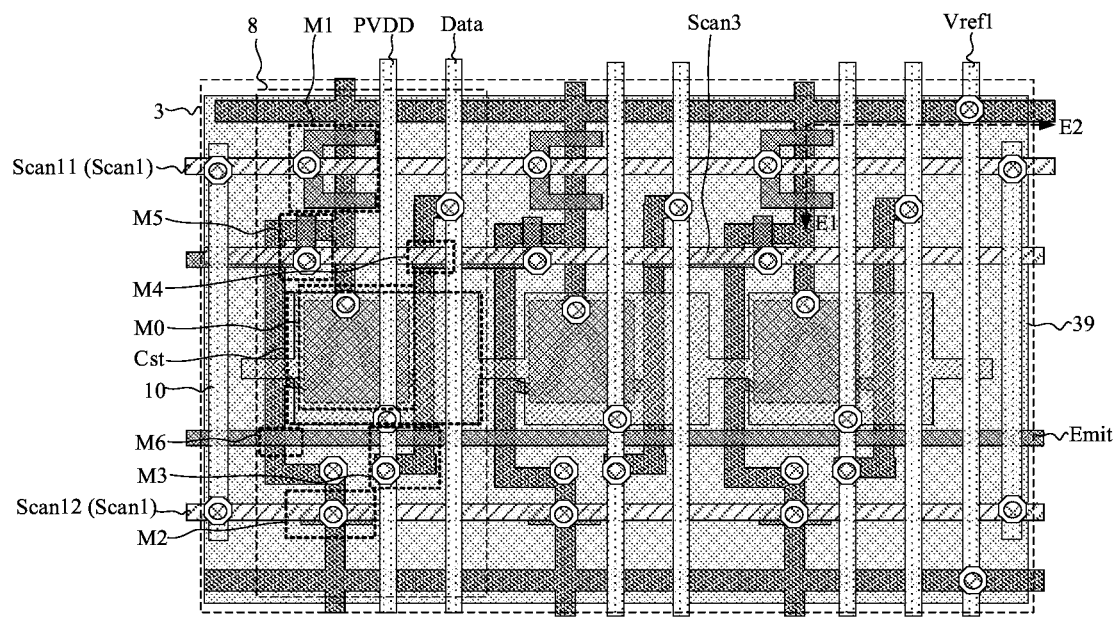
FIG. 50 is another schematic diagram of the shading portion according to some embodiments of the present disclosure.
Figure 51:
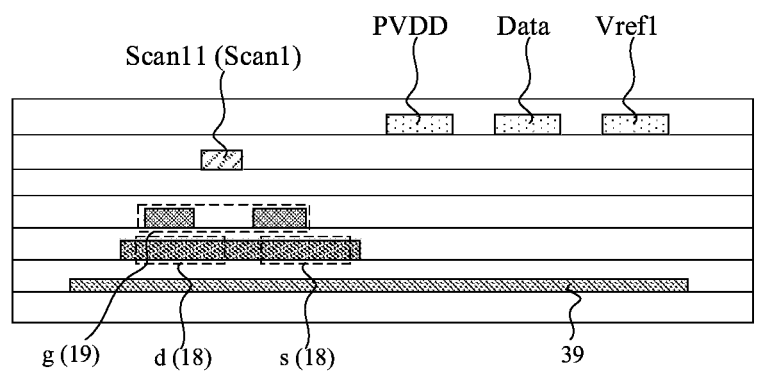
FIG. 51 is a cross-sectional view of FIG. 50 along a direction E1-E2, according to some embodiments of the present disclosure.

In an embodiment, as shown in FIG. 50 and FIG. 51, the display panel includes a semiconductor layer 18 and a first metal layer 19 that are arranged along light emitting direction of the display panel. A gate g of the transistor is located in the first metal layer 19. A first electrode s of the transistor and a second electrode d of the transistor are located in the semiconductor layer 18. The shading portion 39 located at a side of the semiconductor layer 18 facing away from the light emitting direction of the display panel.

In this case, in addition to shielding gaps between metal layers to reduce diffraction, the shading portion 39 can further prevent stray light from being incident through a bottom portion of the panel, or ambient light incident through a top portion of the panel but reflected by a bottom portion, from irradiating the semiconductor layer 18, thereby reducing a risk of leakage current in the transistor caused by light irradiating an active layer in the semiconductor layer 18 to generate a photon-generated carrier.

In an embodiment, with reference to the FIG. 4, referring to FIG. 50 again, the plurality of transistors further includes a threshold compensation transistor M5. A gate of the threshold compensation transistor M5 is electrically connected to a third scanning signal line Scan3. A first electrode of the threshold compensation transistor M5 is electrically connected to a second electrode of the drive transistor M0.

A second electrode of the threshold compensation transistor M5 is electrically connected to the gate of the drive transistor M0.

In this embodiment of the present disclosure, in the direction perpendicular to the plane of the display panel, a projection of the shading portion 39 can cover a projection of at least one of the first reset transistor M1, the threshold compensation transistor M5, and the drive transistor M0, thereby preventing the first reset transistor M1, the threshold compensation transistor M5, and the drive transistor M0 from generating leakage currents, and improving stability of the potential of the gate of the drive transistor M0.

Figure 52:
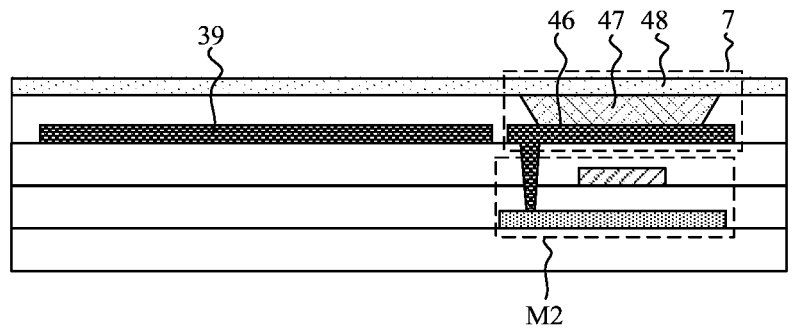
FIG. 52 is another schematic diagram of a layer position of the shading portion according to some embodiments of the present disclosure.

In an embodiment, referring to FIG. 52, the organic light-emitting element 7 includes a first electrode 46, a light emitting layer 47, and a second electrode 48 that are arranged along a light emitting direction of the display panel. In this embodiment of the present disclosure, that the first electrode 46 is an anode and the second electrode 48 is a cathode is taken as an example for description. The first electrode 46 of the organic light-emitting element 7 is electrically connected to a first electrode of the second reset transistor M2. The shading portion 39 and the first electrode 46 are arranged in a same layer. A gap is formed between the shading portion 39 and the first electrode 46, to ensure electrical insulation between the shading portion 39 and the first electrode 46. In this case, the shading portion 39 is located at a side of the transistor and various signal lines facing the light emitting direction of the display panel, a connection via hole between the transistor and the signal line can avoid running through the shading portion 39, and the shading portion 39 has a larger shading area. In addition, the shading portion 39 can be formed only by using the same patterning process as the first electrode 46, which not only simplifies a process procedure, but also requires no additional layer thickness.

In an embodiment, with reference to the FIG. 4 and FIG. 50, the plurality of transistors further includes a supply voltage writing transistor M3, a data voltage writing transistor M4, a threshold compensation transistor M5, and a light-emitting control transistor M6.

A gate of the supply voltage writing transistor M3 is electrically connected to a light-emitting control signal line Emit. A first electrode of the supply voltage writing transistor M3 is electrically connected to a power signal line PVDD. A second electrode of the supply voltage writing transistor M3 is electrically connected to a first electrode of the drive transistor M0. A gate of the data voltage writing transistor M4 is electrically connected to a third scanning signal line Scan3. A first electrode of the data voltage writing transistor M4 is electrically connected to a data line Data. A second electrode of the data voltage writing transistor M4 is electrically connected to the first electrode of the drive transistor M0. A gate of the threshold compensation transistor M5 is electrically connected to the third scanning signal line Scan3. A first electrode of the threshold compensation transistor M5 is electrically connected to a second electrode of the drive transistor M0. A second electrode of the threshold compensation transistor M5 is electrically connected to the gate of the drive transistor M0. A gate of the light-emitting control transistor M6 is electrically connected to the light-emitting control signal line Emit. A first electrode of the light-emitting control transistor M6 is electrically connected to the second electrode of the drive transistor M0. A second electrode of the light-emitting control transistor M6 is electrically connected to the first electrode of the organic light-emitting element 7.

In an embodiment, the pixel circuit 6 further includes a storage capacitor Cst. A first plate of the storage capacitor Cst is electrically connected to the power signal line PVDD. A second plate of the storage capacitor Cst is reused with the gate of the drive transistor M0.

The following exemplarily describes an operating principle of the pixel circuit 6 by using an example in which the gate of the first reset transistor M1 is electrically connected to the gate of the second reset transistor M2 in the pixel circuit 6:

A drive period of the pixel circuit 6 includes a first time period, a second time period, and a third time period.

During the first time period, the first reset transistor M1 resets the gate of the drive transistor M0 in response to a scanning signal corresponding to the first reset transistor M1, and the second reset transistor M2 resets the first electrode of the organic light-emitting element 7 in response to a scanning signal corresponding to the second reset transistor M2.

During the second time period, the data voltage writing transistor M4 responds to a scanning signal provided by the third scanning signal line Scan3, and the data line Data writes a data signal into the drive transistor M0 through the data voltage writing transistor M4 and the threshold compensation transistor M5 that are turned on.

During the third time period, the supply voltage writing transistor M3 and the light-emitting control transistor M6 control, in response to a light-emitting control signal provided by the light-emitting control signal line Emit, the organic light-emitting element 7 to emit light under action of a drive current obtained through conversion from the data signal and a power signal that is provided by the power signal line PVDD.

Figure 53:
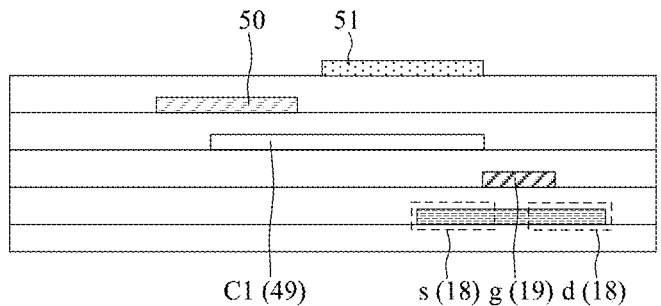
FIG. 53 is a schematic diagram of a layer position of each metal layer in the display panel according to some embodiments of the present disclosure.

With such structure, with reference to the FIG. 2, the display region 1 further includes a primary display region 11 arranged adjacent to the optical component setting region 2, and the pixel circuit 6 includes a second pixel circuit 12 located in the primary display region 11. FIG. 53 is a schematic diagram of a layer position of each metal layer in the display panel according to some embodiments of the present disclosure. The display panel includes a semiconductor layer 18, a first metal layer 19, a second metal layer 49, a third metal layer 50, and a fourth metal layer 51 that are arranged along a light emitting direction of the display panel. A gate g of the transistor is located in the first metal layer 19. A first electrode s of the transistor and a second electrode d of the transistor are located in the semiconductor layer 18. The first plate C1 of the storage capacitor Cst is located in the second metal layer 49.

Figure 54:
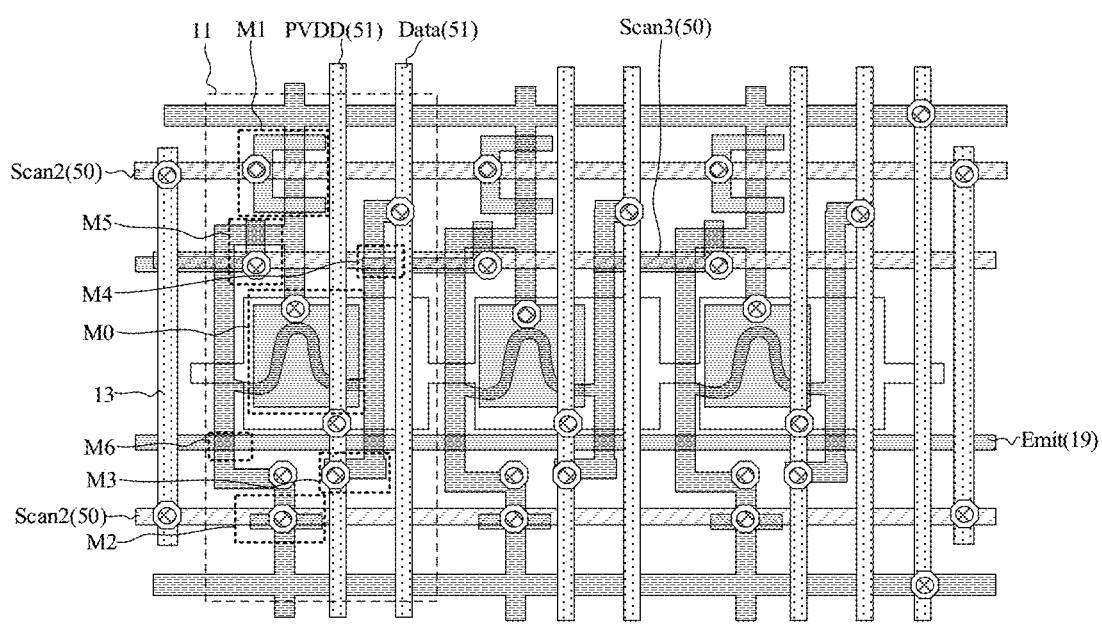
FIG. 54 is a schematic diagram of a layer position of a signal line in the primary display region according to some embodiments of the present disclosure.

In an embodiment, as shown in FIG. 54, in the primary display region 11, the first metal layer 19, the third metal layer 50, and the fourth metal layer 51 each include at least one of the third scanning signal line Scan3, the light-emitting control signal line Emit, the power signal line PVDD, and the data line Data.

For example, referring to FIG. 54 again, the light-emitting control signal line Emit electrically connected to the second pixel circuit 12 is located in the first metal layer 19, the second scanning signal line Scan2 and the third scanning signal line Scan3 are located in the third metal layer 50, and the power signal line PVDD and the data line Data are located in the fourth metal layer 51.

Figure 55:
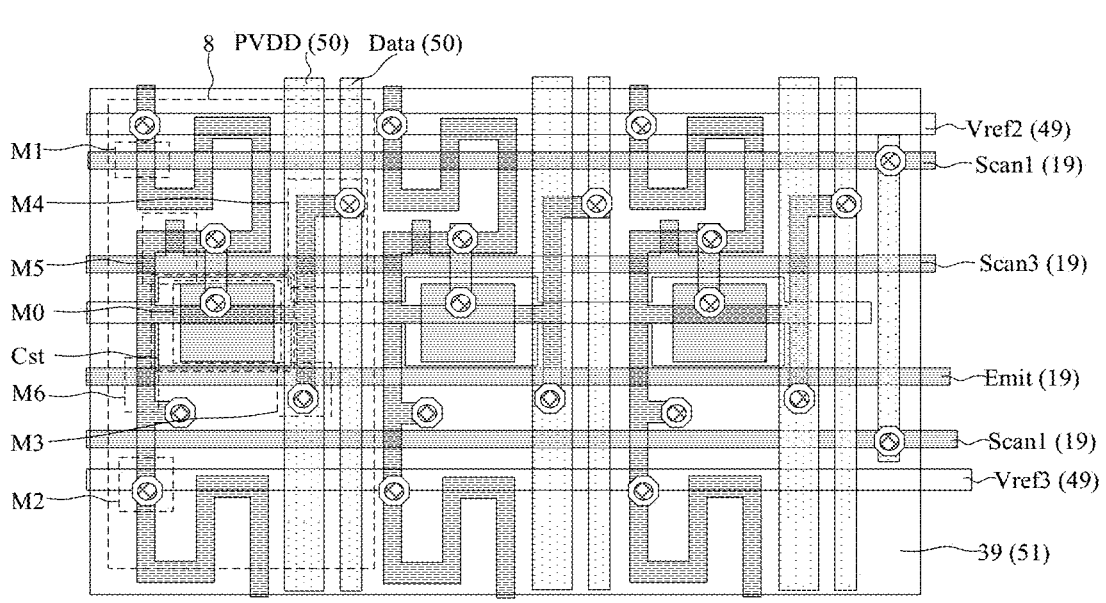
FIG. 55 is a schematic diagram of a layer position of a signal line in an optical component setting region according to some embodiments of the present disclosure.
Figure 56:
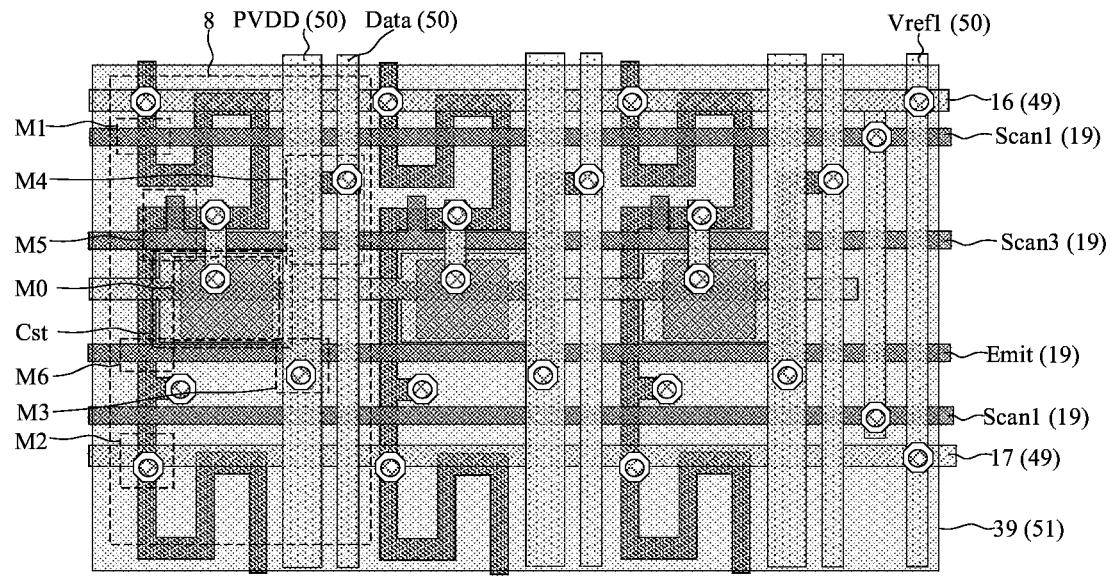
FIG. 56 is another schematic diagram of a layer position of a signal line in the optical component setting region according to some embodiments of the present disclosure.

In an embodiment, as shown in FIG. 55 and FIG. 56, the optical component setting region 2, the shading portion 39 is located in the first metal layer 19, or the third metal layer 50, or the fourth metal layer 51, and the shading portion 39 is arranged in a different layer from the third scanning signal line Scan3, the light-emitting control signal line Emit, the power signal line PVDD, and the data line Data in the optical component setting region 2.

For example, referring to FIG. 55 and FIG. 56 again, the first scanning signal line Scan1, the third scanning signal line Scan3, and the light-emitting control signal line Emit that are electrically connected to the first pixel circuit 8 are located in the first metal layer 19, the power signal line PVDD and the data line Data are located in the third metal layer 50, and the shading portion 39 is located in the fourth metal layer 51.

In an embodiment, when the first electrode of the first reset transistor M1 is electrically connected to the second reset signal line Vref2, and the first electrode of the second reset transistor M2 is electrically connected to the third reset signal line Vref3, referring to FIG. 55 again, the second reset signal line Vref2 and the third reset signal line Vref3 can be located in the second metal layer 49. In an embodiment, when the first electrode of the first reset transistor M1 and the first electrode of the second reset transistor M2 are electrically connected to the first reset signal line Vref1 that extends along a second direction, referring to FIG. 56 again, the first reset signal line Vref1 is located in the third metal layer 50, and the third connection line 16 and the third connection line 17 that are electrically connected to the first reset signal line Vref1 are located in the second metal layer 49.

Through adjustment of the layer position of each signal line in the optical component setting region 2, a metal layer is reserved from the first metal layer 19, the third metal layer 50, and the fourth metal layer 51 to individually form the shading portion 39, and the shading portion 39 can be disposed in a separate layer from other signal lines. Therefore, without avoiding other signal lines, the shading portion 39 has a larger shading area.

Figure 57:
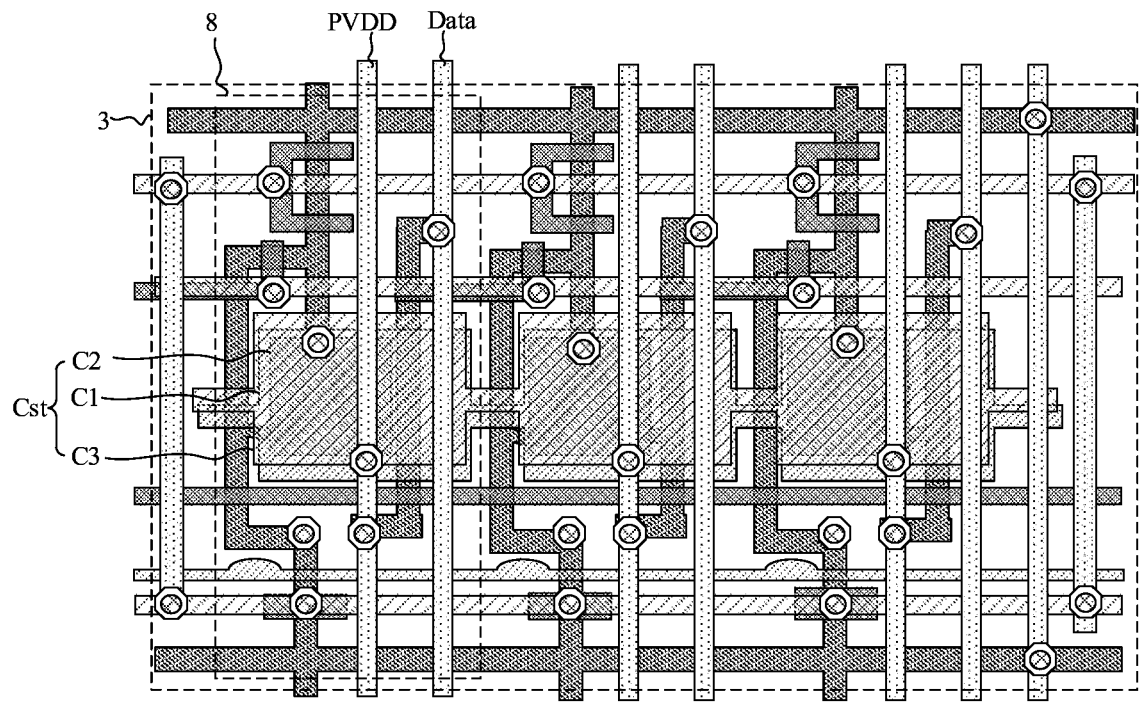
FIG. 57 is another schematic diagram of a storage capacitor according to some embodiments of the present disclosure.

In an embodiment, referring to FIG. 55 and FIG. 56 again, to reduce a voltage drop of the power signal, a line width of the power signal line PVDD can be greater than that of the data line Data. FIG. 57 is another schematic diagram of the storage capacitor Cst according to some embodiments of the present disclosure. In an embodiment, as shown in FIG. 57, the first plate C1 is electrically connected to the power signal line PVDD and the second plate C2 is reused with the gate of the first reset transistor M1, the storage capacitor Cst can further include a third plate C3 arranged opposite to the first plate C1. The third plate C3 is also electrically connected to the power signal line PVDD, and is configured to further reduce load of the power signal line PVDD.

In an embodiment, referring to FIG. 55 and FIG. 56 again, the shading portion 39 is located in the fourth metal layer 51. In this case, the shading portion 39 is located at a side of the transistor and various signal lines facing the light emitting direction of the display panel. A connection via hole between the transistor and the signal line can avoid running through the shading portion 39, such that the shading portion 39 covers a larger area.

Figure 58:
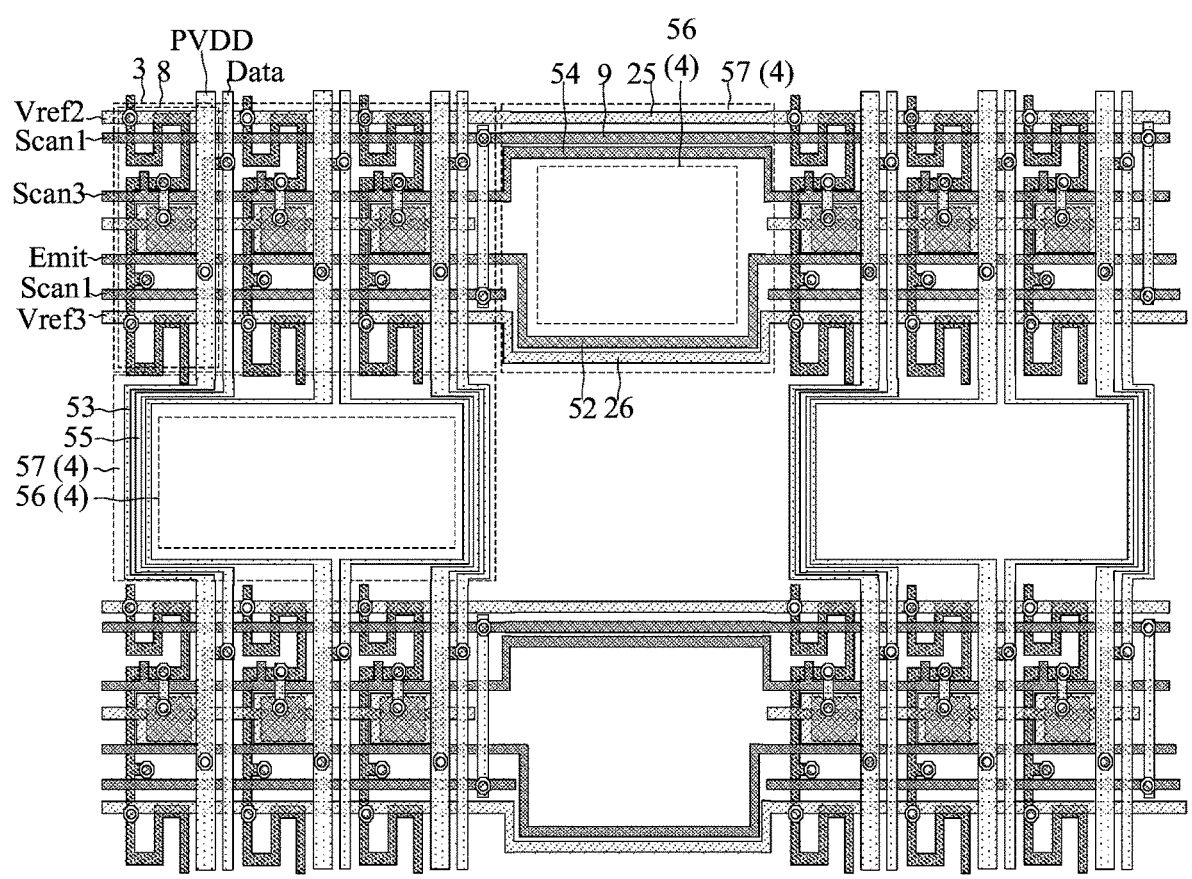
FIG. 58 is a schematic arrangement diagram of each signal transmission line in the optical component setting region according to some embodiments of the present disclosure.

In an embodiment, as shown in FIG. 58, light-emitting control signal lines Emit electrically connected to first pixel circuits 8 in two adjacent pixel regions 3 are electrically connected through a light-emitting signal transmission line 52. Power signal lines PVDD electrically connected to the first pixel circuits 8 in the two adjacent pixel regions 3 are electrically connected through a power signal transmission line 53. Third scanning signal lines Scan3 electrically connected to the first pixel circuits 8 in the two adjacent pixel regions 3 are electrically connected through a second scanning signal transmission line 54. Data lines Data electrically connected to the first pixel circuits 8 in the two adjacent pixel regions 3 are electrically connected through a data signal transmission line 55.

The light transmission region 4 includes a fifth primary light transmission region 56 and a fifth secondary light transmission region 57 surrounding the fifth primary light transmission region 56. The light-emitting signal transmission line 52, the power signal transmission line 53, the second scanning signal transmission line 54, and the data signal transmission line 55 extend within the fifth secondary light transmission region 57. In other words, various signal transmission lines all extend around the fifth primary light transmission region 56, to centralize regions shielded and not shielded by traces in the light transmission region 4 to reduce diffraction.

In an embodiment, a shading portion can be further provided in the fifth secondary light transmission region 57. The shading portion is used to fully cover the fifth secondary light transmission region 57, or to cover a gap between the signal transmission lines in the fifth secondary light transmission region 57, to eliminate diffraction to a greater extent.

Figure 59:
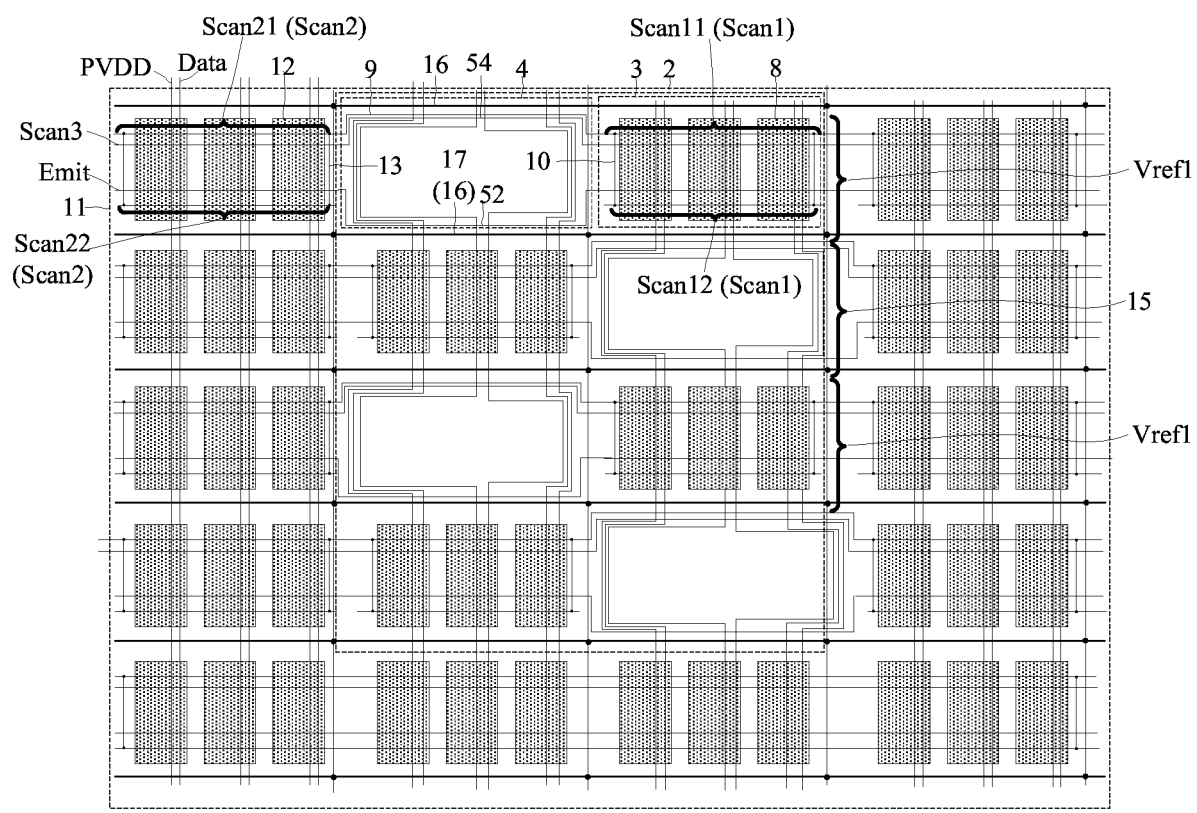
FIG. 59 is a schematic diagram of the primary display region and the optical component setting region according to some embodiments of the present disclosure.
Figure 60:
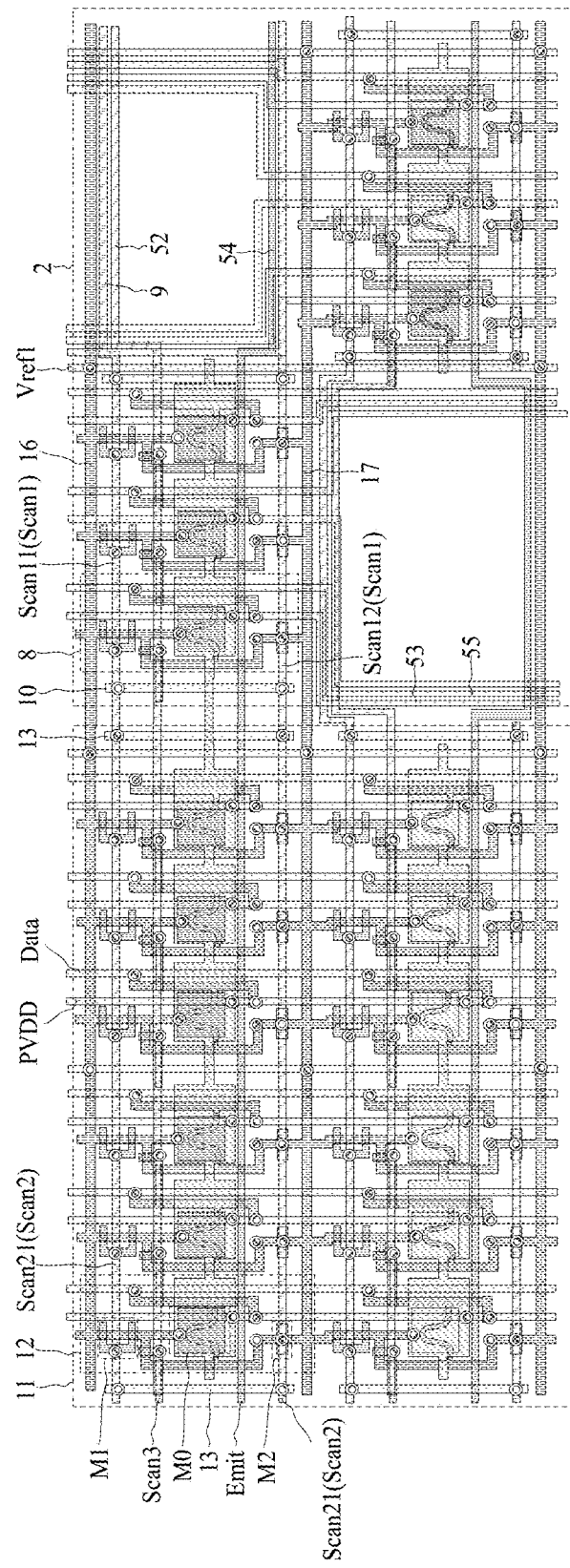
FIG. 60 is a partial schematic layout diagram of the primary display region and the optical component setting region according to some embodiments of the present disclosure.

Based on the foregoing specific structure of the pixel circuit, FIG. 59 is a schematic diagram of the primary display region 11 and the optical component setting region 2, and FIG. 60 is a schematic layout diagram of the primary display region 11 and the optical component setting region 2.

Figure 61:
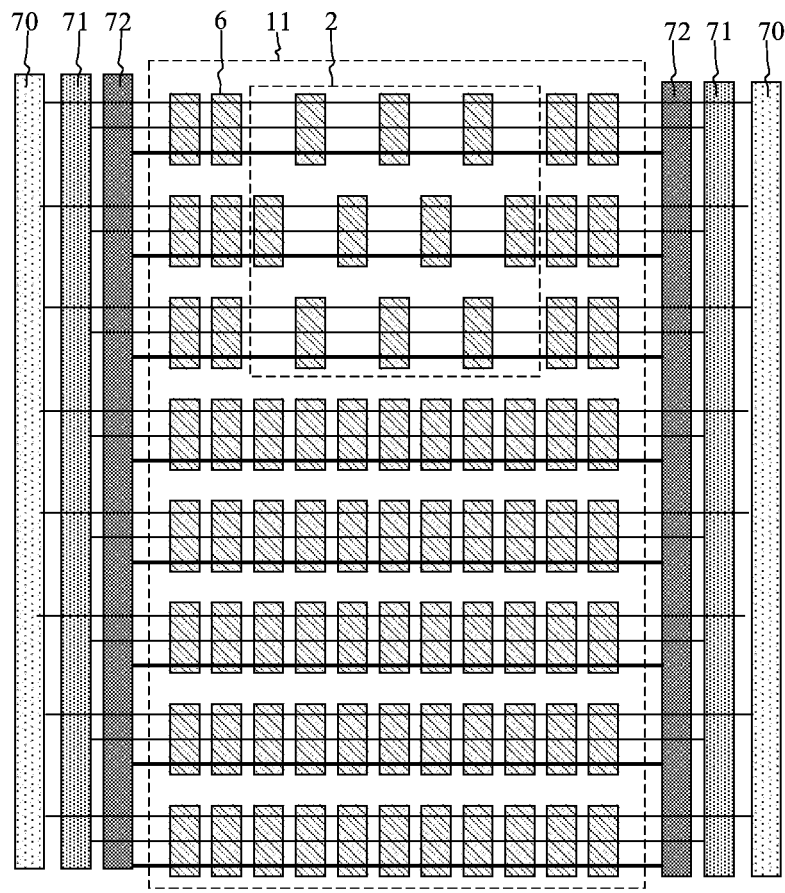
FIG. 61 is another schematic diagram of the display panel according to some embodiments of the present disclosure.

In an embodiment, as shown in FIG. 61, when the pixel circuit 6 is of the foregoing circuit structure, the display panel can include a first scan shift register 70, a second scan shift register 71, and a light-emitting shift register 72. The first scan shift register 70 is configured to provide a scanning signal for the gate of the first reset transistor M1 and the gate of the second reset transistor M2 in the pixel circuit 6. The second scan shift register 71 is configured to provide a scanning signal for the gate of the data voltage writing transistor M4 and the gate of the threshold compensation transistor M5 in the pixel circuit 6. The light-emitting shift register 72 is configured to provide a light-emitting control signal for the gate of the supply voltage writing transistor M3 and the gate of the light-emitting control transistor M6 in the pixel circuit 6. The first scan shift register 70, the second scan shift register 71, and the light-emitting shift register 72 can be driven unilaterally or bilaterally. In addition, the working principle of the foregoing shift registers is the same as that of the existing shift register. Details are not described herein again.

Figure 62:
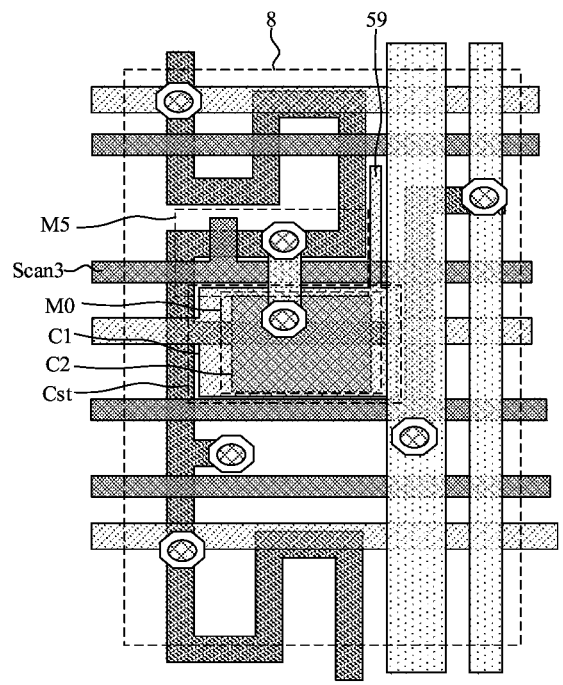
FIG. 62 is a schematic diagram of a shielding portion according to some embodiments of the present disclosure.

In an embodiment, as shown in FIG. 62, the plurality of transistors further includes a threshold compensation transistor M5. A gate of the threshold compensation transistor M5 is electrically connected to a third scanning signal line Scan3. A first electrode of the threshold compensation transistor M5 is electrically connected to a second electrode of the drive transistor M0. A second electrode of the threshold compensation transistor M5 is electrically connected to the gate of the drive transistor M0. The pixel circuit 6 further includes a storage capacitor Cst. A first plate C1 of the storage capacitor Cst is electrically connected to a power signal line PVDD. A second plate C2 of the storage capacitor Cst is reused with the gate of the drive transistor M0.

The display panel can further include the shielding portion 59 protruding from the first plate C1. In a direction perpendicular to the plane of the display panel, a projection of the shielding portion 59 is adjacent to a projection of the second electrode of the threshold compensation transistor M5, so that the shielding portion 59 is used to shield impact of an interfering signal on the second electrode of the threshold compensation transistor M5, that is, a potential of the gate of the drive transistor M0, thereby avoiding fluctuations in the potential of the gate of the drive transistor M0. In addition, the shielding portion 59 can be set in a same layer as and electrically connected to the first plate C1 of the storage capacitor Cst. In the direction perpendicular to the plane of the display panel, the shielding portion 59 at least partially overlaps the third scan line scan3, so that a capacitance of the storage capacitor Cst electrically connected to the drive transistor M0 can be increased, thereby improving stability of the potential of the gate of the drive transistor M0.

Figure 63:
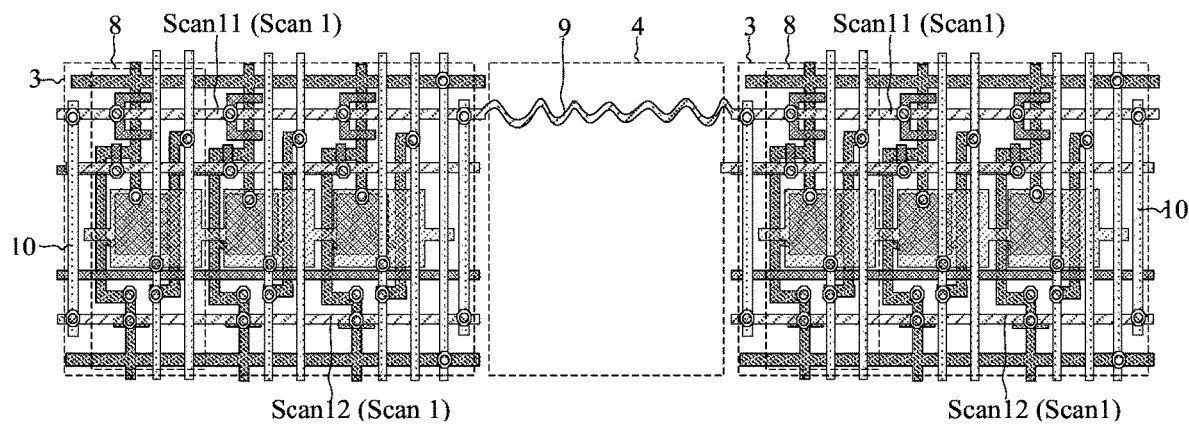
FIG. 63 is a schematic diagram of the first scanning signal transmission line according to some embodiments of the present disclosure.

In an embodiment, as shown in FIG. 63, the first scanning signal transmission line 9 includes at least two zigzag trace segments connected to each other, or the first scanning signal transmission line 9 includes at least two arc trace segments connected to each other. In this case, an edge of the first scanning signal transmission line 9 is a zigzag edge or a wavy edge, which breaks periodic interference of external ambient light, thereby eliminating diffraction to a greater extent.

In an embodiment, an edge of the light transmission region 4 can be made a non-linear edge by adjusting a shape of the light transmission region 4, thereby effectively eliminating diffraction.

Figure 64:
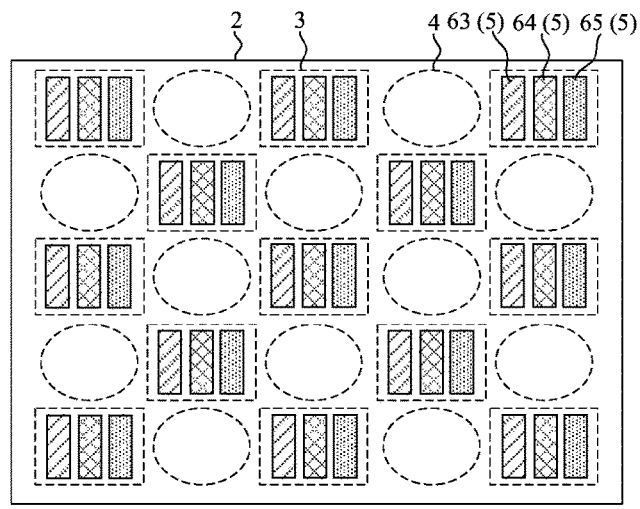
FIG. 64 is a schematic diagram of a shape of a light transmission region according to some embodiments of the present disclosure.

For example, as shown in FIG. 64, the shape of the light transmission region 4 is a circle or an ellipse. When the shape of the light transmission region 4 is a circle or an ellipse, a shape of the pixel region 3 can still be a rectangle. In this case, the shape of the light transmission region 4 can be defined by the shading portion.

Figure 65:
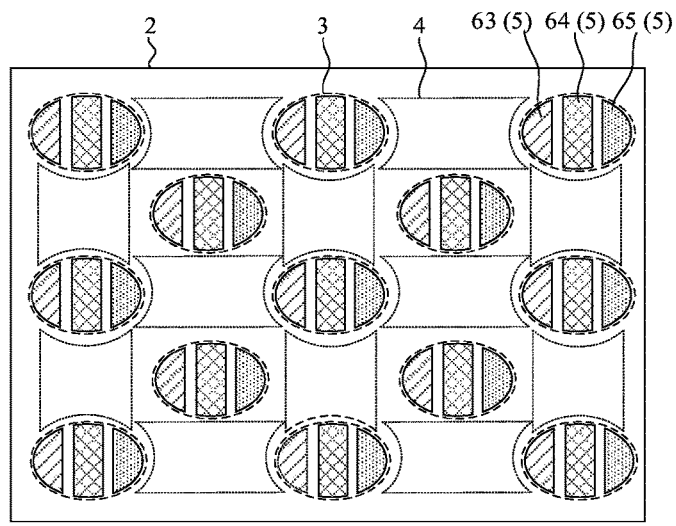
FIG. 65 is a schematic diagram of a shape of the pixel region according to some embodiments of the present disclosure.

In an embodiment, as shown in FIG. 65, the shape of the pixel region 3 is a circle or a circle-like shape. In this case, an edge of a light transmission region 4 between two adjacent pixel regions 3 is a non-linear edge.

Figure 66:
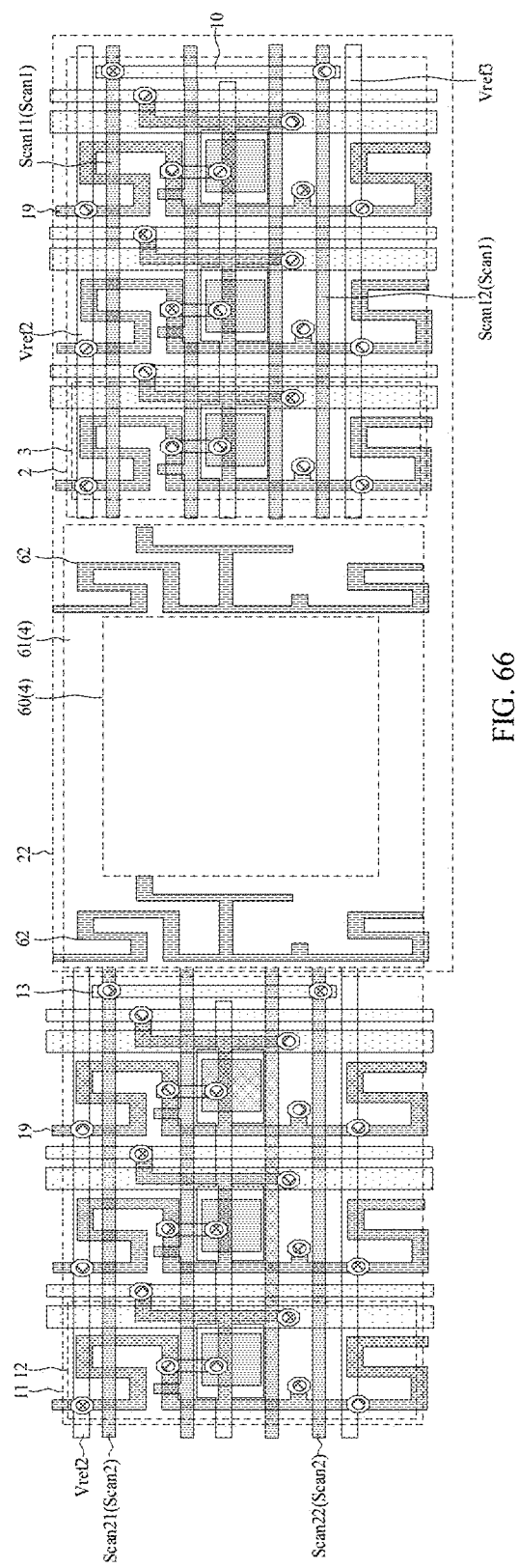
FIG. 66 is a schematic diagram of a dummy line according to some embodiments of the present disclosure.

In an embodiment, as shown in FIG. 66, the display panel includes a semiconductor layer 18. A first electrode of the transistor and a second electrode of the transistor are located in the semiconductor layer 18. The light transmission region 4 includes a sixth primary light transmission region 60 and a sixth secondary light transmission region 61 surrounding the sixth primary light transmission region 60. The sixth secondary light transmission region 61 includes a dummy line 62 located in the semiconductor layer 18.

Therefore, a first electrode and a second electrode of a transistor close to the junction are more greatly affected by etching. Some dummy lines 62 are provided in the sixth secondary light transmission region 61, so that the distribution density of the semiconductor layer 18 at boundary positions of the optical component setting region 2 can be increased by using the dummy lines 62, thereby improving etching uniformity of the semiconductor layer 18, and effectively improving working stability of the transistors at the boundary positions.

In an embodiment, referring to FIG. 65 again, a pattern of the added dummy line 62 can be the same as that of the semiconductor layer 18 in the pixel circuit 6, or the dummy line 62 can be of a trace structure.

In an embodiment, as shown in FIG. 66, at least some dummy lines 62 are reused as first scanning signal transmission lines 9, so that additional metal trace as the first scanning signal transmission line 9 can be omitted. In an embodiment, the dummy line 62 is formed by using a semiconductor material and has higher light transmittance. Therefore, light transmittance of the optical component setting region 2 can be further improved.

In an embodiment, referring to FIG. 66 again, some dummy lines 62 can also be reused as one or more of a light-emitting signal transmission line 52, a power signal transmission line 53, a second scanning signal transmission line 54, and a data signal transmission line 55. When a first electrode of the first reset transistor M1 and a first electrode of the second reset transistor M2 in the first pixel circuit 8 are electrically connected to a first reset signal line Vref1, the dummy line 62 can alternatively be reused as a first reset signal transmission line 15. When a first electrode of the first reset transistor M1 in the first pixel circuit 8 is electrically connected to a second reset signal line Vref2, and a second electrode of the second reset transistor M2 is electrically connected to a third reset signal, the dummy line 62 can alternatively be reused a second reset signal transmission line 25 and a third reset signal transmission line 26.

Figure 71:
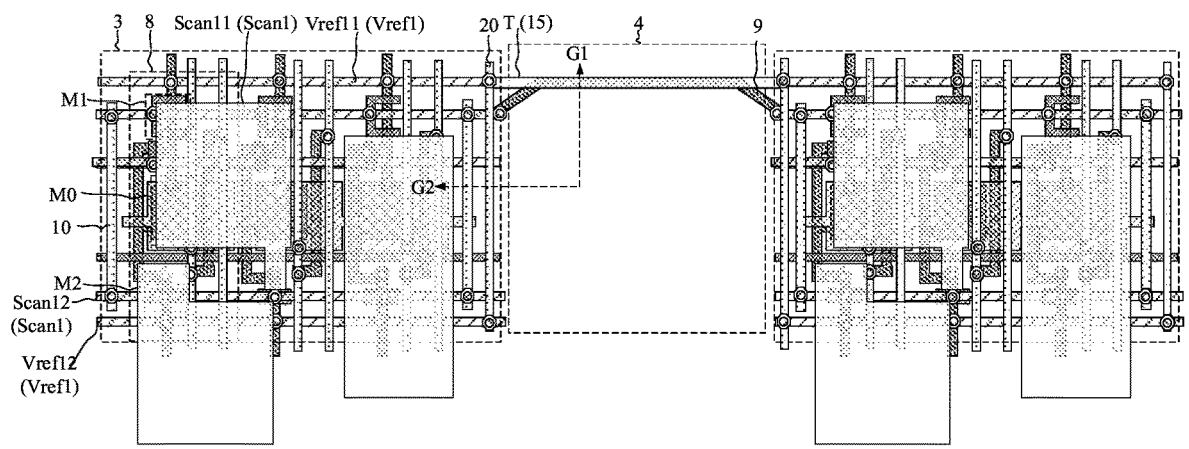
FIG. 71 is a schematic diagram of the pixel region according to some embodiments of the present disclosure.

In an embodiment, to improve light transmittance of the optical component setting region, signal transmission lines between two adjacent pixel regions along a first direction or along a second direction, for example, one or more of a light-emitting signal transmission line 52, a power signal transmission line 53, a second scanning signal transmission line 54, a data signal transmission line 55, a first reset signal transmission line 15, and a first scanning signal transmission line 9, can be arranged in a same layer as the semiconductor layer, that is, the signal transmission lines are made by using semiconductor materials. In FIG. 71, that the first scanning signal transmission line 9 and the semiconductor layer are located in a same layer is used as an example for description.

Figure 72:
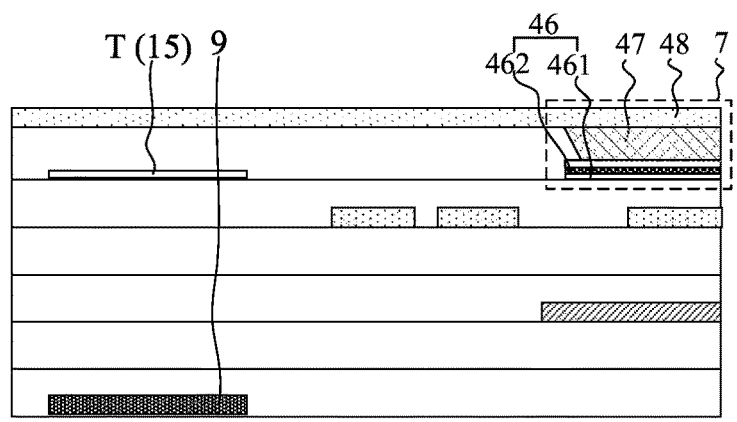
FIG. 72 is a cross-sectional view of FIG. 71 along a direction G1-G2, according to some embodiments of the present disclosure.

When light passes from the outside through the light transmission region of the optical component setting region and enters an optical component (for example, a camera) for imaging, it can be understood that, in a direction perpendicular to the plane of the display pane, due to differences between thickness or refractivity of one or more light-transmitting layer layers in regions in which the signal transmission lines made of the semiconductor materials are located and thickness or refractivity of corresponding surrounding light-transmitting layer layers, optical distances of ambient light at different positions are different, and an optical distance difference causes a light phase difference. Consequently, a diffraction phenomenon is easily caused, and an imaging effect of an optical device is also affected. Therefore, a light-transmitting structure T can be provided above or below the signal transmission line made of the semiconductor material. In the direction perpendicular to the plane of the display panel, the light-transmitting structure covers at least one signal transmission line made of the semiconductor material, to adjust optical distance differences on different light paths, thereby alleviating the diffraction phenomenon. A layer thickness and a material refractive index of the light-transmitting structure T can be selected and designed according to design constraints. The light-transmitting structure can be made of a transparent conductive material, such as ITO or IGZO. In an embodiment, the light-transmitting structure can be reused as one or more of a light-emitting signal transmission line 52, a power signal transmission line 53, a second scanning signal transmission line 54, data signal transmission line 55, a first reset signal transmission line 15, and a first scanning signal transmission line 9, so that the light transmittance of the optical component setting region is improved, a diffraction effect of light is reduced, and an area of a high-transmittance region in the light transmission region 4 can be increased. Referring to FIG. 71, for example, the first reset signal transmission line 15 can be made of a transparent conductive material, and the first reset signal transmission line 15 at least partially overlaps the first scanning signal transmission line 9. In this way, space occupied by the traces can be reduced, the light transmittance of the optical component setting region 2 can be further improved, and a light diffraction problem caused by the optical distance difference can be alleviated. The wiring manner in FIG. 71 is intended to facilitate understand of the technical solution only and does not limit a specific trace signal. FIG. 72 is a cross-sectional view of FIG. 71 along a direction G1-G2. The first electrode 46 of the organic light-emitting element can include a first transparent electrode 461 and a first reflective electrode 462. The light-transmitting structure T and the first transparent electrode 461 can be made in a same layer and by a same process, to reduce a manufacturing process and panel thickness.

In an embodiment, to increase the light transmittance of the optical component setting region 2, a number of pixel circuits in the optical component setting region 2 can be reduced. To equalize brightness of the optical component setting region 2 and that of the primary display region 11, a drive current in the first pixel circuit is increased to increase the brightness of the optical component setting region 2. However, higher current density indicates faster service life decay of the pixels. Therefore, a first pixel circuit can be electrically connected to at least two organic light-emitting elements 7, first electrodes of the two organic light-emitting elements 7 can be electrically connected, two pixel openings are separately provided correspondingly. Usually, to improve light output efficiency of the pixels, the first electrode can be set to a structure including a reflective electrode. This can cause a particular amount of loss of light transmittance of the display panel. Therefore, in an embodiment, the first electrodes of the two organic light-emitting elements 7 can be electrically connected by using a transparent metal trace (such as ITO or IGZO), to drive the first electrodes to emit light. In an embodiment, when there are traces made of semiconductor materials or other light-transmitting traces in the light transmission region, in the direction perpendicular to the plane of the display panel, the transparent metal trace can at least partially cover the traces made of semiconductor materials or other light-transmitting traces, to alleviate the diffraction problem caused by the optical distance difference, and improve the imaging effect of the optical component.

Figure 67:
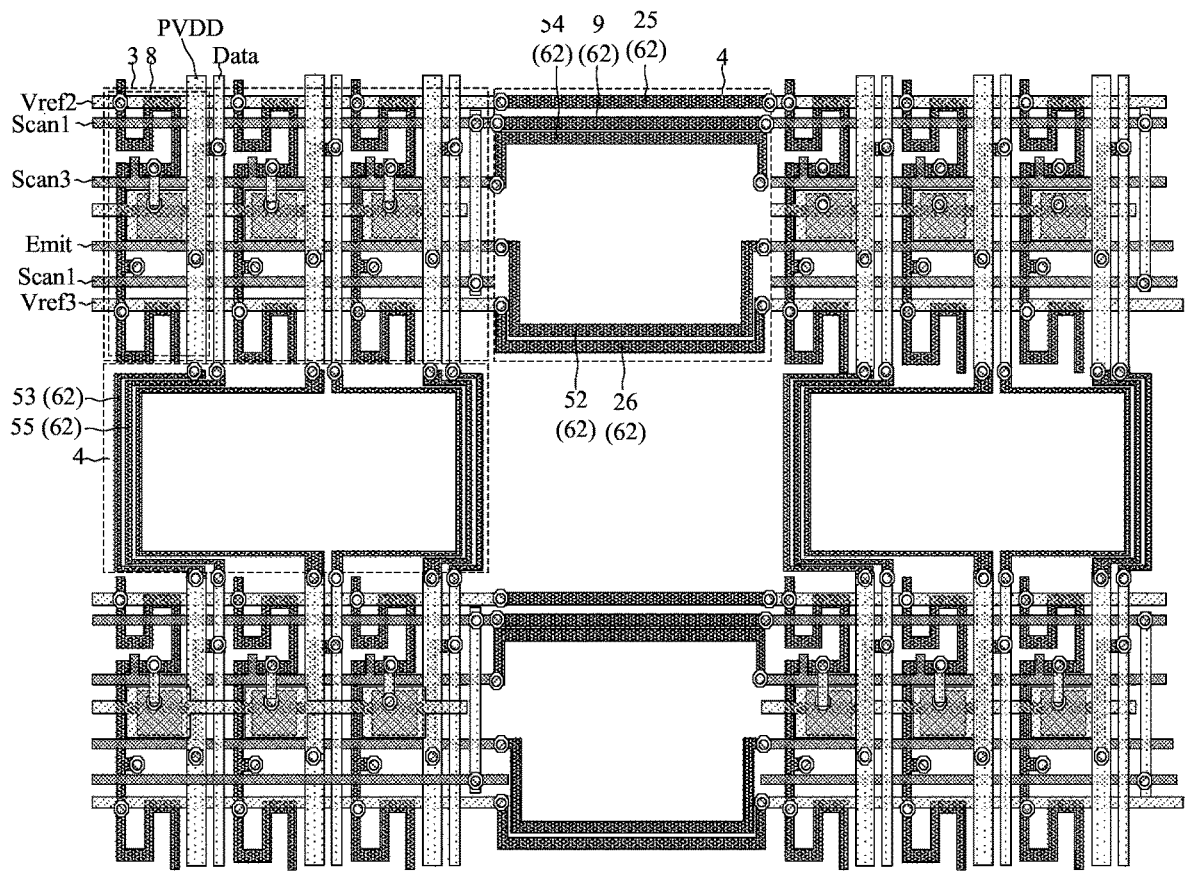
FIG. 67 is another schematic diagram of the dummy line according to some embodiments of the present disclosure.
Figure 68:
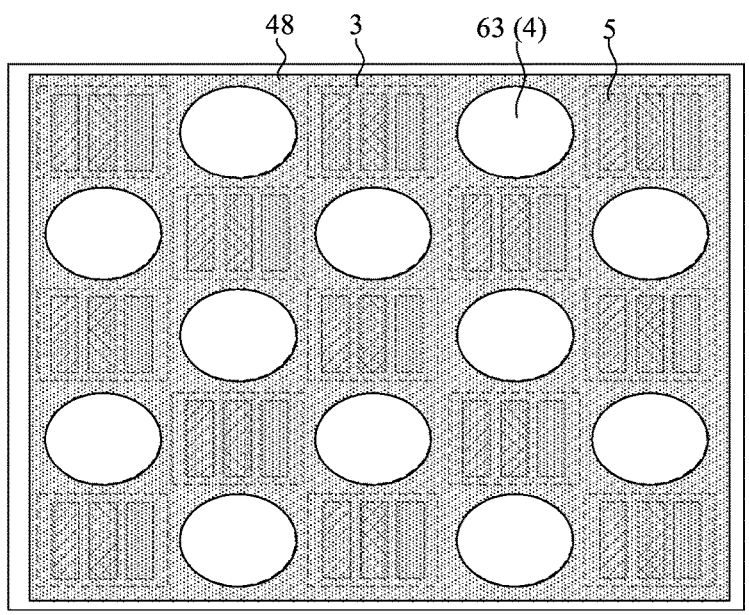
FIG. 68 is a schematic diagram of a second electrode according to some embodiments of the present disclosure.

In an embodiment, as shown in FIG. 67, the organic light-emitting element 7 includes the second electrode 48. The second electrode 48 is a cathode. To further improve the light transmittance of the optical component setting region 2, some hollow portions 63 can be provided on the second electrode 48 in the optical component setting region 2. The hollow portion 63 exposes the light transmission region 4, to prevent the second electrode 48 from shielding the light transmission region 4.

In an embodiment, referring to FIG. 64 and FIG. 65 again, the plurality of pixels 5 include a red pixel 63, a green pixel 64, and a blue pixel 65. To better achieve color mixing and optimize a display effect of the optical component setting region 2, the pixel region 3 includes at least one red pixel 63, at least one green pixel 64, and at least one blue pixel 65.

Figure 69:
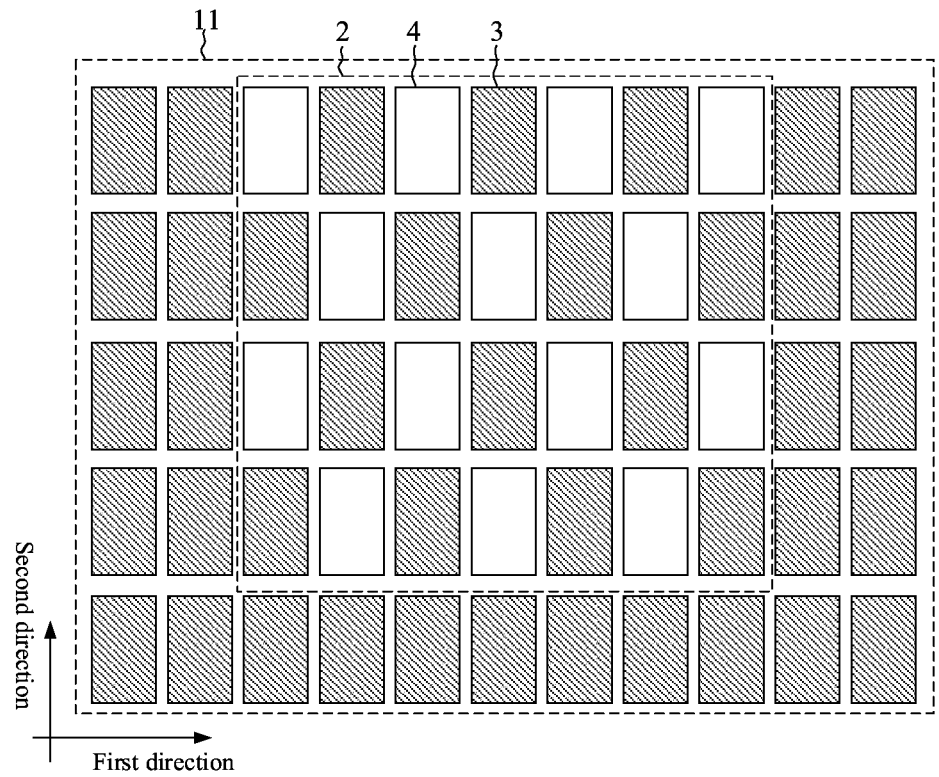
FIG. 69 is a schematic arrangement diagram of the pixel region according to some embodiments of the present disclosure.

In an embodiment, as shown in FIG. 69, a light transmission region 4 is formed between two adjacent pixel regions 3 in a first direction. A light transmission region 4 is formed between two adjacent pixel regions 3 in a second direction. The first direction intersects the second direction. Based on such an arrangement manner, the pixel regions 3 are evenly and dispersedly arranged in the optical component setting region 2, and the optical component setting region 2 has a better display effect.

Figure 70:
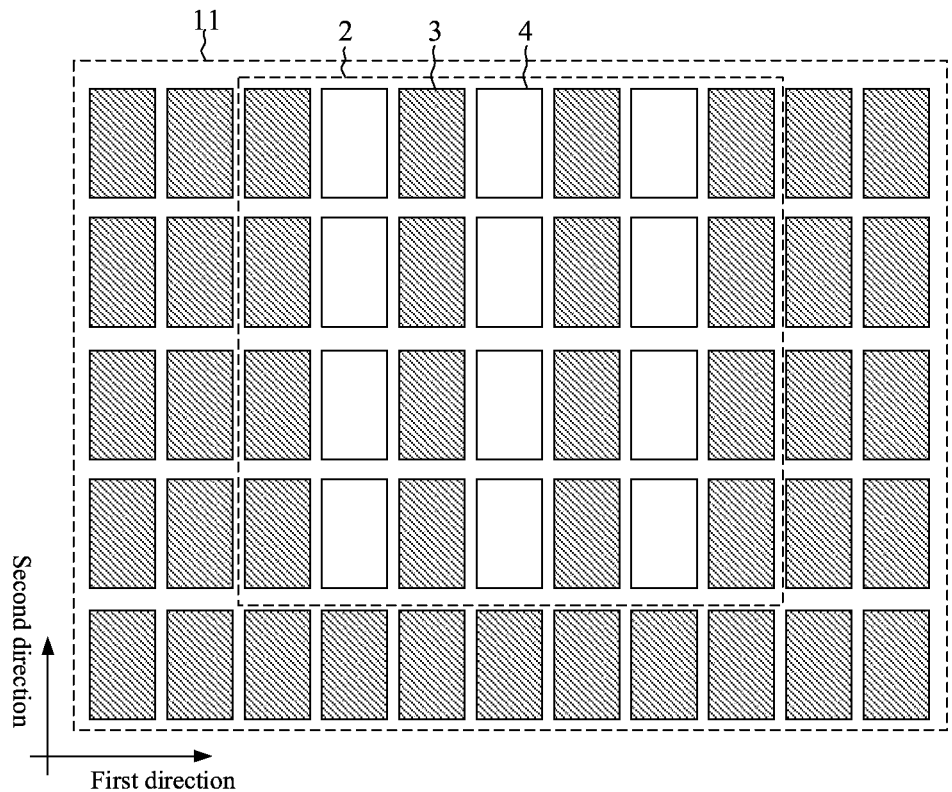
FIG. 70 is another schematic arrangement diagram of the pixel region according to some embodiments of the present disclosure.

In an embodiment, as shown in FIG. 70, a light transmission region 4 is formed between two adjacent pixel regions 3 in a first direction, no light transmission region 4 exists between two adjacent pixel regions 3 in a second direction 4, and the first direction intersects the second direction. With such configuration, light transmission regions 4 between every two adjacent pixel regions 3 are continuously arranged in the second direction, a light transmission region in the optical component setting region 2 has a larger area, and light transmission regions are more concentrated, so that the optical component setting region 2 has better light-transmitting performance.

Figure 73:
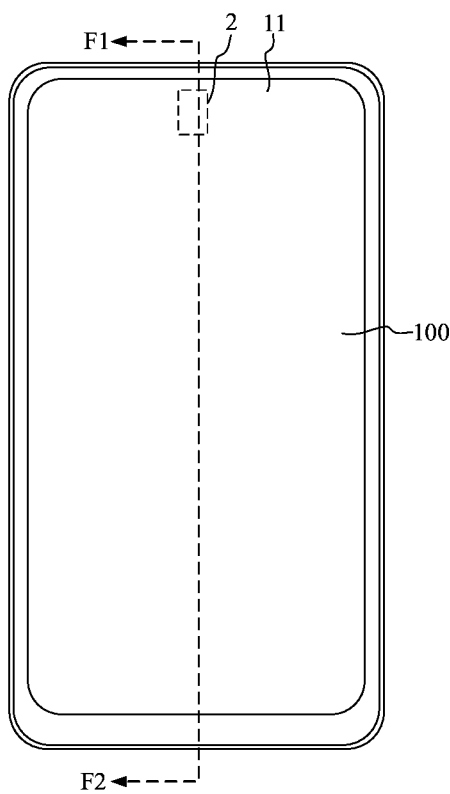
FIG. 73 is a schematic diagram of a display apparatus according to some embodiments of the present disclosure.
Figure 74:
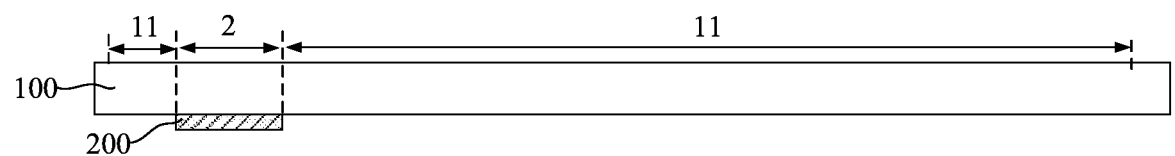
FIG. 74 is a cross-sectional view of FIG. 73 along a direction F1-F2, according to some embodiments of the present disclosure.

Based on a same inventive concept, an embodiments of the present disclosure further provides a display apparatus, as shown in FIG. 73 and FIG. 74. The display apparatus includes the display panel 100 and an optical component 200 (such as a camera or an infrared light sensor). In the direction perpendicular to the plane of the display panel, the optical component setting region 2 in the display panel 100 at least partially overlaps the optical component 200. The specific structure of the display panel 100 has been described in detail in the foregoing embodiments. Details are not described herein again. The display apparatus shown in FIG. 73 is for schematic description only. The display apparatus can be any electronic device with a display function, such as a mobile phone, a tablet computer, a notebook computer, an e-book, or a television.

The above descriptions are merely some embodiments of the present disclosure, and are not intended to limit the present disclosure. Any modifications, equivalent replacements, improvements, and the like made within the spirit and principle of the present disclosure shall fall within the protection scope of the present disclosure.

What is claimed is:

1. A display panel, having a display region comprising an optical component setting region, the optical component setting region comprising pixel regions and light transmission regions being provided between adjacent pixel regions of the pixel regions, wherein the display panel comprises:
pixels located in the display region, wherein each of the pixels comprises a pixel circuit and an organic light-emitting element, the pixel circuit comprises transistors, the transistors comprise a first reset transistor, a second reset transistor, and a drive transistor, wherein the first reset transistor is configured to reset a gate of the drive transistor in response to a scanning signal corresponding to the first reset transistor, and wherein the second reset transistor is configured to reset a first electrode of the organic light-emitting element in response to a scanning signal corresponding to the second reset transistor; and
wherein the pixel circuits of the pixels comprise first pixel circuits located in the optical component setting region, and a gate of the first reset transistor of each of the first pixel circuits is electrically connected to a gate of the second reset transistor of the first pixel circuit.

2. The display panel of claim 1, wherein at least one first pixel circuit of the first pixel circuits is provided in each of the pixel regions, and the gate of the first reset transistor and the gate of the second reset transistor of each of the at least one first pixel circuit in the pixel region are electrically connected to one of first scanning signal lines; and in two adjacent pixel regions, arranged in a first direction, of the pixel regions, at least two of the first scanning signal lines electrically connected to the first pixel circuits in the two adjacent pixel regions are electrically connected to each other through a first scanning signal transmission line.

3. The display panel of claim 2, wherein each of the first scanning signal lines comprises a first scanning line segment and a second scanning line segment that are located in one of the pixel regions; and the first scanning line segment is electrically connected to the gate of the first reset transistor, the second scanning line segment is electrically connected to the gate of the second reset transistor, and the first scanning line segment is electrically connected to the second scanning line segment through at least one first connection line.

4. The display panel of claim 3, wherein the first scanning signal transmission line is directly connected to and arranged in a same layer as the first scanning line segment; or the first scanning signal transmission line is directly connected to and arranged in a same layer as the second scanning line segment; or the first scanning signal transmission line is directly connected to and arranged in a same layer as the at least one first connection line.

5. The display panel of claim 3, wherein the at least one first connection line comprises two first connection lines, and two ends of the second scanning line segment are respectively electrically connected to two ends of the first scanning line segment through the two first connection lines.

6. The display panel of claim 3, wherein a first electrode of the first reset transistor and a first electrode of the second reset transistor of the at least one first pixel circuit in each of the pixel regions are electrically connected to one of first reset signal lines; and wherein at least two of the first reset signal lines electrically connected to at least two of the first pixel circuits in two adjacent pixel regions of the pixel regions are electrically connected to each other through a first reset signal transmission line.

7. The display panel of claim 6, wherein the at least one first pixel circuit comprises at least two first pixel circuits arranged along the first direction and located in each of the pixel regions, and each of the first reset signal lines extends along a second direction intersecting the first direction;

wherein a third connection line and a fourth connection line, each of which extends along the first direction, are provided in the optical component setting region, the first electrode of the first reset transistor of each of the at least two first pixel circuits in one of the pixel regions is electrically connected to the third connection line, and the third connection line is electrically connected to one of the first reset signal lines; and wherein the first electrode of the second reset transistor of the first pixel circuits in the one of the pixel regions is electrically connected to the fourth connection line, and the fourth connection line is electrically connected to the one of the first reset signal lines.

8. The display panel of claim 7, further comprising:

a semiconductor layer, wherein first electrodes and second electrodes of the transistors, the third connection line, and the fourth connection line are located in the semiconductor layer.

9. The display panel of claim 6, wherein each of the first reset signal lines comprises a first reset line segment and a second reset line segment that are located in one of the pixel regions; and wherein the first reset line segment is electrically connected to the first electrode of the first reset transistor, the second reset line segment is electrically connected to the first electrode of the second reset transistor, and the second reset line segment is electrically connected to the first reset line segment through a fifth connection line.

10. The display panel of claim 9, wherein the first reset signal transmission line is directly connected to and arranged in a same layer as the first reset line segment; or wherein the first reset signal transmission line is directly connected to and arranged in a same layer as the second reset line segment; or wherein the first reset signal transmission line is directly connected to and arranged in a same layer as the fifth connection line.

11. The display panel of claim 9, wherein each of at least one of the light transmission regions comprises a first primary light transmission region and a first secondary light transmission region that are arranged along a second direction, and each of the first reset signal transmission line and the first scanning signal transmission line at least partially extend in the first secondary light transmission region.

12. The display panel of claim 11, wherein the first reset signal transmission line and the first scanning signal transmission line are arranged in different layers; and wherein in a direction perpendicular to a plane of the display panel, a projection of the first reset signal transmission line at least partially overlaps a projection of the first scanning signal transmission line.

13. The display panel of claim 9, wherein each of the at least one first connection lines comprises a first end portion and a second end portion; and in a direction perpendicular to a plane of the display panel, a projection of the first end portion is located at a side of a projection of the first scanning line segment away from a projection of the second scanning line segment, and a projection of the second end portion is located at a side of the projection of the second scanning line segment away from the projection of the first scanning line segment; and wherein in the direction perpendicular to the plane of the display panel, the projection of the first end portion overlaps a projection of the first reset line segment, and/or the projection of the second end portion overlaps a projection of the second reset line segment.

14. The display panel of claim 9, further comprising:

a semiconductor layer, wherein first electrodes and second electrodes of the transistors, and the first reset signal transmission line are located in the semiconductor layer.

15. The display panel of claim 9, wherein each of the at least one first connection line comprises a first end portion and a second end portion;

wherein in a direction perpendicular to a plane of the display panel, a projection of the first end portion is located at a side of a projection of the first scanning line segment away from a projection of the second scanning line segment, and a projection of the second end portion is located at a side of the projection of the second scanning line segment away from the projection of the first scanning line segment; and wherein, in the direction perpendicular to the plane of the display panel, the projection of the first end portion overlaps a projection of a second reset signal line, and/or the projection of the second end portion overlaps a projection of a third reset signal line.

16. The display panel of claim 3, wherein a first electrode of the first reset transistor of each of the at least one first pixel circuit in one of the pixel regions is electrically connected to one of second reset signal lines, two of the second reset signal lines, which are connected to two of the first pixel circuits respectively located in two adjacent pixel regions of the pixel regions, are electrically connected to each other through a second reset signal transmission line, and the one of the second reset signal lines is connected to a first voltage end; and
  wherein a first electrode of the second reset transistor of each of the at least one first pixel circuit in one of the pixel regions is electrically connected to one of third reset signal lines, two of the third reset signal lines, which are connected to two of the first pixel circuits respectively located in the two adjacent pixel regions of the pixel regions, are electrically connected to each other through a third reset signal transmission line, and the one of the third reset signal lines is connected to a second voltage end.

17. The display panel of claim 16, wherein the at least one first pixel circuit comprises at least two first pixel circuits arranged along the first direction, each of the second reset signal lines and the third reset signal lines extends along a second direction intersecting the first direction;
  wherein a sixth connection line and a seventh connection line are provided in the optical component setting region and each extend along the first direction, the first electrode of the first reset transistor in one of the pixel regions is electrically connected to the sixth connection line, and the sixth connection line is further electrically connected to one of the second reset signal lines; and
  wherein the first electrode of the second reset transistor in the pixel region is electrically connected to the seventh connection line, and the seventh connection line is also electrically connected to one of the third reset signal lines.

18. The display panel of claim 17, further comprising a semiconductor layer, wherein first electrodes and second electrodes of the transistors, the sixth connection line, and the seventh connection line are located in the semiconductor layer.

19. The display panel of claim 17, wherein the at least one first pixel circuit in each of the pixel regions comprises x first pixel circuits arranged along the first direction, the second reset signal line is located at a side of a $1^{st}$ first pixel circuit of the x first pixel circuits away from a $2^{nd}$ first pixel circuit of the x first pixel circuits, and the third reset signal line is located at a side of an $x^{th}$ first pixel circuit of the x first pixel circuits away from an $(x-1)^{th}$ first pixel circuit of the x first pixel circuits;
  wherein each of at least one of the light transmission regions comprises a second primary light transmission region and two second secondary light transmission regions;
  wherein one of the two second secondary light transmission regions, the second primary light transmission region, and the other one of the two second secondary light transmission regions are sequentially arranged along the first direction;
  wherein the second reset signal transmission line at least partially extends in one of the two second secondary light transmission regions; and
  wherein the third reset signal transmission line at least partially extends in the other one of the two second secondary light transmission regions.

20. The display panel of claim 17, wherein the at least one first pixel circuit in each of the pixel regions comprises x first pixel circuits arranged along the first direction;
  wherein each of at least one of the light transmission regions comprises a third primary light transmission region and a third secondary light transmission region that are arranged along the first direction, and each of the second reset signal transmission line and the third reset signal transmission line at least partially extends in the third secondary light transmission region;
  wherein both the second reset signal line and the third reset signal line are located at a side of a $1^{st}$ first pixel circuit of the x first pixel circuits away from a $2^{nd}$ first pixel circuit of the x first pixel circuits; and
  wherein a direction from the third secondary light transmission region to the third primary light transmission region is the same as a direction from the $1^{st}$ first pixel circuit to the $2^{nd}$ first pixel circuit; or
  wherein both the second reset signal line and the third reset signal line are located at a side of an $x^{th}$ first pixel circuit of the x first pixel circuits away from an $(x-1)^{th}$ first pixel circuit of the x first pixel circuits, and a direction from the third secondary light transmission region to the third primary light transmission region is opposite to a direction from the $1^{st}$ first pixel circuit to the $2^{nd}$ first pixel circuit.

21. The display panel of claim 17, wherein the second reset signal transmission line and the third reset signal transmission line are each arranged in a different layer from the first scanning signal transmission line; and
  wherein in a direction perpendicular to a plane of the display panel, at least one of a projection of the second reset signal transmission line or a projection of the third reset signal transmission line overlaps a projection of the first scanning signal transmission line.

22. The display panel of claim 17, further comprising a semiconductor layer, wherein first electrodes and second electrodes of the transistors, the second reset signal transmission line, and the third reset signal transmission line are located in the semiconductor layer.

23. The display panel of claim 16, wherein each of the second reset signal line and the third reset signal line extends in the pixel region along the first direction.

24. The display panel of claim 23, wherein each of at least one of the light transmission regions comprises a fourth primary light transmission region and a fourth secondary light transmission region, the fourth secondary light transmission region and the fourth primary light transmission region are arranged along the first direction, the fourth primary light transmission region comprises a first subregion, a second subregion, and a third subregion that are sequentially arranged along a second direction intersecting the first direction;
  wherein the second reset signal transmission line comprises a first reset transmission line segment located in the fourth secondary light transmission region and a second reset transmission line segment located in the second subregion, and the third reset signal transmission line comprises a third reset transmission line segment located in the fourth secondary light transmission region and a fourth reset transmission line segment located in the second subregion; and
  wherein a distance between the first reset transmission line segment and the third reset transmission line segment gradually decreases along a direction from the fourth secondary light transmission region to the fourth primary light transmission region.

25. The display panel of claim 2, wherein the first scanning signal transmission line comprises at least two zigzag line segments connected to each other, or at least two arc line segments connected to each other.

26. The display panel of claim 1, wherein the display region further comprises a primary display region adjacent to the optical component setting region, the pixel circuits of the pixels comprise second pixel circuits located in the primary display region, and a gate of the first reset transistor of each of the second pixel circuits is electrically connected to a gate of the second reset transistor of the second pixel circuit.

27. The display panel of claim 26, wherein the gate of the first reset transistor and the gate of the second reset transistor in each of at least two second pixel circuits of the second pixel circuits arranged along a first direction are electrically connected to a second scanning signal line;
   wherein the second scanning signal line comprises a third scanning line segment and a fourth scanning line segment that are located in the primary display region, wherein the third scanning line segment is electrically connected to the gate of the first reset transistor in each of the at least two second pixel circuits and the fourth scanning line segment is electrically connected to the gate of the second reset transistor in the second pixel circuit, and the third scanning line segment is electrically connected to the first scanning line segment through at least one second connection line; and
   wherein, for at least one of the first pixel circuits and at least one of the second pixel circuits that are arranged along the first direction, the first scanning signal line is electrically connected to the second scanning signal line.

28. The display panel of claim 1, further comprising shading portions located in the optical component setting region, wherein in a direction perpendicular to a plane of the display panel, each of the shading portions covers at least part of one of the first pixel circuits.

29. The display panel of claim 28, wherein the transistors further comprise a supply voltage writing transistor;
   wherein the supply voltage writing transistor comprises a gate electrically connected to a light-emitting control signal line, a first electrode electrically connected to one of the shading portions, and a second electrode electrically connected to a first electrode of the drive transistor; and
   wherein the shading portions are electrically connected to a power signal terminal, and two adjacent shading portions of the shading portions are electrically connected through a ninth connection line arranged in a same layer as the shading portions.

30. The display panel of claim 28, further comprising:
   a semiconductor layer, wherein first electrodes and second electrodes of the transistors are located in the semiconductor layer, and the shading portions are located at a side of the semiconductor layer away from a light emitting direction of the display panel.

31. The display panel of claim 28, wherein the transistors further comprise:
   a supply voltage writing transistor, wherein the supply voltage writing transistor comprises a gate electrically connected to one of light-emitting control signal lines, a first electrode electrically connected to one of power signal lines, and a second electrode electrically connected to a first electrode of the drive transistor;
   a data voltage writing transistor, wherein the data voltage writing transistor comprises a gate electrically connected to one of third scanning signal lines, a first electrode electrically connected to one of data lines, and a second electrode electrically connected to the first electrode of the drive transistor;
   a threshold compensation transistor, wherein the threshold compensation transistor comprises a gate electrically connected to the third scanning signal line, a first electrode electrically connected to a second electrode of the drive transistor, and a second electrode electrically connected to the gate of the drive transistor; and
   a light-emitting control transistor, wherein the light-emitting control transistor comprises a gate electrically connected to the one of the light-emitting control signal lines, a first electrode electrically connected to the second electrode of the drive transistor, and a second electrode electrically connected to a first electrode of the organic light-emitting element,
   wherein each of the pixel circuits further comprises a storage capacitor, wherein the storage capacitor comprises a first plate electrically connected to the power signal line, and a second plate reused with the gate of the drive transistor.

32. The display panel of claim 31, wherein the display region further comprises a primary display region adjacent to the optical component setting region and the pixel circuits comprise second pixel circuits located in the primary display region;
   wherein the display panel comprises a semiconductor layer, a first metal layer, a second metal layer, a third metal layer, and a fourth metal layer that are sequentially arranged along a light emitting direction of the display panel;
   wherein first electrodes and second electrodes of the transistors are disposed in the semiconductor layer, gates of the transistors are disposed in the first metal layer, and the first plate of the storage capacitor is disposed in the second metal layer;
   wherein, in the primary display region, the first metal layer, the third metal layer, and the fourth metal layer each comprise at least one of each of the third scanning signal lines, each of the light-emitting control signal lines, each of the power signal lines, or each of the data lines;
   wherein, in the optical component setting region, the shading portions are located in one of the first metal layer, the third metal layer, or the fourth metal layer, and the shading portions are arranged in a different layer from the third scanning signal lines, the light-emitting control signal lines, the power signal lines, and the data lines that are located in the optical component setting region; and
   wherein the shading portions are located in the fourth metal layer.

33. The display panel of claim 31, wherein two of the light-emitting control signal lines, which are electrically connected to two of the first pixel circuits respectively located in two adjacent pixel regions of the pixel regions, are electrically connected to each other through a light-emitting signal transmission line;
   wherein two of the power signal lines, which are electrically connected to the two of the first pixel circuits respectively located in the two adjacent pixel regions of the pixel regions, are electrically connected to each other through a power signal transmission line;

wherein two of the third scanning signal lines, which are electrically connected to the two of the first pixel circuits respectively located in the two adjacent pixel regions of the pixel regions, are electrically connected to each other through a second scanning signal transmission line;

wherein two of the data lines, which are electrically connected to the two of the first pixel circuits respectively located in the two adjacent pixel regions of the pixel regions, are electrically connected to each other through a data signal transmission line;

wherein each of at least one of the light transmission regions comprises a fifth primary light transmission region and a fifth secondary light transmission region surrounding the fifth primary light transmission region; and wherein the light-emitting signal transmission line, the power signal transmission line, the second scanning signal transmission line, and the data signal transmission line extend within the fifth secondary light transmission region.

34. The display panel of claim 1, wherein the display panel comprises a semiconductor layer, wherein first electrodes and second electrodes of the transistor are located in the semiconductor layer;

wherein each of at least one of the light transmission regions comprises a sixth primary light transmission region and a sixth secondary light transmission region surrounding the sixth primary light transmission region;

wherein dummy lines are located in the semiconductor layer and arranged in the sixth secondary light transmission region; and wherein at least one of the dummy lines is reused as a first scanning signal transmission line.

35. The display panel of claim 1, wherein the pixels comprise red pixels, green pixels, and blue pixels, and each of the pixel regions comprises at least one of the red pixels, at least one of the green pixels, and at least one of the blue pixels.

36. A display apparatus, comprising a display panel:

wherein the display panel has a display region comprising an optical component setting region;

wherein the optical component setting region comprises pixel regions;

wherein light transmission regions are provided between adjacent pixel regions of the pixel regions;

wherein the display panel comprises pixels located in the display region;

wherein each of the pixels comprises a pixel circuit and an organic light-emitting element;

wherein the pixel circuit comprises transistors, the transistors comprise a first reset transistor, a second reset transistor, and a drive transistor;

wherein the first reset transistor is configured to reset a gate of the drive transistor in response to a scanning signal corresponding to the first reset transistor;

wherein the second reset transistor is configured to reset a first electrode of the organic light-emitting element in response to a scanning signal corresponding to the second reset transistor;

wherein the pixel circuits of the pixels comprise first pixel circuits located in the optical component setting region; and wherein a gate of the first reset transistor of each of the first pixel circuits is electrically connected to a gate of the second reset transistor of the first pixel circuit.

* * * * *